(12) United States Patent
Katine et al.

(10) Patent No.: US 12,740,068 B2
(45) Date of Patent: Sep. 15, 2026

(54) CROSS-POINT MAGNETORESISTIVE MEMORY ARRAY CONTAINING SELECTOR RAILS AND METHOD OF MAKING THE SAME

(71) Applicant: SANDISK TECHNOLOGIES LLC, Addison, TX (US)

(72) Inventors: Jordan Katine, Mountain View, CA (US); Lei Wan, San Jose, CA (US); Tsai-Wei Wu, San Jose, CA (US); Sanjay Mehta, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 755 days.

(21) Appl. No.: 18/067,998

(22) Filed: Dec. 19, 2022

(65) Prior Publication Data

US 2023/0309319 A1 Sep. 28, 2023

Related U.S. Application Data

(63) Continuation-in-part of application No. 17/654,781, filed on Mar. 14, 2022, now Pat. No. 12,543,508.

(51) Int. Cl.
*H10B 61/00* (2023.01)
*H10N 50/01* (2023.01)
(Continued)

(52) U.S. Cl.
CPC ............. *H10B 61/10* (2023.02); *H10N 50/01* (2023.02); *H10N 50/10* (2023.02); *H10N 50/80* (2023.02)

(58) Field of Classification Search
CPC ........ H10B 61/10; H10N 50/01; H10N 50/10; H10N 50/80
See application file for complete search history.

(56) References Cited

U.S. PATENT DOCUMENTS 7,474,723 B2 1/2009 Oyama
7,502,211 B2 3/2009 Gill
(Continued)

FOREIGN PATENT DOCUMENTS

WO WO 2019/005162 A1 1/2019
WO WO 2019/005172 A1 1/2019
(Continued)

OTHER PUBLICATIONS

Notification of Transmittal of the International Search Report and Written Opinion of the International Search Authority for International Patent Application No. PCT/US2019/068899, mailed Apr. 26, 2020, 12 pages.

(Continued)

*Primary Examiner* — Davienne N Monbleau
*Assistant Examiner* — Heim Kirin Grewal
(74) *Attorney, Agent, or Firm* — THE MARBURY LAW GROUP PLLC

(57) ABSTRACT

A device structure includes first electrically conductive lines, second electrically conductive lines that are vertically spaced apart from the first electrically conductive lines, a two-dimensional array of magnetic tunnel junctions located between the first electrically conductive lines and the second electrically conductive lines, and a two-dimensional array of selector elements located in series with the two-dimensional array of magnetic tunnel junctions. Each of the magnetic tunnel junctions includes a respective reference layer, a respective nonmagnetic tunnel barrier layer, and a respective free layer, and has a respective pair of first tapered planar sidewalls laterally extending along a first horizontal direction and a respective pair of second tapered planar sidewalls laterally extending along a second horizontal direction.

19 Claims, 43 Drawing Sheets

(51) Int. Cl.
*H10N 50/10* (2023.01)
*H10N 50/80* (2023.01)

(56) References Cited

U.S. PATENT DOCUMENTS 7,733,685 B2 6/2010 Scheuerlein et al.
9,252,362 B2 2/2016 Pio
9,542,987 B2 1/2017 Naik et al.
9,768,229 B2 9/2017 Braganca et al.
9,830,966 B2 11/2017 Mihajlovic et al.
10,229,723 B1 3/2019 Choi et al.
10,249,683 B1 4/2019 Lille et al.
10,381,551 B1 8/2019 Lille
10,424,374 B2 9/2019 Redaelli et al.
10,553,783 B2 2/2020 Lille
10,726,892 B2 7/2020 Le et al.
10,788,547 B2 9/2020 Kalitsov et al.
10,797,227 B2 10/2020 Le et al.
10,811,596 B2 10/2020 Le et al.
10,862,022 B2 12/2020 Le et al.
11,056,534 B2 7/2021 Wan et al.
11,152,425 B2 10/2021 Wan et al.
11,271,035 B2 3/2022 Wan et al.
11,271,036 B2 3/2022 Lille et al.
2005/0220150 A1 10/2005 Oyama
2009/0290406 A1 11/2009 Xia et al.
2009/0290409 A1 11/2009 Xia et al.
2010/0054027 A1 3/2010 Xia
2010/0110776 A1 5/2010 Yoon et al.
2011/0267874 A1 11/2011 Ryu et al.
2013/0201757 A1 8/2013 Li et al.
2013/0215675 A1 8/2013 Ryu et al.
2014/0246741 A1 9/2014 Guo
2016/0225423 A1 8/2016 Naik et al.
2017/0047510 A1 2/2017 Chen et al.
2017/0117027 A1 4/2017 Braganca et al.
2017/0117323 A1 4/2017 Braganca et al.
2017/0125078 A1 5/2017 Mihjlovic et al.
2018/0315475 A1 11/2018 Redaelli et al.
2018/0358547 A1* 12/2018 Yang ...................... H10B 61/10
2018/0366642 A1 12/2018 Yang et al.
2019/0013353 A1 1/2019 Lee et al.
2019/0027201 A1 1/2019 Petti et al.
2019/0080738 A1 3/2019 Choi et al.
2019/0207088 A1 7/2019 Schabes et al.
2019/0287592 A1 9/2019 Matsunami
2020/0006633 A1 1/2020 Lille
2020/0342926 A1 10/2020 Katine et al.
2020/0350364 A1 11/2020 Wan et al.
2020/0411589 A1 12/2020 Wan et al.
2021/0126052 A1 4/2021 Wan et al.
2021/0217812 A1* 7/2021 Hsiao .................. H01F 10/3259
2021/0313392 A1 10/2021 Wan et al.
2021/0391530 A1 12/2021 Chen et al.
2021/0399207 A1 12/2021 Wang et al.
2021/0408114 A1* 12/2021 Lille ...................... H10B 61/10
2022/0069201 A1* 3/2022 Yin ..................... H01L 21/7684
2022/0123203 A1* 4/2022 Hsu ........................ H10N 50/85
2022/0406994 A1 12/2022 Lin et al.
2023/0371279 A1* 11/2023 Wu ...................... H10N 70/826

FOREIGN PATENT DOCUMENTS

WO WO 2019/139774 A1 7/2019
WO WO 2020/222883 A1 11/2020

OTHER PUBLICATIONS

Notification of Transmittal of the International Search Report and Written Opinion of the International Search Authority for International Patent Application No. PCT/US2020/023707, mailed Jul. 28, 2020, 10 pages.
Kim, Y. et al. "Multilevel Spin-Orbit Torque MRAMs," IEEE Transactions on Electron Devices, vol. 62, No. 2, pp. 561-568, (2015).
U.S. Appl. No. 17/654,760, filed Mar. 14, 2022, SanDisk Technologies LLC.
U.S. Appl. No. 17/654,762, filed Mar. 14, 2022, SanDisk Technologies LLC.
U.S. Appl. No. 17/654,768, filed Mar. 14, 2022, SanDisk Technologies LLC.
U.S. Appl. No. 17/654,773, filed Mar. 14, 2022, SanDisk Technologies LLC.
U.S. Appl. No. 17/654,777, filed Mar. 14, 2022, SanDisk Technologies LLC.
U.S. Appl. No. 17/654,781, filed Mar. 14, 2022, SanDisk Technologies LLC.
USPTO Office Communication, Non-Final Office Action for U.S. Appl. No. 17/654,781, mailed Mar. 5, 2025, 32 pages.
USPTO Office Communication, Final Office Action for U.S. Appl. No. 17/654,781, dated Jun. 18, 2025, 40 pages.

* cited by examiner

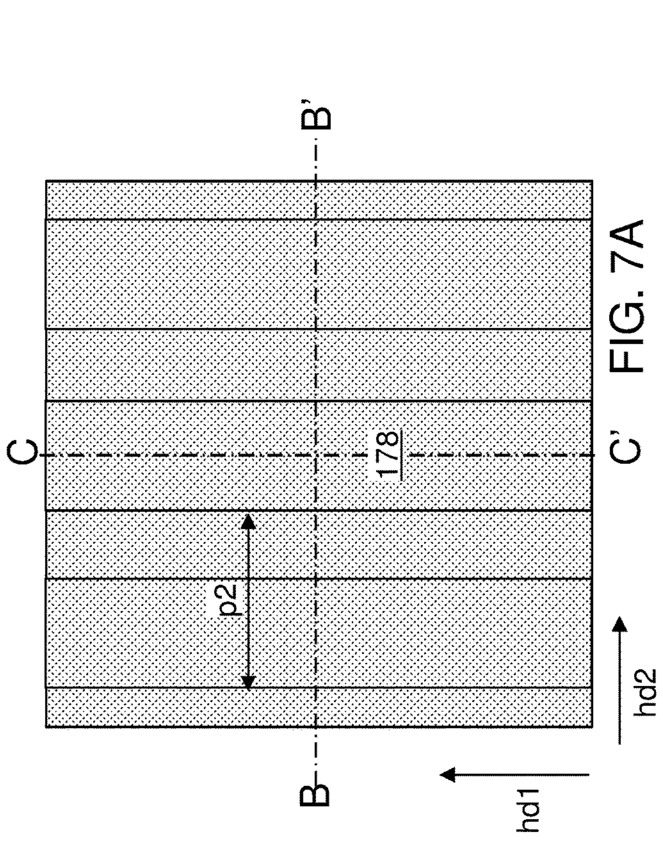
FIG. 7A
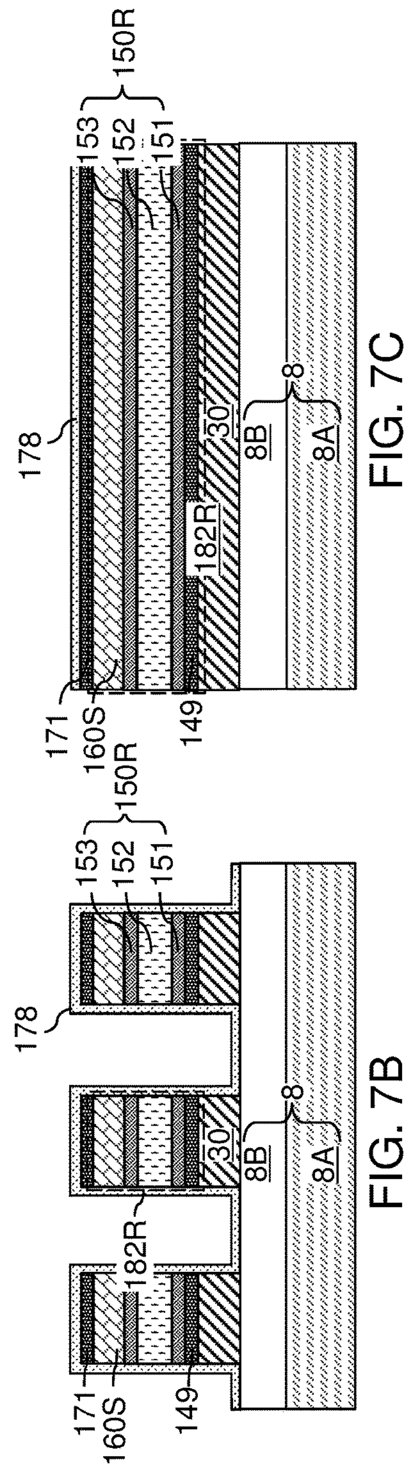
FIG. 7B
FIG. 7C

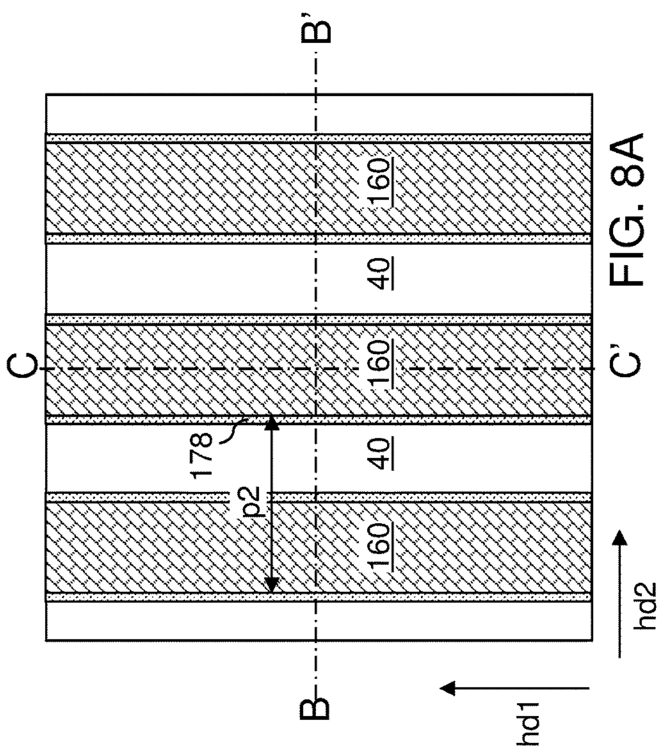
FIG. 8A
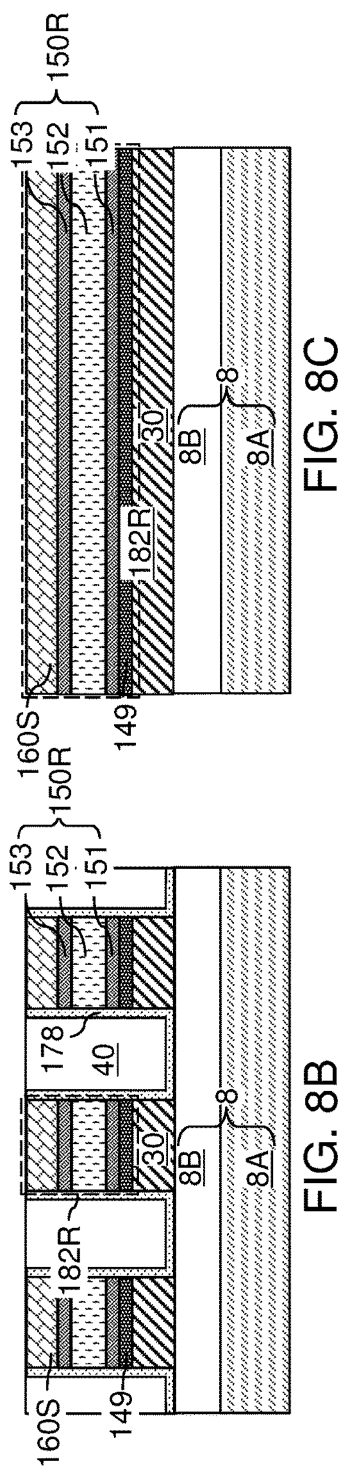
FIG. 8B
FIG. 8C

B
B'
C
C'
hd1
hd2
p1
p2
40
176
178
152
148
144
114
112
160
149
173
136
134
132
130
153
151
150
184
180
182
40T
40H
30
8B
8A
8
180A
182N
153M
153L
153C
152L
151M
151L
151C

B
B'
C
C'
p1
p2
257
30
32
hd1
hd2

172
160
149
153
152
151
150
182
8B
8A
8

153L
153M
153C
152L
151M
151L
151C 259
276L
277L
273L
136L
134L
132L
130L
153
152
151
150
188
50
182
30
8B
8A
8
148L
144L
114L
112L
160
149

259
259
276L
277L
273L
136L
134L
132L
130L
153
152
151
150
188
182
50
32
30
8B
8A
8
148L
144L
114L
112L
160
149

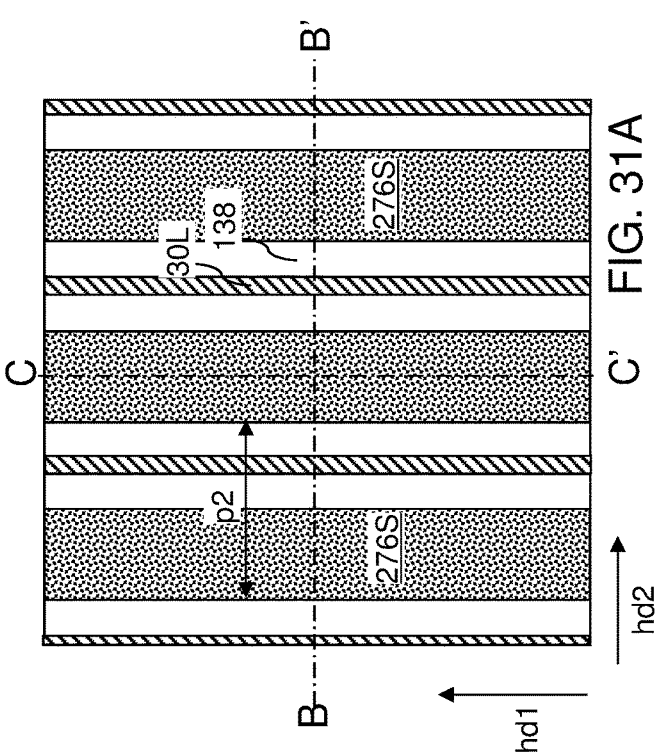
FIG. 31A
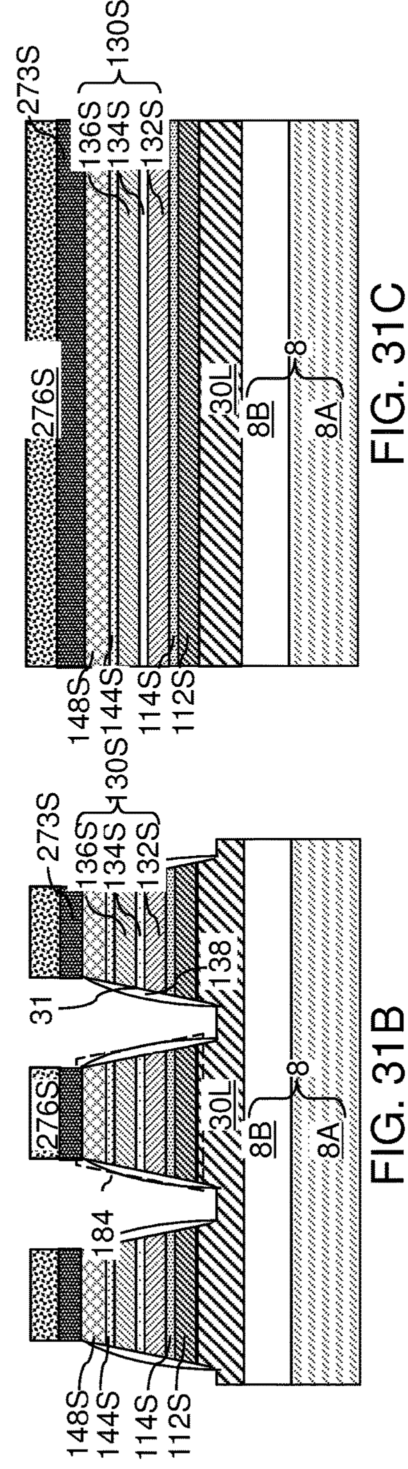
FIG. 31B
FIG. 31C

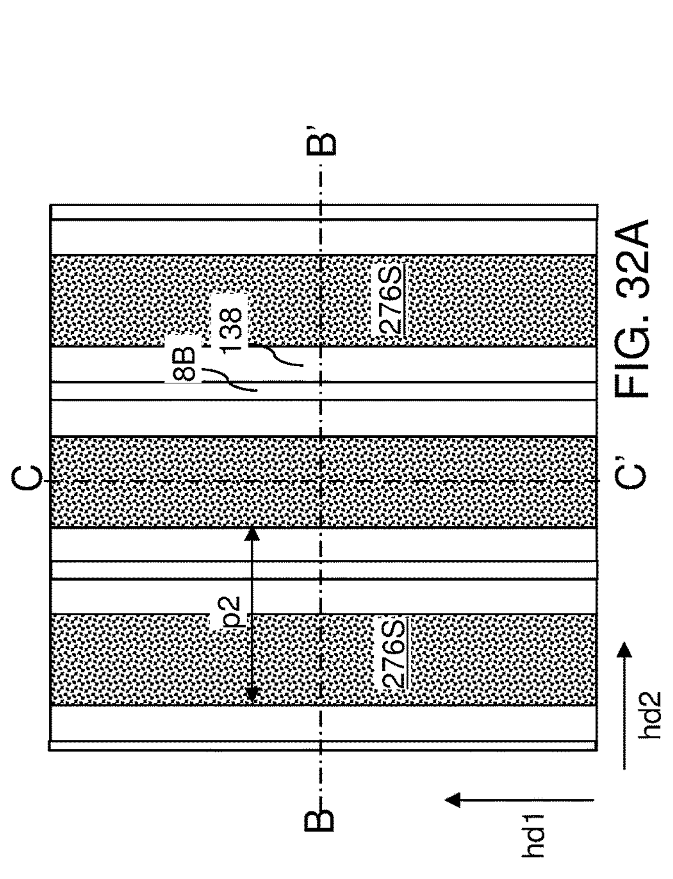
FIG. 32A
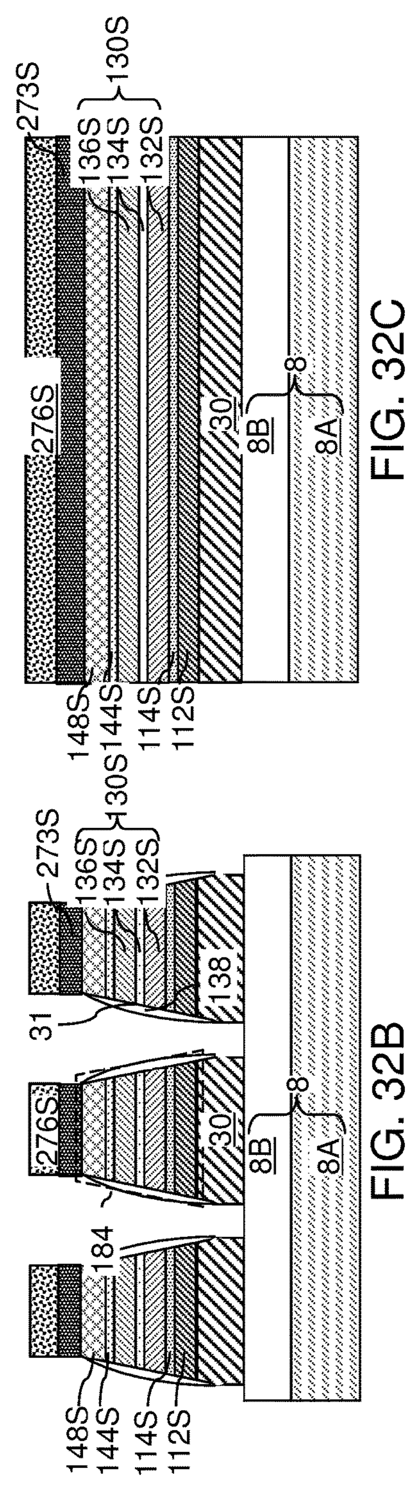
FIG. 32B
FIG. 32C

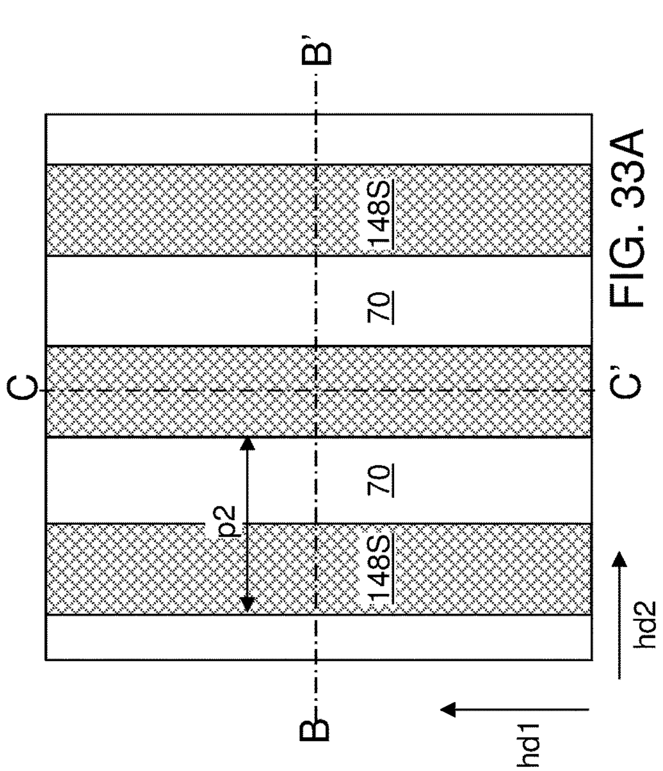
FIG. 33A
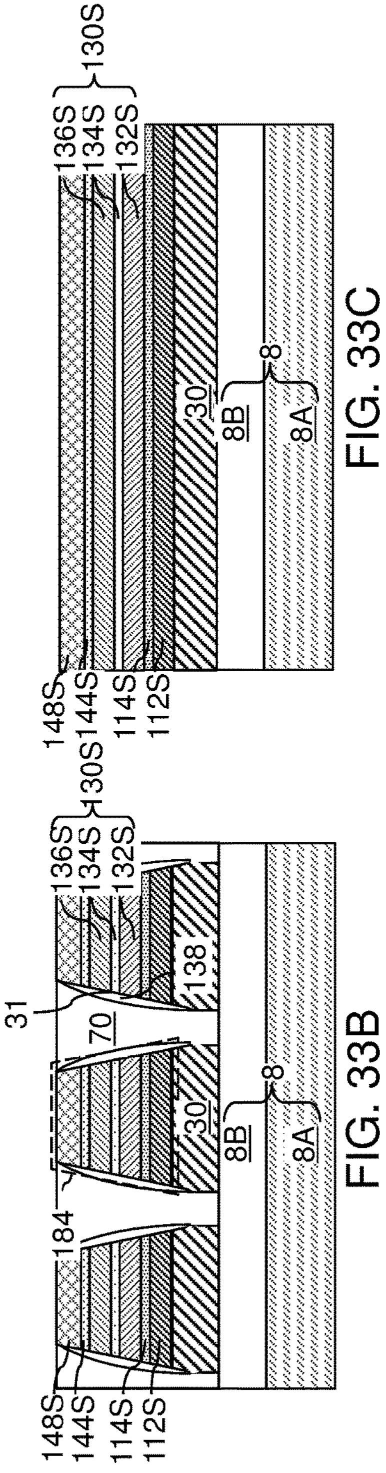
FIG. 33B
FIG. 33C

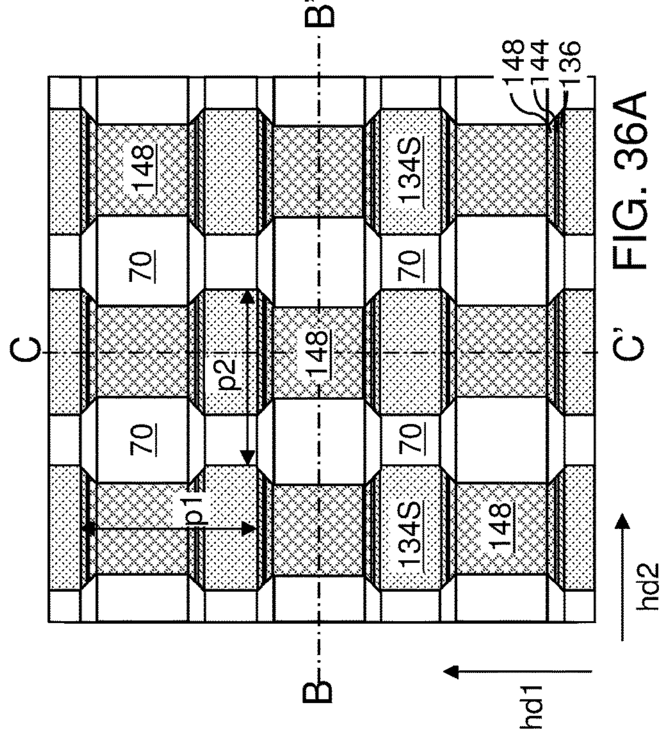
FIG. 36A
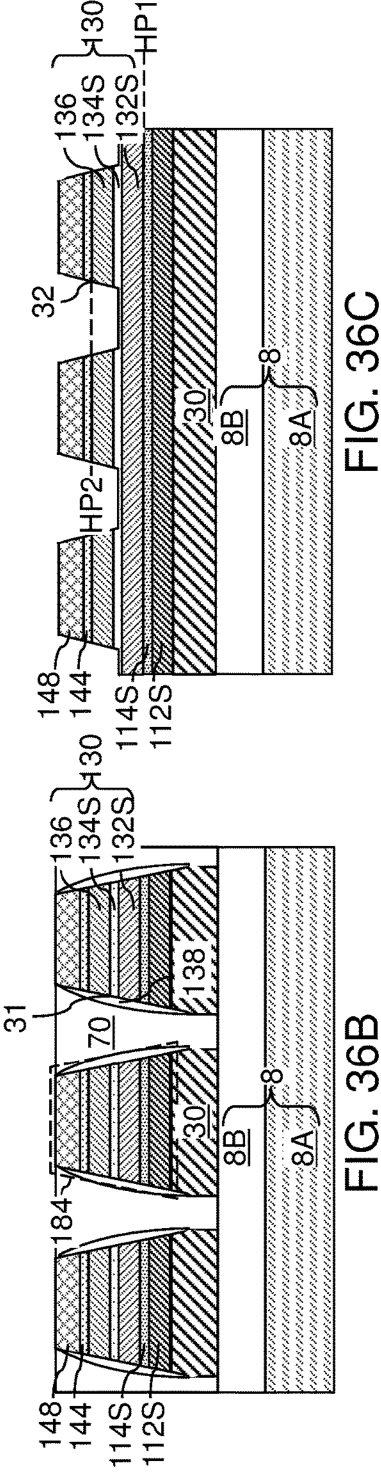
FIG. 36B
FIG. 36C

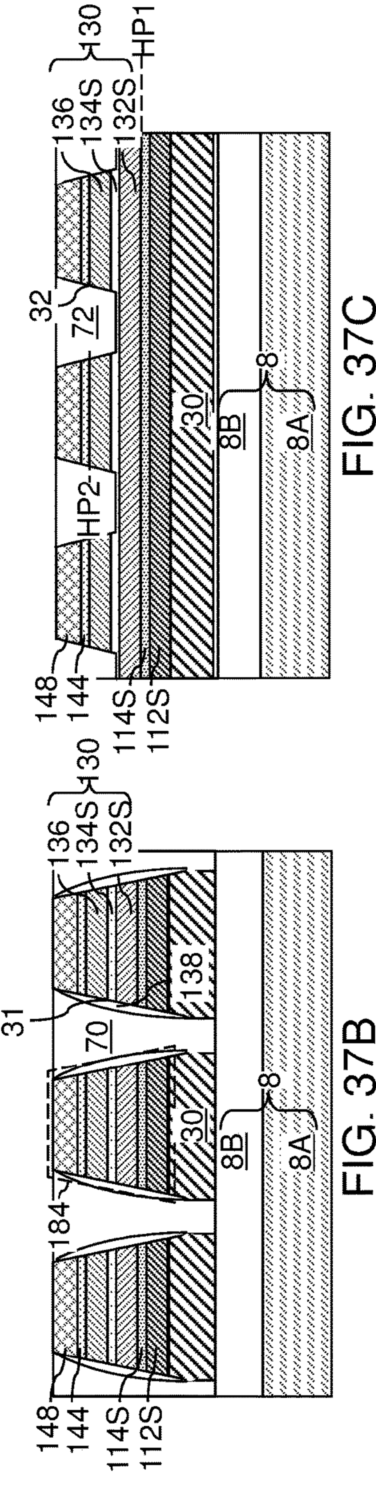
FIG. 37B
FIG. 37C
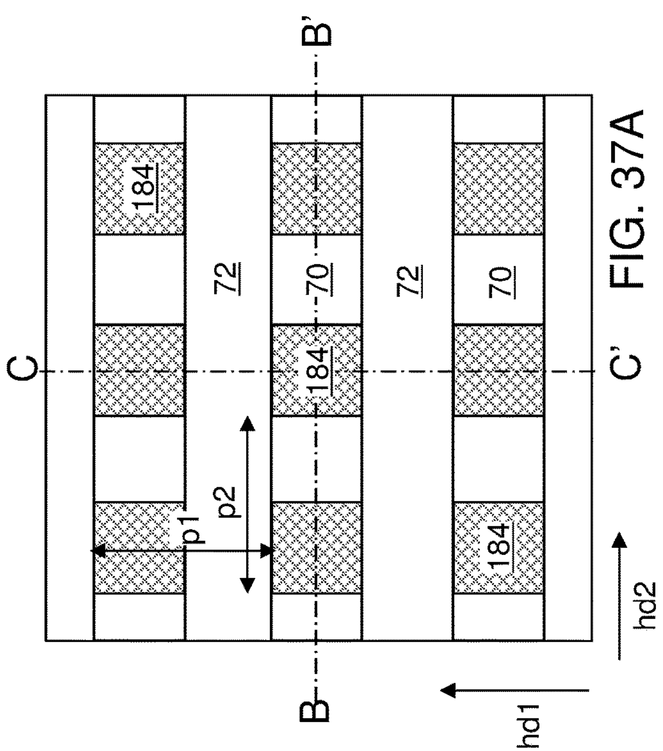
FIG. 37A

CROSS-POINT MAGNETORESISTIVE MEMORY ARRAY CONTAINING SELECTOR RAILS AND METHOD OF MAKING THE SAME

RELATED APPLICATIONS

This application is a continuation-in-part (CIP) application of U.S. Application Ser. No. 17/654,781 filed on Mar. 14, 2022, the entire contents of which are incorporated herein by reference.

FIELD

The present disclosure relates generally to the field of magnetic memory devices, and particularly to a cross-point magnetoresistive random access memory array containing selector rails and methods of manufacturing the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell.

SUMMARY

According to an aspect of the present disclosure, a device structure is provided, which comprises: first electrically conductive lines that are laterally spaced apart from each other; second electrically conductive lines that are vertically spaced apart from the first electrically conductive lines and are laterally spaced apart from each other; a two-dimensional array of magnetic tunnel junctions located between the first electrically conductive lines and the second electrically conductive lines, wherein each of the magnetic tunnel junctions comprises a respective reference layer, a respective nonmagnetic tunnel barrier layer, and a respective free layer, and has a respective pair of first tapered planar sidewalls laterally extending along a first horizontal direction and tilted from a vertical direction toward or away from a second horizontal direction, and has a respective pair of second tapered planar sidewalls laterally extending along the second horizontal direction and tilted from the vertical direction toward or away from the first horizontal direction; and a two-dimensional array of selector elements located in series with the two-dimensional array of magnetic tunnel junctions and between the first electrically conductive lines and the second electrically conductive lines.

According to another aspect of the present disclosure, a method of forming a memory device comprises forming magnetic tunnel junction material layers over a substrate, forming an electrode material layer over the substrate, and patterning the magnetic tunnel junction material layers and the electrode material layer during a same photolithography and etching step, wherein first electrically conductive lines and a two-dimensional array of magnetic tunnel junction pillar structures are formed.

According to an aspect of the present disclosure, a memory device is provided, which comprises: first electrically conductive lines laterally extending along a first horizontal direction and laterally spaced apart along a second horizontal direction; selector-magnetic tunnel junction (selector-MTJ) assemblies overlying the first electrically conductive lines, wherein each of the selector-MTJ assemblies is located over a respective one of the first electrically conductive lines and comprises a respective selector-containing notched rail structure that extends along the first horizontal direction and a respective row of magnetic tunnel junction (MTJ) pillar structures that are arranged along the first horizontal direction, and that overlie the respective selector-containing notched rail structure; a dielectric matrix layer laterally surrounding the rows of selector-MTJ assemblies, wherein a two-dimensional periodic array of downward protrusions of the dielectric matrix layer extends into boundaries between each neighboring pair of the selector-containing notched rail structures; and second electrically conductive lines laterally extending along the second horizontal direction and overlying a respective column of the MTJ pillar structures that are arranged along the second horizontal direction.

According to another aspect of the present disclosure, a method of forming a memory device includes forming vertical stacks each including a respective first electrically conductive line and a respective selector rail over a substrate, such that the vertical stacks laterally extend along a first horizontal direction and are laterally spaced apart from each other along a second horizontal direction, forming magnetic tunnel junction material layers over the vertical stacks, and patterning the magnetic tunnel junction material layers and an upper portion of each of the selector rails to form a two-dimensional array of magnetic tunnel junctions and periodic notches at least in an upper portion of each of the selector rails.

BRIEF DESCRIPTION OF THE DRAWINGS

FIG. 3A is a top-down view, FIG. 3B is a vertical cross-sectional view along the vertical plane B-B' of FIG. 3A, and FIG. 3C is a vertical cross-sectional view along the vertical plane C-C' of FIG. 3A.

FIG. 4A is a top-down view, FIG. 4B is a vertical cross-sectional view along the vertical plane B-B' of FIG.

4A, and FIG. 4C is a vertical cross-sectional view along the vertical plane C-C' of FIG. 4A.

FIG. 5A is a top-down view, FIG. 5B is a vertical cross-sectional view along the vertical plane B-B' of FIG. 5A, and FIG. 5C is a vertical cross-sectional view along the vertical plane C-C' of FIG. 5A.

FIG. 6A is a top-down view, FIG. 6B is a vertical cross-sectional view along the vertical plane B-B' of FIG. 6A, and FIG. 6C is a vertical cross-sectional view along the vertical plane C-C' of FIG. 6A.

FIGS. 7A-7C are various views of the first exemplary structure after formation of a dielectric spacer material layer according to an embodiment of the present disclosure. FIG. 7A is a top-down view, FIG. 7B is a vertical cross-sectional view along the vertical plane B-B' of FIG. 7A, and FIG. 7C is a vertical cross-sectional view along the vertical plane C-C' of FIG. 7A.

FIGS. 8A-8C are various views of the first exemplary structure after formation of selector-level dielectric material portions according to an embodiment of the present disclosure. FIG. 8A is a top-down view, FIG. 8B is a vertical cross-sectional view along the vertical plane B-B' of FIG. 8A, and FIG. 8C is a vertical cross-sectional view along the vertical plane C-C' of FIG. 8A.

FIG. 9A is a top-down view, FIG. 9B is a vertical cross-sectional view along the vertical plane B-B' of FIG. 9A, and FIG. 9C is a vertical cross-sectional view along the vertical plane C-C' of FIG. 9A.

FIG. 10A is a top-down view, FIG. 10B is a vertical cross-sectional view along the vertical plane B-B' of FIG. 10A, and FIG. 10C is a vertical cross-sectional view along the vertical plane C-C' of FIG. 10A.

FIG. 11A is a top-down view, FIG. 11B is a vertical cross-sectional view along the vertical plane B-B' of FIG. 11A, and FIG. 11C is a vertical cross-sectional view along the vertical plane C-C' of FIG. 11A.

FIG. 12A is a top-down view, FIG. 12B is a vertical cross-sectional view along the vertical plane B-B' of FIG. 12A, and FIG. 12C is a vertical cross-sectional view along the vertical plane C-C' of FIG. 12A.

FIG. 13A is a top-down view, FIG. 13B is a vertical cross-sectional view along the vertical plane B-B' of FIG. 13A, and FIG. 13C is a vertical cross-sectional view along the vertical plane C-C' of FIG. 13A.

FIG. 14A is a top-down view, FIG. 14B is a vertical cross-sectional view along the vertical plane B-B' of FIG. 14A, and FIG. 14C is a vertical cross-sectional view along the vertical plane C-C' of FIG. 14A.

FIG. 15A is a top-down view, FIG. 15B is a vertical cross-sectional view along the vertical plane B-B' of FIG. 15A, and FIG. 15C is a vertical cross-sectional view along the vertical plane C-C' of FIG. 15A.

FIG. 16A is a top-down view, FIG. 16B is a vertical cross-sectional view along the vertical plane B-B' of FIG. 145, and FIG. 16C is a vertical cross-sectional view along the vertical plane C-C' of FIG. 16A.

FIG. 17A is a top-down view, FIG. 17B is a vertical cross-sectional view along the vertical plane B-B' of FIG. 17A, and FIG. 17C is a vertical cross-sectional view along the vertical plane C-C' of FIG. 17A.

FIG. 18A is a top-down view, FIG. 18B is a vertical cross-sectional view along the vertical plane B-B' of FIG. 18A, and FIG. 18C is a vertical cross-sectional view along the vertical plane C-C' of FIG. 18A.

FIG. 19A is a top-down view, FIG. 19B is a vertical cross-sectional view along the vertical plane B-B' of FIG. 19A, and FIG. 19C is a vertical cross-sectional view along the vertical plane C-C' of FIG. 19A.

FIG. 20A is a top-down view, FIG. 20B is a vertical cross-sectional view along the vertical plane B-B' of FIG. 20A, and FIG. 20C is a vertical cross-sectional view along the vertical plane C-C' of FIG. 20A.

FIG. 21A is a top-down view, FIG. 21B is a vertical cross-sectional view along the vertical plane B-B' of FIG. 21A, and FIG. 21C is a vertical cross-sectional view along the vertical plane C-C' of FIG. 21A.

FIG. 22A is a top-down view, FIG. 22B is a vertical cross-sectional view along the vertical plane B-B' of FIG. 22A, and FIG. 22C is a vertical cross-sectional view along the vertical plane C-C' of FIG. 22A.

FIG. 23A is a top-down view, FIG. 23B is a vertical cross-sectional view along the vertical plane B-B' of FIG. 23A, and FIG. 23C is a vertical cross-sectional view along the vertical plane C-C' of FIG. 23A.

FIG. 24A is a top-down view, FIG. 24B is a vertical cross-sectional view along the vertical plane B-B' of FIG. 24A, and FIG. 24C is a vertical cross-sectional view along the vertical plane C-C' of FIG. 24A.

FIG. 25A is a top-down view, FIG. 25B is a vertical cross-sectional view along the vertical plane B-B' of FIG. 25A, and FIG. 25C is a vertical cross-sectional view along the vertical plane C-C' of FIG. 25A.

FIG. 26A is a top-down view, FIG. 26B is a vertical cross-sectional view along the vertical plane B-B' of FIG. 26A, and FIG. 26C is a vertical cross-sectional view along the vertical plane C-C' of FIG. 26A.

FIG. 27A is a top-down view, FIG. 27B is a vertical cross-sectional view along the vertical plane B-B' of FIG. 27A, and FIG. 27C is a vertical cross-sectional view along the vertical plane C-C' of FIG. 27A.

FIG. 28A is a top-down view, FIG. 28B is a vertical cross-sectional view along the vertical plane B-B' of FIG. 28A, and FIG. 28C is a vertical cross-sectional view along the vertical plane C-C' of FIG. 28A.

FIG. 29A is a top-down view, FIG. 29B is a vertical cross-sectional view along the vertical plane B-B' of FIG. 29A, and FIG. 29C is a vertical cross-sectional view along the vertical plane C-C' of FIG. 29A.

FIG. 30A is a top-down view, FIG. 30B is a vertical cross-sectional view along the vertical plane B-B' of FIG. 30A, and FIG. 30C is a vertical cross-sectional view along the vertical plane C-C' of FIG. 30A.

FIGS. 31A-31C are various views of the third exemplary structure after formation of junction-level dielectric spacers according to an embodiment of the present disclosure. FIG. 31A is a top-down view, FIG. 31B is a vertical cross-sectional view along the vertical plane B-B' of FIG. 31A, and FIG. 31C is a vertical cross-sectional view along the vertical plane C-C' of FIG. 31A.

FIGS. 32A-32C are various views of the third exemplary structure after patterning the first electrically conductive layer into first electrically conductive lines according to an embodiment of the present disclosure. FIG. 32A is a top-down view, FIG. 32B is a vertical cross-sectional view along the vertical plane B-B' of FIG. 32A, and FIG. 32C is a vertical cross-sectional view along the vertical plane C-C' of FIG. 32A.

FIGS. 33A-33C are various views of the third exemplary structure after formation of first junction-level dielectric material rails according to an embodiment of the present disclosure. FIG. 33A is a top-down view, FIG. 33B is a vertical cross-sectional view along the vertical plane B-B' of FIG. 33A, and FIG. 33C is a vertical cross-sectional view along the vertical plane C-C' of FIG. 33A.

FIG. 34A is a top-down view, FIG. 34B is a vertical cross-sectional view along the vertical plane B-B' of FIG. 34A, and FIG. 34C is a vertical cross-sectional view along the vertical plane C-C' of FIG. 34A.

FIG. 35A is a top-down view, FIG. 35B is a vertical cross-sectional view along the vertical plane B-B' of FIG. 35A, and FIG. 35C is a vertical cross-sectional view along the vertical plane C-C' of FIG. 35A.

FIGS. 36A-36C are various views of the third exemplary structure after removal of patterned portions of the second pattern transfer assist layer and the patterning film according to an embodiment of the present disclosure. FIG. 36A is a top-down view, FIG. 36B is a vertical cross-sectional view along the vertical plane B-B' of FIG. 36A, and FIG. 36C is a vertical cross-sectional view along the vertical plane C-C' of FIG. 36A.

FIGS. 37A-37C are various views of the third exemplary structure after formation of second junction-level dielectric material rails according to an embodiment of the present disclosure. FIG. 37A is a top-down view, FIG. 37B is a vertical cross-sectional view along the vertical plane B-B' of FIG. 37A, and FIG. 37C is a vertical cross-sectional view along the vertical plane C-C' of FIG. 37A.

FIG. 38A is a top-down view, FIG. 38B is a vertical cross-sectional view along the vertical plane B-B' of FIG. 38A, and FIG. 38C is a vertical cross-sectional view along the vertical plane C-C' of FIG. 38A.

FIG. 39A is a top-down view, FIG. 39B is a vertical cross-sectional view along the vertical plane B-B' of FIG. 39A, and FIG. 39C is a vertical cross-sectional view along the vertical plane C-C' of FIG. 39A.

FIG. 40A is a top-down view, FIG. 40B is a vertical cross-sectional view along the vertical plane B-B' of FIG. 40A, and FIG. 40C is a vertical cross-sectional view along the vertical plane C-C' of FIG. 40A.

DETAILED DESCRIPTION

Figure 1:
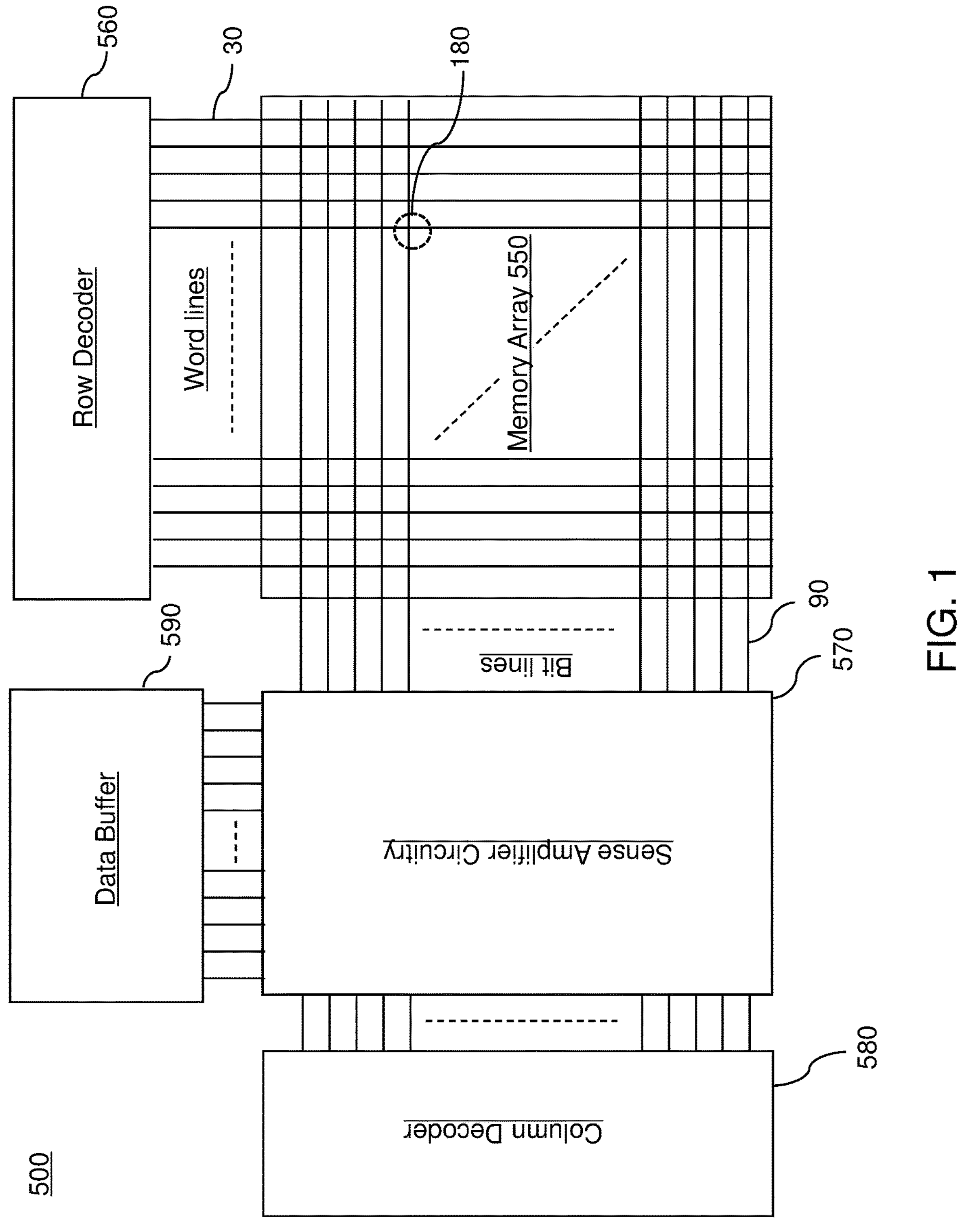
FIG. 1 is a schematic diagram of a memory device including resistive memory cells of the present disclosure in an array configuration.

As discussed above, the embodiments of the present disclosure are directed to a cross-point magnetoresistive memory array containing magnetic tunnel junction pillars and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "metallic material" refers to a conductive material including at least one metallic element therein. All measurements for electrical conductivities are made at the standard condition.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "RAM device" refers to a memory device containing memory cells that allow random access, e.g., access to any selected memory cell upon a command for reading the contents of the selected memory cell. As used herein, an "MRAM device" refers to a RAM device in which the memory cells are magnetoresistive memory cells.

The MRAM device 500 of an embodiment of the present disclosure includes a memory array region 550 containing an array of the respective MRAM cells 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
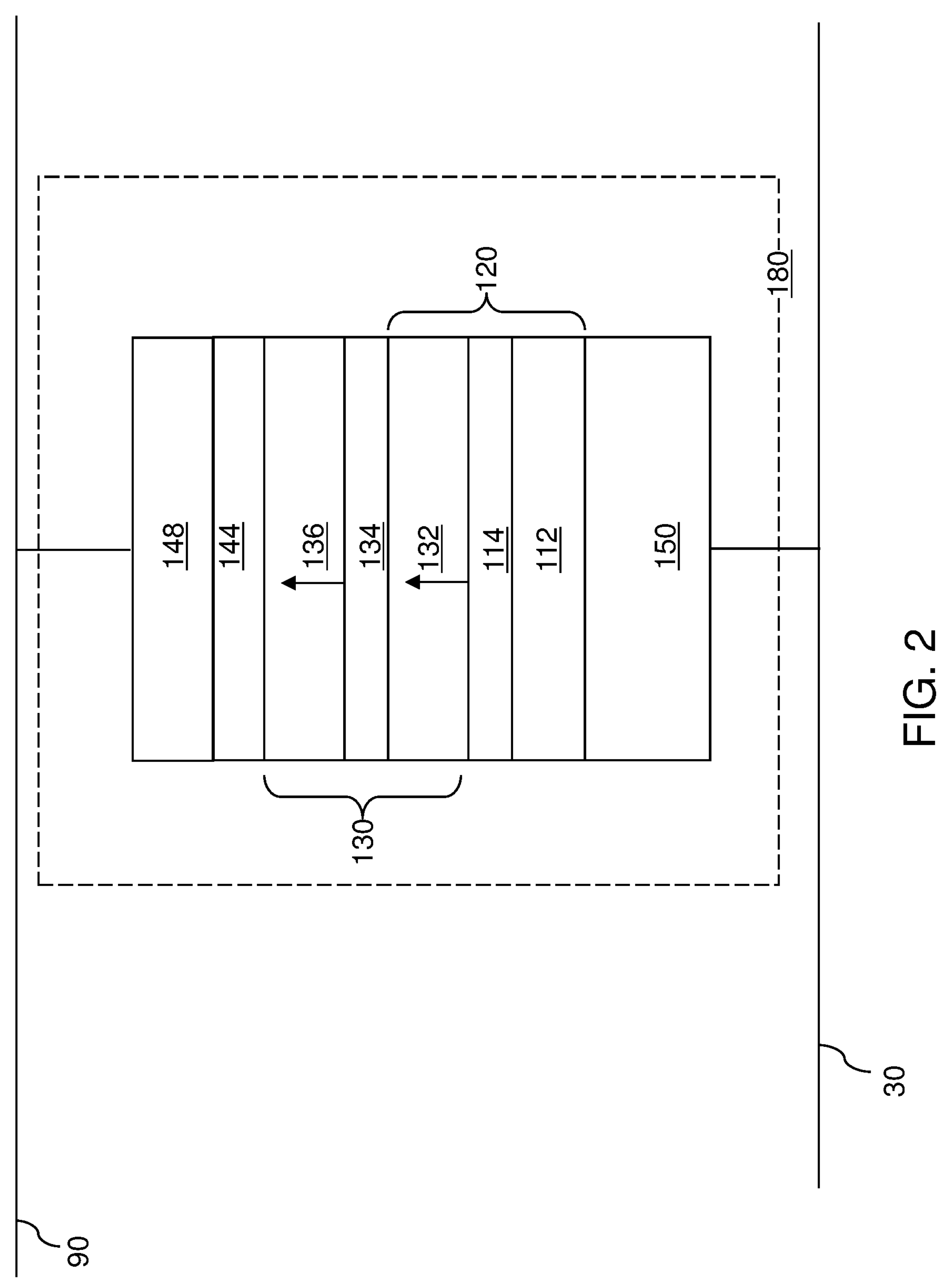
FIG. 2 illustrates an exemplary STT MRAM cell according to an embodiment of the present disclosure.

Referring to FIG. 2, an exemplary spin-transfer torque (STT) MRAM device is illustrated, which may comprise one MRAM cell 180 within the magnetic memory device illustrated in FIG. 1. The MRAM cell 180 of FIG. 2 can include a first terminal that may be electrically connected to, or comprises, a portion of a first electrically conductive line 30 and a second terminal that may be electrically connected to, or comprises, a portion of a second electrically conductive line 90. The first terminal can function as a first electrode, and the second terminal can function as a second electrode.

Generally, the MRAM cell 180 includes a magnetic tunnel junction (MTJ) 130. The magnetic tunnel junction 130 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (which may be a dielectric layer such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An electrically conductive capping layer 148 may be formed on top of the free layer 136 in order to provide additional perpendicular anisotropy. A dielectric capping layer 144 may be provided between the free layer 136 and the electrically conductive capping layer 148. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The relative resistance change between parallel and antiparallel alignment (i.e., orientation) of the magnetization direction is called tunnel magnetoresistance (TMR).

In one embodiment, the reference layer 132 and the free layer 136 may include one or more ferromagnetic layers, such as CoFe or CoFeB. In plural ferromagnetic layers are included in the reference layer 132, then a thin non-magnetic layer comprised of tantalum or tungsten having a thickness of 0.2 nm~0.5 nm may be located between the ferromagnetic layers. The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

The reference layer 132 may be provided as a component within a synthetic antiferromagnetic structure (SAF structure) 120 which is formed over an optional nonmagnetic metallic seed layer (e.g., layer 160L described below with respect to FIGS. 4B and 4C), such as a Ta and/or Pt seed layer. In one embodiment, the SAF structure 120 can include a vertical stack including at least one superlattice 112 and an antiferromagnetic coupling layer 114 located between the reference layer 132 and the at least one superlattice 112. In one embodiment, the at least one superlattice 112 may comprise a first superlattice and a second superlattice. The antiferromagnetic layer 114 may comprise an Ir or an IrMn alloy layer located between the first and the second superlattices. In one embodiment, the first superlattice comprises N1 repetitions of a first unit layer stack of the first cobalt layer and the first platinum layer, and a first capping cobalt layer, such that N1 of the first platinum layers are interlaced with (N1+1) of the first cobalt layers, where N1 is an integer in a range from 2 to 10. The second superlattice comprises N2 repetitions of a second unit layer stack of the second cobalt layer and the second platinum layer, and a second capping cobalt layer, such that N2 first platinum layers are interlaced with (N2+1) second cobalt layers, where N2 is an integer in a range from 2 to 10. Other SAF structures 120 may be used. For example, a superlattice layer may be used instead of the at least one superlattice 112. The superlattice layer 112 includes a ferromagnetic material having perpendicular magnetic anisotropy. The magnetization of the reference layer 132 can be antiferromagnetically coupled to the magnetization of the superlattice layer 112.

The electrically conductive capping layer 148, if present, can include a nonmagnetic metal layer or multilayers, such as ruthenium, tungsten and/or tantalum. The electrically conductive capping layer 148 may be a portion of a second electrically conductive line 90, or may be an electrically conductive structure that underlies the second electrically conductive line 90.

In one embodiment, the insulating cap layer 144 may comprise a thin magnesium oxide layer that is thin enough to enable tunneling of electrical current, such as a thickness in a range from 4 Angstroms to 10 Angstroms. In one embodiment, the MRAM cell 180 can be a single tunnel junction device that includes only one magnetic tunnel junction 130.

A selector element 150 can be formed in a series connection with the magnetic tunnel junction 130. The selector element 150 includes a selector material that provides a bidirectional current flow when the current or voltage exceeds a threshold value. Thus, the selector element 150 is a bidirectional selector device which permits bidirectional current flow when the current or voltage exceeds a threshold value and blocks current flow when the current or voltage is below the threshold value. The selector element 150 may include an ovonic threshold switch (OTS) material that allows flow of electrical current only when a voltage differential thereacross exceeds a threshold voltage value. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material. The chalcogenide material may be a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si.

The selector element 150 may also include one or more electrically conductive and/or barrier layers, such as tungsten, tungsten nitride, tantalum, tantalum nitride, a carbon-nitrogen layer, etc.). The electrically conductive and/or barrier layers may be located above and/or below the ovonic threshold switch material.

The layer stack including the selector element 150, the SAF structure 120, the magnetic tunnel junction 130, the insulating cap layer 144 and the electrically conductive capping layer 148 can be annealed to induce crystallographic alignment between the crystalline structure of the nonmagnetic tunnel barrier layer 134 (which may include crystalline MgO having a rock salt crystal structure) and the crystalline structure within the free layer 136.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. The magnetization direction of the free layer 136 can be flipped (i.e., from upward to downward or vice versa) by flowing electrical current through the discrete patterned layer stack (120, 130, 144, 148, 150, 170).

Figure 3A:
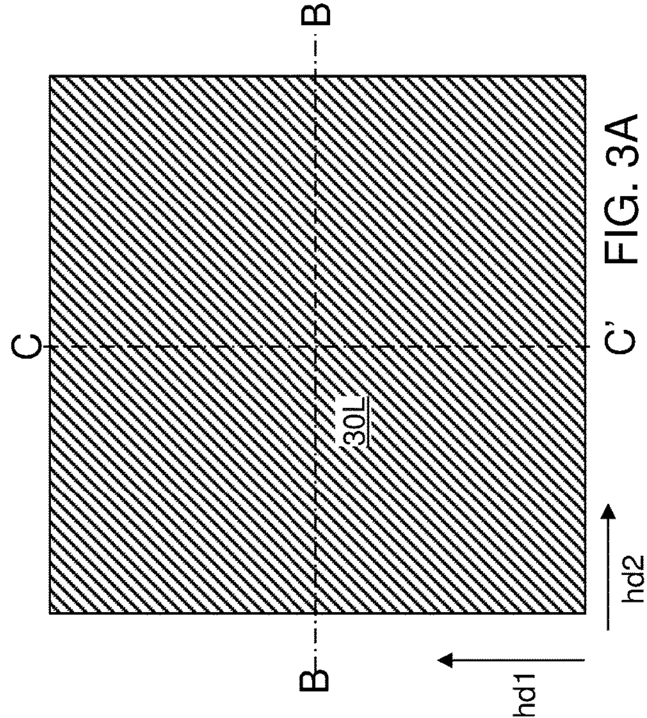
FIGS. 3A-3C are various views of a first exemplary structure after formation of a first electrically conductive layer according to an embodiment of the present disclosure.
Figure 3B:
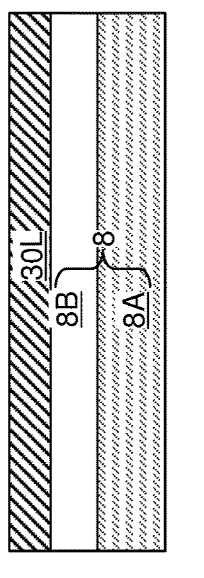

Referring to FIGS. 3A and 3B, a first exemplary structure for forming a two-dimensional array of STT MRAM cells 180 is illustrated. The first exemplary structure can be provided by forming a layer stack of blanket (unpatterned) layers over a substrate 8. The substrate 8 may comprise, for example, a semiconductor substrate 8A and at least one dielectric material layer 8B formed over the semiconductor substrate 8A. Alternatively, an insulating substrate 8 (e.g., a ceramic or a glass substrate) or a conductive substrate 8 (e.g., a metal or metal alloy substrate) may be used instead. In one embodiment, various semiconductor devices (not shown) including switching devices and peripheral (i.e., driver) circuits may be formed over the semiconductor substrate 8A, and metal interconnect structures (not shown) may be formed in the at least one dielectric material layer 8B. The various semiconductor devices, if present, may comprise the various driver circuits of the MRAM device 500 illustrated in FIG. 1 other than the memory array region 550, which is subsequently formed in subsequent processing steps.

A first electrically conductive layer 30L can be deposited over the substrate 8. The first electrically conductive layer 30L includes a first nonmagnetic electrically conductive material such as Al, Cu, W, Ru, Mo, Nb, Ti, Ta, TiN, TaN, WN, MoN, or a combination thereof. The thickness of the first electrically conductive layer 30L can be in a range from 20 nm to 100 nm, although lesser and greater thicknesses can also be employed.

Figures 4A, 4B, 4C:
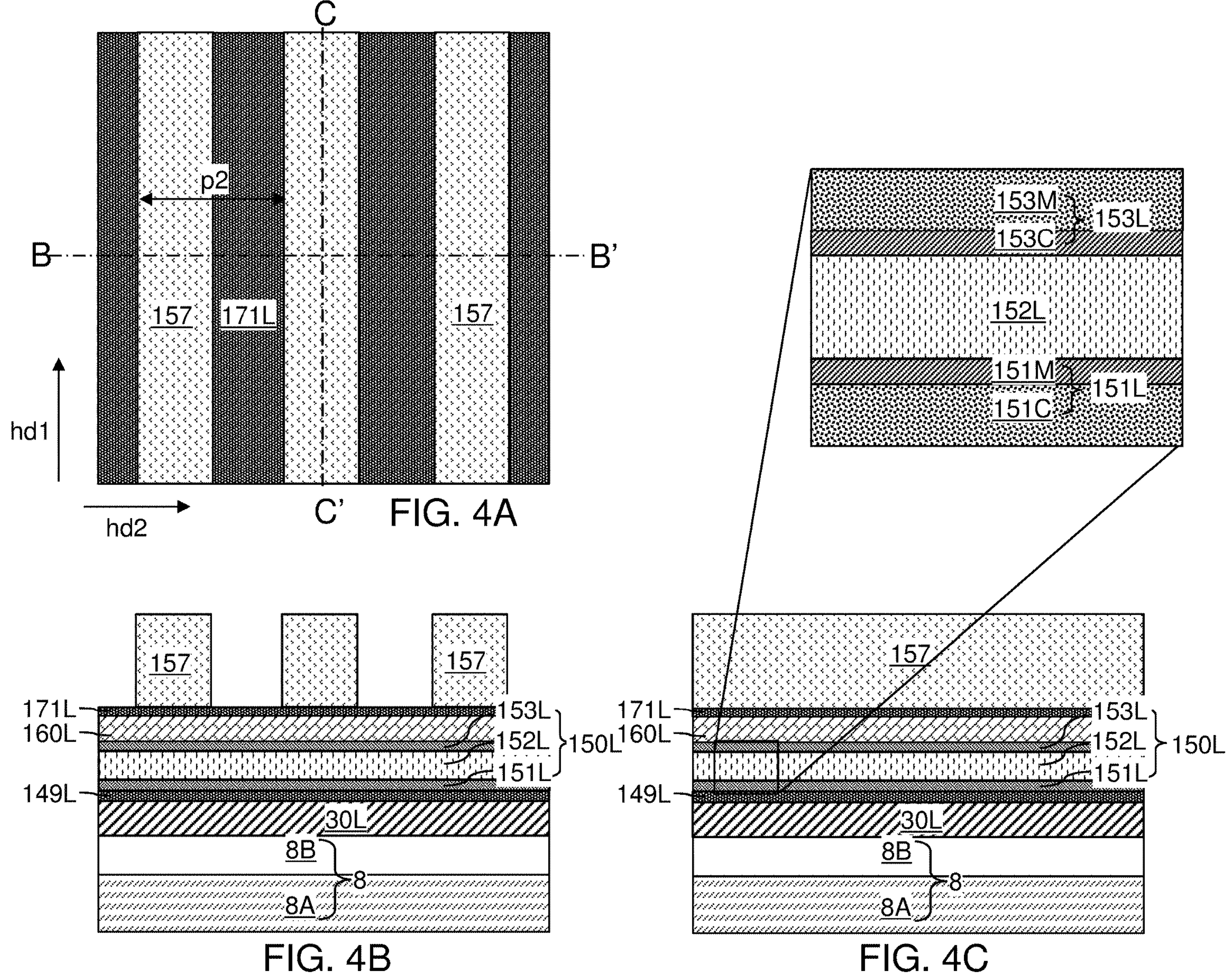
FIGS. 4A-4C are various views of the first exemplary structure after formation of selector-level material layers, a first pattern transfer assist layer, and a first patterned photoresist layer according to an embodiment of the present disclosure.

Referring to FIGS. 4A-4C, an optional metallic adhesion layer 149L, selector-level material layers (150L, 160L), and an optional first image transfer assist layer 171L can be formed over the first electrically conductive layer 30L. The optional metallic adhesion layer 149L comprises a metallic material that promotes adhesion of the selector-level material layers (150L, 160L). For example, the optional metallic adhesion material layer 149L may comprise a metallic material such as Ta, Ti, TaN, TiN, or WN. The thickness of the metallic adhesion material layer 149L may be in a range from 1 nm to 30 nm, although lesser and greater thicknesses may also be employed.

The selector-level material layers (150L, 160L) can include, from bottom to top, selector material layers 150L and an optional conductive material layer 160L (e.g., seed layer). The selector material layers 150L can comprise, from bottom to top, a lower selector electrode material layer 151L, a non-Ohmic selector material layer 152L, and an upper selector electrode material layer 153L. The lower selector electrode material layer 151L includes at least one material that may be employed for lower selector electrodes to be subsequently formed. The non-Ohmic selector material layer 152L includes a selector material that exhibits a non-Ohmic switching behavior. The upper selector electrode material layer 153L includes at least one material that may be employed upper selector electrodes to be subsequently formed.

In one embodiment, the lower selector electrode material layer 151L may comprise a layer stack including a lower carbon-based electrode material layer 151C and a lower metallic material layer 151M formed on the lower carbon-based electrode material layer 151C. In one embodiment, the upper selector electrode material layer 153L may comprise a layer stack including an upper metallic material layer 153M and an upper carbon-based electrode material layer 153C formed on the upper metallic material layer 153M.

The lower carbon-based electrode material layer 151C and the upper carbon-based electrode material layer 153C within the selector-level material layers can include a respective carbon-based conductive material including carbon atoms at an atomic concentration greater than 50%. In one embodiment, the lower carbon-based electrode material layer 151C and the upper carbon-based electrode material layer 153C may include carbon atoms at an atomic concentration in a range from 50% to 100%, such as from 70% to 100% and/or from 80% to 100%. In one embodiment, each of lower carbon-based electrode material layer 151C and the upper carbon-based electrode material layer 153C comprises a respective material selected from diamond-like carbon (DLC), a carbon nitride material, and a carbon-rich conductive compound of carbon atoms and non-carbon atoms. Each of the lower carbon-based electrode material layer 151C and the upper carbon-based electrode material layer 153C may have a respective thickness in a range from 3 nm to 300 nm, although lesser and greater thicknesses may also be employed.

The lower metallic material layer 151M and the upper metallic material layer 153M within the selector material layers 150L can include a respective metallic material having electrical conductivity that is greater than the electrical conductivity of the carbon-based conductive materials of the lower carbon-based electrode material layer 151C and the upper carbon-based electrode material layer 153C. In one embodiment, the lower metallic material layer 151M comprises a metallic material having electrical conductivity that is at least 10 times (which may be at least 30 times and/or at least 100 times and/or at least 1,000 times) the electrical conductivity of the carbon-based conductive material of lower carbon-based electrode material layer 151C, and the upper metallic material layer 153M comprises a second metallic material having electrical conductivity that is at least 10 times (which may be at least 30 times and/or at least 100 times and/or at least 1,000 times) the electrical conductivity of the carbon-based conductive material of the upper carbon-based electrode material layer 153C.

Generally, each of the lower metallic material layer 151M and the upper metallic material layer 153M may comprise, and/or may consist essentially of, a high-conductivity metallic material that has a high electrical conductivity, and thus, is capable of functioning as a current-spreading material that prevents concentration of electrical current in the non-Ohmic material of the non-Ohmic selector material layer 152L. In one embodiment, the lower metallic material layer 151M and/or the upper metallic material layer 153M may comprise, and/or may consist essentially of, an elemental metal, a conductive metallic carbide, or a conductive metallic nitride. In one embodiment, the lower metallic material layer 151M and/or the upper metallic material layer 153M may comprise, and/or may consist essentially of, a respective elemental metal having a melting point higher than 2,000 degrees Celsius (such as refractory metals). In one embodiment, the lower metallic material layer 151M and/or the upper metallic material layer 153M may comprise, and/or may consist essentially of, a respective elemental metal selected from ruthenium, niobium, molybdenum, tantalum, tungsten, or rhenium. In one embodiment, the lower metallic material layer 151M and/or the upper metallic material layer 153M may comprise, and/or may consist essentially of, a conductive metallic carbide such as tungsten carbide. In one embodiment, the lower metallic material layer 151M and/or the upper metallic material layer 153M may comprise, and/or may consist essentially of, a conductive metallic nitride such as tungsten nitride, titanium nitride, or tantalum nitride.

Generally, the lower metallic material layer 151M and the upper metallic material layer 153M may have a lower thickness than the lower carbon-based electrode material layer 151C and the upper carbon-based electrode material layer 153C. Each of the lower metallic material layer 151M and the upper metallic material layer 153M may have a respective thickness in a range from 0.2 nm to 10 nm, such as from 1 nm to 5 nm, although lesser and greater thicknesses may also be employed. In one embodiment, the ratio of the thickness of the lower carbon-based electrode material layer 151C to the thickness of the lower metallic material layer 151M may be in a range from 3.0 to 500, such as from 10 to 100, although lesser and greater ratios may also be employed. In one embodiment, the ratio of the thickness of the upper carbon-based electrode material layer 153C to the thickness of the upper metallic material layer 153M may be in a range from 3.0 to 500, such as from 10 to 100, although lesser and greater ratios may also be employed.

In one embodiment, the non-Ohmic selector material layer 152L within the selector material layers 150L can include any suitable non-Ohmic selector material which exhibits non-linear electrical behavior. For example, the non-Ohmic selector material may comprise an ovonic threshold switch (OTS) material. As used herein, an ovonic threshold switch material refers to a material that displays a non-linear resistivity curve under an applied external bias voltage such that the resistivity of the material decreases with the magnitude of the applied external bias voltage. In other words, the ovonic threshold switch material is non-Ohmic, and becomes more conductive under a higher external bias voltage than under a lower external bias voltage. As used herein, an ovonic threshold switch is a device that includes a chalcogen-containing ovonic threshold switch material layer which does not crystallize in a low resistivity state under a voltage above the threshold voltage, and reverts back to a high resistivity state when not subjected to a voltage above a critical holding voltage across the ovonic threshold switch material layer.

In another embodiment, the non-Ohmic selector material may comprise a volatile conductive bridge material or at least one non-threshold switch material, such as a tunneling selector material or diode materials (e.g., materials for p-n semiconductor diode, p-i-n semiconductor diode, Schottky diode or metal-insulator-metal diode). Thus, the material layer 152L may comprise a diode layer stack, such as a layer stack of p-doped semiconductor material layer and an n-doped semiconductor material layer, or a layer stack of a p-doped semiconductor material layer, an intrinsic semiconductor material layer, and an n-doped semiconductor material layer.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The ovonic threshold switch material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise an amorphous chalcogenide material, such as a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si. The thickness of the non-Ohmic material layer 152L can be, for example, in a range from 1 nm to 50 nm, such as from 5 nm to 25 nm, although lesser and greater thicknesses can also be employed.

The optional conductive material layer 160L includes a nonmagnetic conductive material such as Ta and/or Pt, which can function as a seed layer for the magnetic-tunnel-junction-level (MTJ-level) material layers to be formed thereon The thickness of the electrically conductive layer 30L can be in a range from 1 nm to 10 nm, although lesser and greater thicknesses can also be employed.

The optional first image transfer assist layer 171L includes a hard mask material that can provide a high etch resistance for an anisotropic etch process to be subsequently employed with respect to the material of the underlying layers. For example, the optional first image transfer assist layer 171L may comprise a metal such as TiN, TaN, WN, Ti, W, Cr, or Ru. The thickness of the first image transfer assist layer 171L may be in a range from 1 nm to 30 nm, such as from 2 nm to 10 nm, although lesser and greater thicknesses may also be employed.

A photoresist layer can be applied over the selector-level material layers (150L, 160L) and the optional first image transfer assist layer 171L, and can be lithographically patterned to form a first patterned photoresist layer 157. The first patterned photoresist layer 157 can be patterned with a periodic line-and-space pattern in which each line laterally extends along the first horizontal direction hd1. The pitch of the periodic line-and-space pattern along a second horizontal direction hd2 that is perpendicular to the first horizontal direction hd1 is herein referred to as a second pitch p2. The second pitch p2 may be in a range from 10 nm to 300 nm, such as from 30 nm to 100 nm, although lesser and greater dimensions may also be employed for the second pitch p2.

Figures 5A, 5B, 5C:
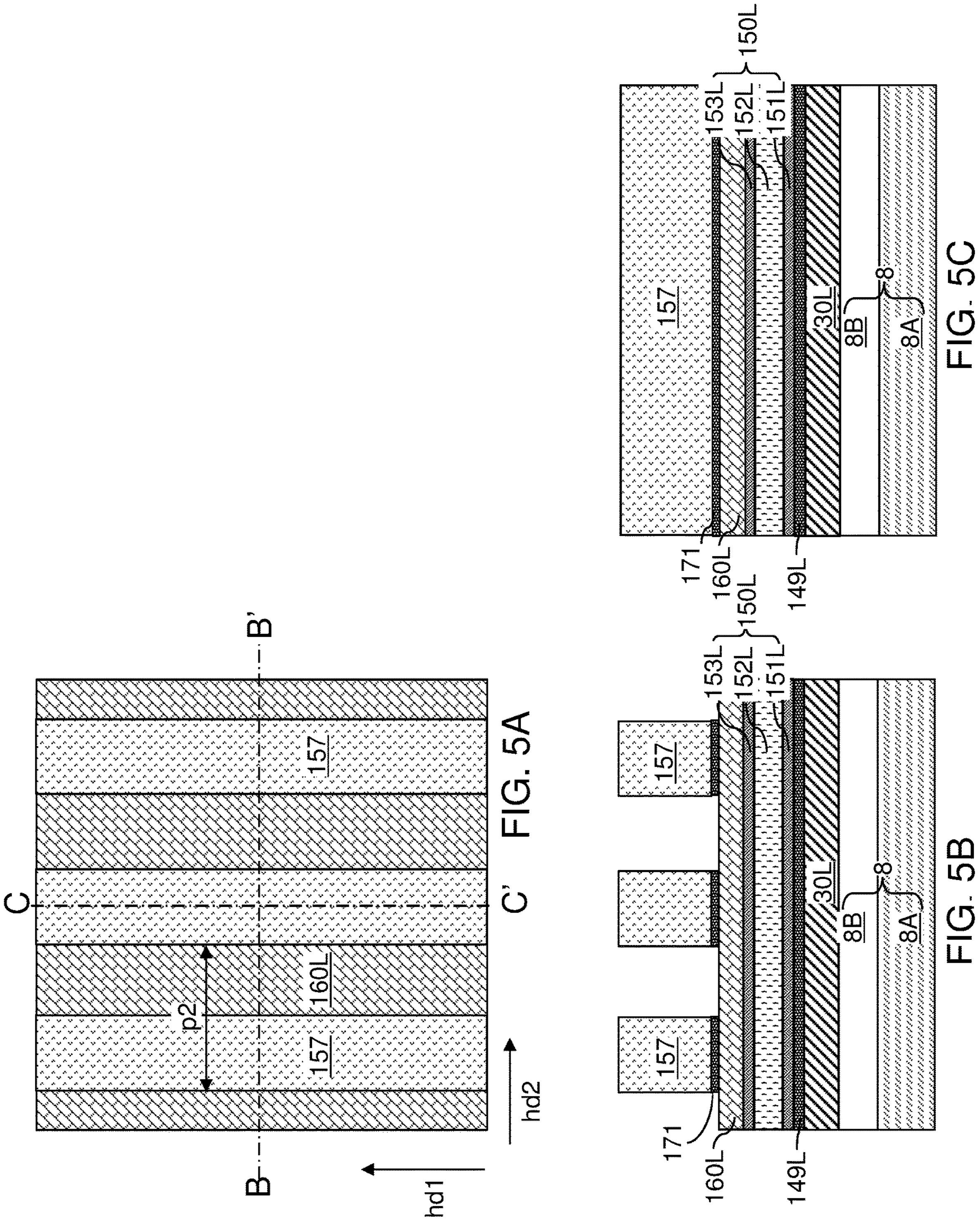
FIGS. 5A-5C are various views of the first exemplary structure after formation of etch mask strips according to an embodiment of the present disclosure.

Referring to FIGS. 5A-5C, a first anisotropic etch process can be performed to transfer the pattern in the first patterned photoresist layer 157 through the first image transfer assist layer 171L. The first image transfer assist layer 171L can be patterned into etch mask strips 171. Each etch mask strip 171 is a patterned portion of the first image transfer assist layer 171L, and may laterally extend along the first horizontal direction hd1 with a uniform width along the second horizontal direction hd2. A one-dimensional periodic array of etch mask strips 171 can be formed, which can have a periodicity of the second pitch p2 along the second horizontal direction hd2.

Figures 6A, 6B, 6C:
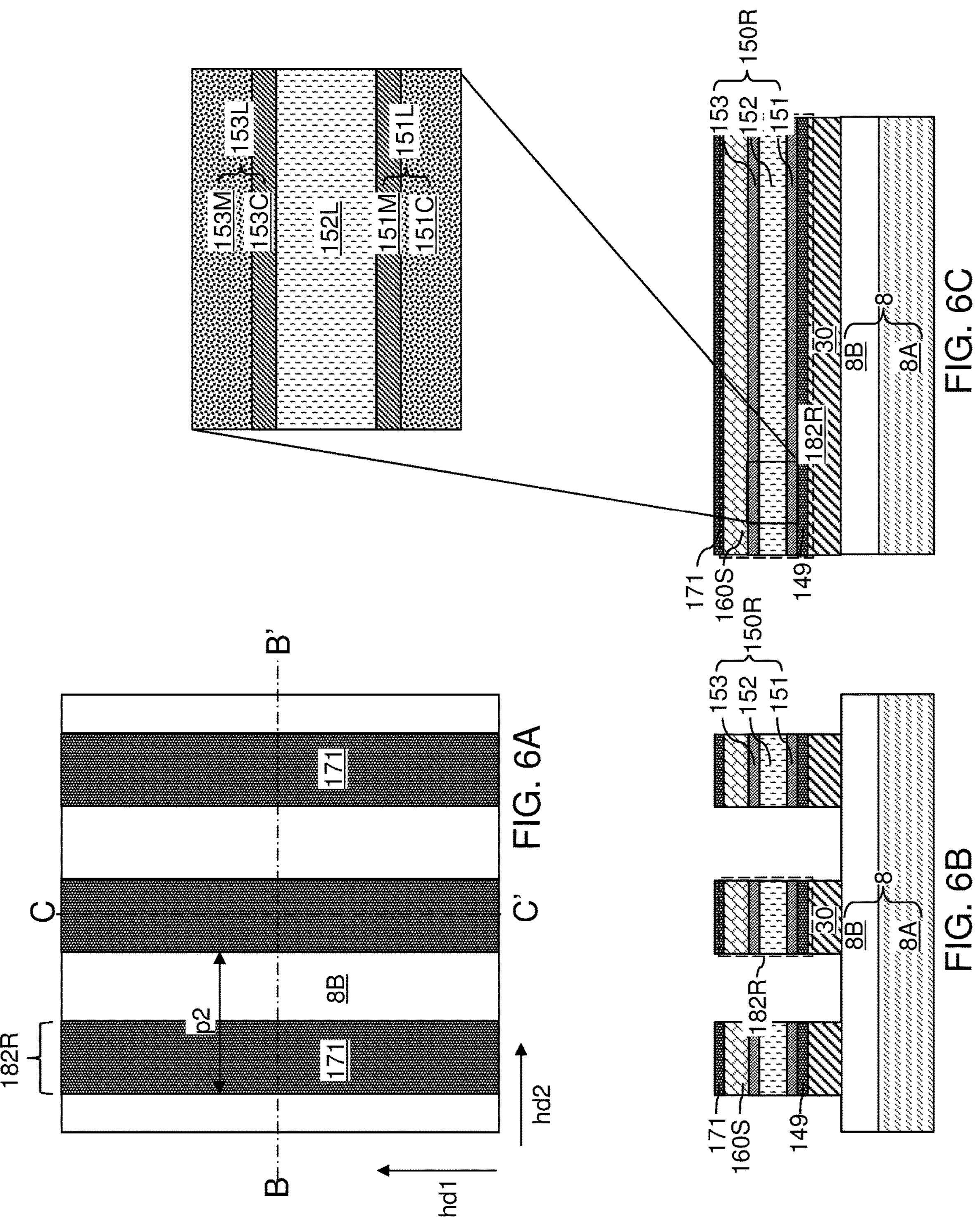
FIGS. 6A-6C are various views of the first exemplary structure after formation of selector rails and first electrically conductive lines according to an embodiment of the present disclosure.

Referring to FIGS. 6A-6C, a second anisotropic etch process can be performed to transfer the pattern in the first patterned photoresist layer 157 and/or in the etch mask strips 171 through the selector-level material layers (150L, 160L), the metallic adhesion layer 149L, and through the first electrode material layer 30L. The first patterned photoresist layer 157 and/or in the etch mask strips 171 can be employed as an etch mask for the second anisotropic etch process. The first patterned photoresist layer 157 may be removed prior to the second anisotropic etch process, may be consumed during the second anisotropic etch process, or may be removed after the second anisotropic etch process.

Patterned portions of the selector-level material layers (150L, 160L) comprise a one-dimensional periodic array of selector-level material rails 182R. Each of the selector-level material rails 182R may comprise a selector rail 150R and an optional conductive material strip (e.g., seed layer string) 160S. Each selector rail 150R is a patterned portion of the selector material layers 150L, and each conductive material strip 160S is a patterned portion of the conductive material layer 160L. Each selector rail 150R may include a vertical stack of a lower selector electrode 151, a non-Ohmic selector material portion 152, and a upper selector electrode 153. Each lower selector electrode 151 is a patterned portion of the lower selector electrode material layer 151L. Each non-Ohmic selector material portion 152 is a patterned portion of the non-Ohmic selector material layer 152L. Each upper selector electrode 153 is a patterned portion of the upper selector electrode material layer 153L.

Patterned portions of the metallic adhesion layer 149L comprise metallic adhesion material portions 149. Patterned portions of the first electrically conductive layer 30L comprise first electrically conductive lines 30. The first electrically conductive lines 30 can laterally extend along the first horizontal direction hd1, and can have a uniform width along the second horizontal direction hd2. The first electrically conductive lines 30 may comprise word lines formed as a periodic one-dimensional array of first electrically conductive lines 30 having a periodicity of the second pitch p2 along the second horizontal direction hd2.

Generally, vertical stacks (30, 150R, 160S) including a respective first electrically conductive line 30, a respective selector rail 150R, and a respective electrically conductive strip 160S can be formed over the substrate 8. The vertical stacks (30, 150R, 160S) laterally extend along the first horizontal direction hd1, and are laterally spaced apart from each other along the second horizontal direction hd2. Each of the selector rails includes a lower selector electrode 151, a non-Ohmic selector material portion 152 overlying the lower selector electrode 151, and an upper selector electrode 153 overlying the non-Ohmic selector material portion 152.

Referring to FIGS. 7A-7C, a dielectric spacer material layer 178L can be formed over the vertical stacks (30, 150R, 160S) and the optional etch mask strips 171. In one embodiment, the dielectric spacer material layer 178L can be conformally deposited over, and around, the two-dimensional array of vertical stacks (30, 150R, 160S) including a respective first electrically conductive line 30, a respective selector rail 150R, and a respective electrically conductive strip 160S. In one embodiment, the dielectric spacer material layer 178L may comprise a dielectric material that can protect the materials of the selector rails 150R. For example, the dielectric spacer material layer 178L may comprise, and/or may consist essentially of, silicon nitride, silicon carbide nitride (i.e., silicon carbonitride), silicon oxynitride, silicon oxide, or metal oxide (e.g., aluminum oxide). The thickness of the dielectric spacer material layer 178L may be in a range from 1 nm to 60 nm, such as from 2 nm to 30 nm, although lesser and greater thicknesses may also be employed.

Referring to FIGS. 8A-8C, a dielectric fill material can be deposited in the gaps between neighboring pairs of vertical stacks (30, 150R, 160S) to fill the volumes of the gaps. The dielectric fill material may comprise silicon oxide, organosilicate glass, silicon nitride, or a dielectric metal oxide. For example, the dielectric fill material may comprise undoped silicate glass (i.e., silicon oxide) or a doped silicate glass. A planarization process, such as a chemical mechanical polishing process can be performed to remove portions of the dielectric fill material that are deposited above the horizontal plane including the top surfaces of the electrically conductive strips 160S. Remaining portions of the dielectric fill material that fills a respective gap between a respective neighboring pair of vertical stacks (30, 150R, 160S) constitute selector-level dielectric material portions 40. The etch mask strips 171 can be collaterally removed during the planarization process. Top surfaces of the selector-level dielectric material portions 40 can be coplanar with the top surfaces of the electrically conductive strips 160S. If the upper portion of the selector electrode 153 comprises a carbon-based material, then the electrically conductive strips 160S protects the carbon-based material from damage during the CMP process. If the upper portion of the selector electrode 153 comprises a metal or metal alloy, then the electrically conductive strips 160S may be omitted.

The selector-level dielectric material portions 40 laterally extend along the first horizontal direction hd1, and are laterally interlaced with the vertical stacks (30, 150R, 160S) along the second horizontal direction hd2. The dielectric spacer material layer 178L may be divided into a plurality of dielectric spacers 178. In one embodiment, the dielectric spacers 178 may embed a respective one of the selector-level dielectric material portions 40, and may contact lengthwise sidewalls of a pair of vertical stacks (30, 150R, 160S).

Figure 9A:
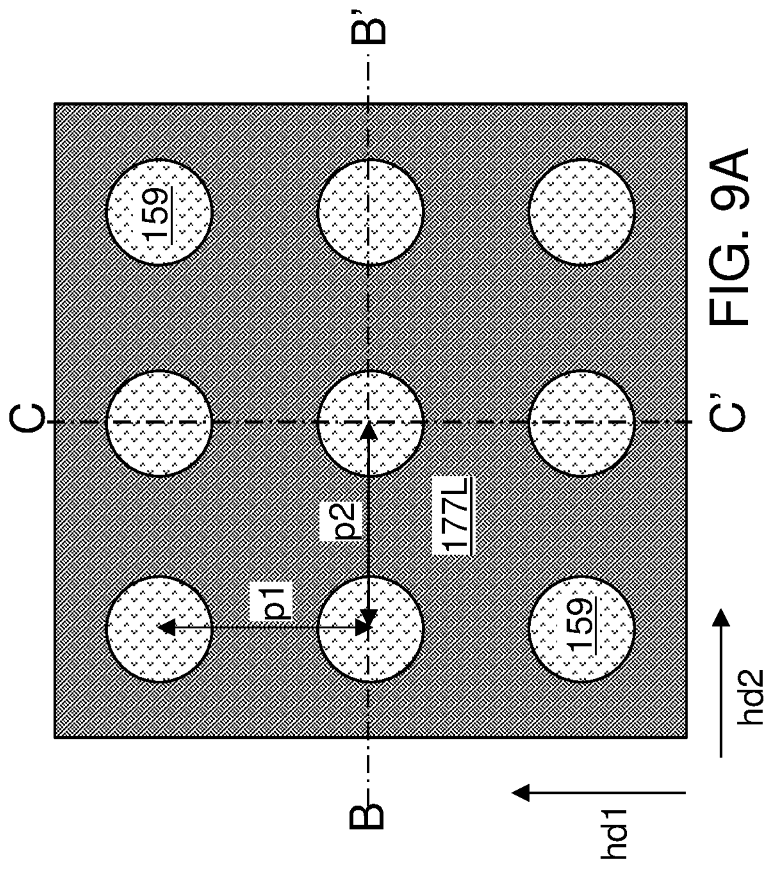
FIGS. 9A-9C are various views of the first exemplary structure after formation of magnetic tunnel junction material layers, a patterning film, a second pattern transfer assist layer, and a second patterned photoresist layer according to an embodiment of the present disclosure.
Figures 9B, 9C:
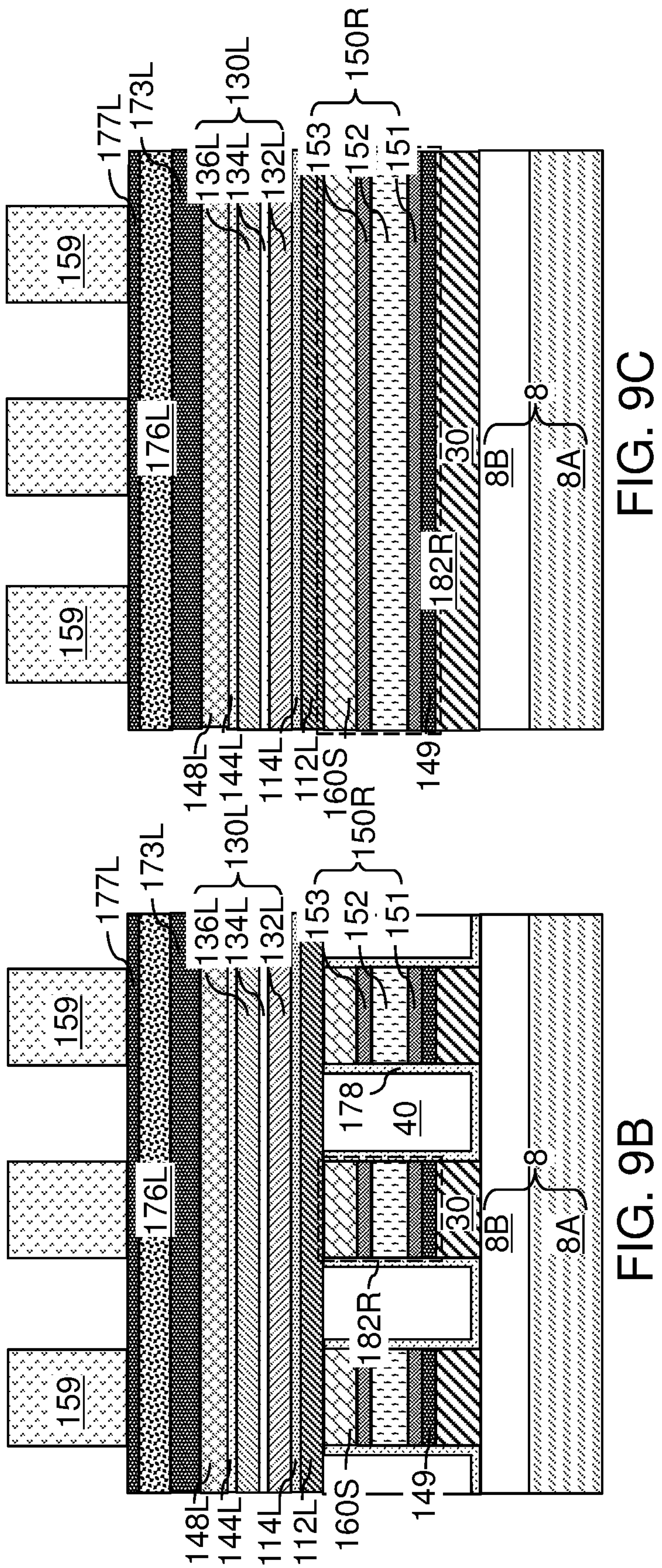

Referring to FIGS. 9A-9C, magnetic tunnel junction-level (MTJ-level) material layers (112L, 114L, 130L, 144L, 148L) can be formed over the vertical stacks (30, 150R, 160S) and the selector-level dielectric material portions 40. The MTJ-level material layers may comprise, for example, an optional continuous superlattice layer 112L, an optional continuous antiferromagnetic coupling layer 114L, continuous magnetic tunnel junction (MTJ) material layers 130L, an optional continuous dielectric capping layer 144L, and an optional continuous metallic capping layer 148L. The MTJ material layers 130L may comprises a layer stack including a continuous reference layer 132L, a continuous nonmagnetic tunnel barrier layer 134L, a continuous free layer 136L.

The continuous superlattice layer 112L can have the same material composition as the superlattice layer 112 described with reference to FIG. 2.

The continuous antiferromagnetic coupling layer 114L, if present, can have the same material composition as the antiferromagnetic coupling layer 114 described with reference to FIG. 2. In one embodiment, the continuous antiferromagnetic coupling layer 114 may comprise ruthenium, iridium, or IrMn alloy, and may have thickness in a range from 0.1 nm to 1.0 nm, such as from 0.2 nm to 0.6 nm.

The continuous reference layer 132L can have the same material composition as the reference layer 132 described with reference to FIG. 2. In one embodiment, the continuous reference layer 132L can include a CoFe alloy or a CoFeB alloy. Optionally, the continuous reference layer 132L may additionally include a thin non-magnetic layer comprised of tantalum or tungsten having a thickness of 0.2 nm~0.5 nm and a thin CoFeB layer having a thickness in a range from 0.5 nm to 3 nm.

The continuous nonmagnetic tunnel barrier layer 134L includes any insulating tunnel barrier material such as magnesium oxide. The thickness of the continuous nonmagnetic tunnel barrier layer 134L can be 0.7 nm to 1.3 nm, such as about 1 nm.

The continuous free layer 136L can have the same material composition as the free layer 136 described with reference to FIG. 2. In one embodiment, the continuous free layer 136L can include a CoFe alloy or a CoFeB alloy. Optionally, the continuous free layer 136L may additionally include a thin non-magnetic layer comprised of tantalum or tungsten having a thickness of 0.2 nm~0.5 nm and a thin CoFeB layer having a thickness in a range from 0.5 nm to 3 nm.

The continuous dielectric capping layer 144L can have the same material composition as the dielectric capping layer 144 described with reference to FIG. 2. The continuous dielectric capping layer 144L may comprise a thin magnesium oxide layer that is thin enough to enable tunneling of electrical current, such as a thickness in a range from 0.4 nm to 1.0 nm.

The continuous metallic capping layer 148L can have the same material composition as the metallic capping layer 144 described with reference to FIG. 2. The continuous metallic capping layer 148L may comprise a non-magnetic, electrically conductive material, such as W, Ti, Ta, WN, TiN, TaN, Ru, and Cu. The thickness of the continuous metallic capping layer 148L can be in a range from 10 nm to 100 nm, although lesser and greater thicknesses can also be employed.

An optional second image transfer assist layer 173L, an optional patterning film 176L, and an optional third image transfer assist layer 177L can be formed over the MTJ-level material layers (112L, 114L, 130L, 144L, 148L).

The optional second image transfer assist layer 173L includes a material that can provide a high etch resistance for an anisotropic etch process to be subsequently employed with respect to the materials of the underlying layers, thereby providing a high etch selectivity for the etch process that patterns the underlying layers. For example, the optional second image transfer assist layer 173L may comprise a metal such as TiN, TaN, WN, Ti, Ta, W, Cr, Pt, or Ru. For example, the second image transfer assist layer 173L may comprise a bilayer comprising a lower TiN sublayer and an upper Ru or Pt protective sublayer. The thickness of the second image transfer assist layer 173L may be in a range from 1 nm to 30 nm, such as from 2 nm to 10 nm, although lesser and greater thicknesses may also be employed.

The optional patterning film 176L comprises a carbon-based material that can enhance pattern fidelity during subsequent anisotropic etch processes. For example, the optional patterning film 176L may be composed primarily of amorphous carbon or diamond-like carbon.

The optional third image transfer assist layer 177L, if present, includes a material that can provide a high etch resistance for an anisotropic etch process to be subsequently employed with respect to the material of the patterning film 176L. For example, the optional third image transfer assist layer 177L may comprise a metal such as Cr or Ru. The thickness of the third image transfer assist layer 177L may be in a range from 1 nm to 30 nm, such as from 2 nm to 10 nm, although lesser and greater thicknesses may also be employed.

A photoresist layer can be applied over the MTJ-level material layers (112L, 114L, 130L, 144L, 148L), the optional patterning film 176L, and the optional second and third image transfer assist layers (173L, 177L), and can be lithographically patterned to form a second patterned photoresist layer 159. In one embodiment, the second patterned photoresist layer 159 may be formed as a two-dimensional array of discrete patterned photoresist material portions 159. The two-dimensional array of discrete patterned photoresist material portions of the second patterned photoresist layer 159 can be formed as a periodic array having the first pitch p1 along the first horizontal direction hd1 and having the second pitch p2 along the second horizontal direction hd2. In one embodiment, each row of discrete patterned photoresist material portions may be formed over the MTJ-level material layers. The lateral dimension of each of the discrete patterned photoresist material portions along the second horizontal direction hd2 may be the same as, may be less than, or may be greater than the width of the respective underlying vertical stack (30, 150R, 160S).

Figures 10A, 10B, 10C:
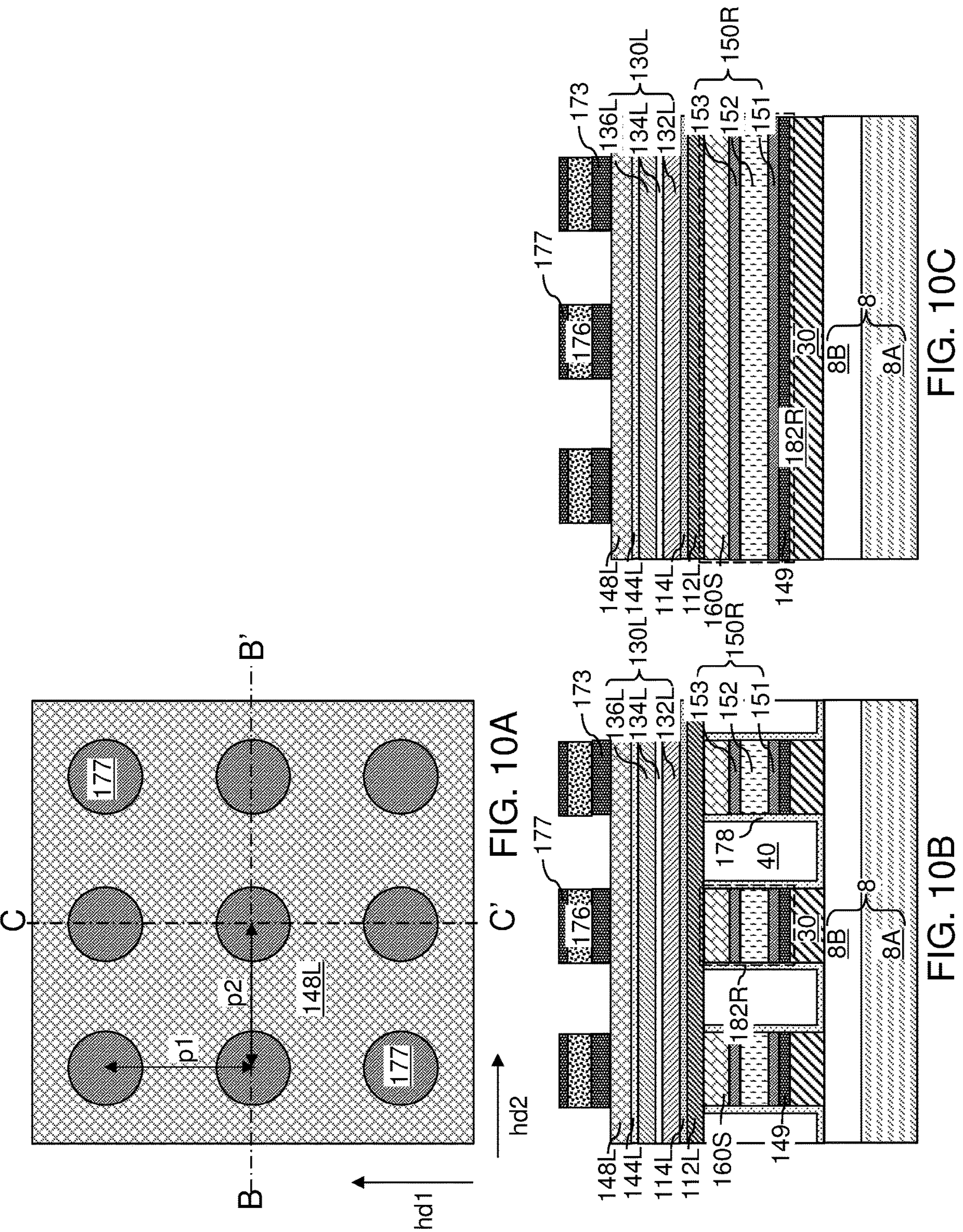
FIGS. 10A-10C are various views of the first exemplary structure after formation of a two-dimensional array of etch mask plates according to an embodiment of the present disclosure.

Referring to FIGS. 10A-10C, the pattern in the two-dimensional array of discrete patterned photoresist material portions of the second patterned photoresist layer 159 can be transferred through the third image transfer assist layer 177L, the patterning film 176L and the second image transfer assist layer 173L by performing an anisotropic etch process such as a reactive ion etch process. The third image transfer assist layer 177L can be divided into a two-dimensional array of second etch mask plates 177. The patterning film 176L can be divided into a two-dimensional array of patterning film plates 176. The second image transfer assist layer 173L can be divided into a two-dimensional array of second etch mask plates 173. The two-dimensional array of second discrete patterned photoresist material portions can be subsequently removed, for example, by ashing. A two-dimensional array of discrete masking structures (173, 176, 177) can be formed. Each discrete masking structure (173, 176, 177) may comprise a patterning film plate 176, a second etch mask plate 173 and/or a third etch mask plate 177.

Figures 11A, 11B, 11C:
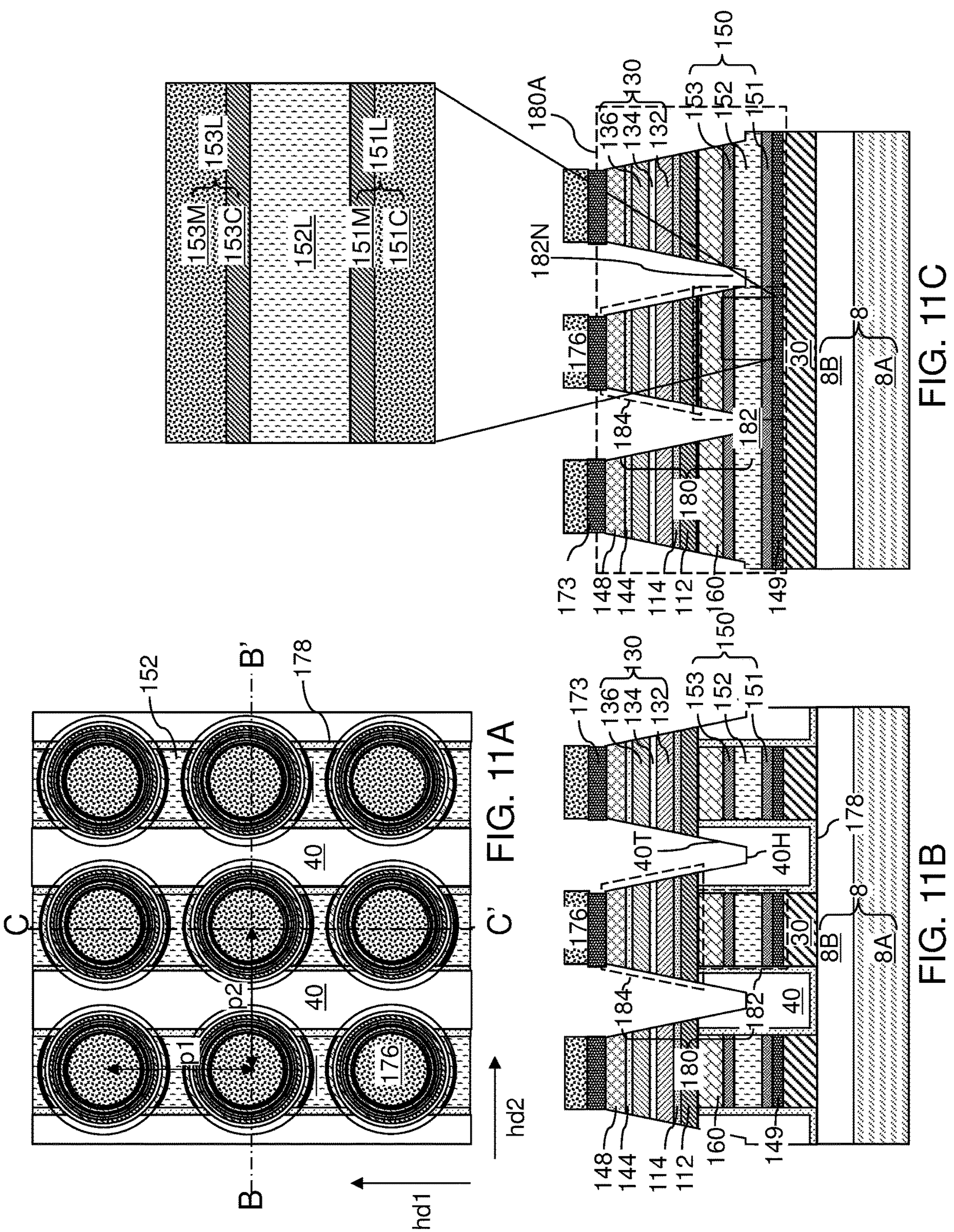
FIGS. 11A-11C are various views of the first exemplary structure after formation of a two-dimensional array of magnetic tunnel junction pillar structures according to an embodiment of the present disclosure.

Referring to FIGS. 11A-11C, an anisotropic etch process can be performed to transfer the pattern in the two-dimensional array of discrete masking structures (173, 176, 177) through the MTJ-level material layers (112L, 114L, 130L, 144L, 148L) and into upper portions of the vertical stacks (30, 150R, 160S) and the selector-level dielectric material portions 40. The anisotropic etch process may comprise an ion beam etch process (also known as ion milling).

The MTJ-level material layers (112L, 114L, 130L, 144L, 148L) can be patterned into a two-dimensional array of magnetic tunnel junction (MTJ) pillar structures 184. According to an aspect of the present disclosure, physically exposed surfaces of the MTJ pillar structures 184 may be formed with taper angles. The taper angles can be measured with respect to the vertical direction that is perpendicular to the top surface of the substrate 8. In one embodiment, the taper angle may be in a range from 3 degrees to 30 degrees, such as from 6 degrees to 20 degrees, although lesser and greater taper angles may also be employed.

Each MTJ pillar structure 184 may comprise a stack of an optional superlattice layer 112, an optional antiferromagnetic coupling layer 114, a magnetic tunnel junction 130, an optional dielectric capping layer 144, and an optional metallic capping layer 148. The magnetic tunnel junction 130 includes a reference layer 132, a tunnel barrier layer 134, and a free layer 136. Each superlattice layer 112 is a patterned portion of the continuous superlattice layer 112L. Each antiferromagnetic coupling layer 114 is a patterned portion of the continuous antiferromagnetic coupling layer 114L. Each magnetic tunnel junction 130 is a patterned portion of the magnetic tunnel junction material layers 130L. Each dielectric capping layer 144 is a patterned portion of the continuous dielectric capping layer 144L. Each metallic capping layer 148 is a patterned portion of the continuous metallic capping layer 148L. Each reference layer 132 is a patterned portion of the continuous reference layer 132L. Each tunnel barrier layer 134 is a patterned portion of the continuous tunnel barrier layer 134L. Each free layer 136 is a patterned portion of the continuous free layer 136L.

Generally, the pattern in the two-dimensional array of discrete patterned photoresist material portions comprising the second patterned photoresist layer 159 can be transferred through the optional second and third image transfer assist layers (173L, 177L), the optional patterning film 176L, the magnetic tunnel junction material layers 130L, and at least partly through the selector rails 150R by performing an etch process, which can be an anisotropic etch process (e.g., an ion beam etch process). Thus, the layer stack including the MTJ-level material layers (112L, 114L, 130L, 144L, 148L) can be patterned into the two-dimensional array of magnetic tunnel junction pillar structures 184 by anisotropically etching the layer stack employing the two-dimensional array of discrete masking structures (173, 176, 177) as an etch mask. The MTJ-level material layers (112L, 114L, 130L, 144L, 148L) can be patterned such that each of the magnetic tunnel junction pillar structures 184 is formed with a respective tapered sidewall. The total thickness of the MTJ-level material layers (112L, 114L, 130L, 144L, 148L) and the taper angle can be selected such that each of the magnetic tunnel junction pillar structures 184 has a respective bottom surface having a lateral extent along the second horizontal direction that is greater than the width of a respective underlying vertical stack (30, 150R, 160S) along the second horizontal direction hd2. Patterned portions of the magnetic tunnel junction material layers 130L comprise a two-dimensional array of magnetic tunnel junctions 130. According to an aspect of the present disclosure, periodic notches (e.g., indentations) having the first pitch p1 can be formed at least in an upper portion of each of the selector rails 150R along the first horizontal direction hd1, as shown in FIG. 11C.

The etch process divides each optional conductive material strip 160S into a respective row of conductive material plates (e.g., seed layer plates) 160. Each conductive material plate 160 contacts a bottom surface of a respective MTJ pillar structure 184. The etch process divides the upper selector electrode 153 of each selector rail 150R into a respective plurality of discrete upper selector electrodes 153 that are laterally spaced apart from each other along the first horizontal direction hd1. In one embodiment, the lower selector electrode 151 of each selector rail 150R may remain as a single continuous rail structure that laterally extends along the first horizontal direction hd1 and underlies a respective row of magnetic tunnel junctions 130 of the two-dimensional array of magnetic tunnel junctions 130.

Each selector rail 150R is partially divided into a respective row of selector-containing notched rail structures 182 underlying respective MTJ pillar structures 184. Each selector-containing notched rail structure 182 contains notches 182N which separate at least the upper selector electrode rail in the selector-containing notched rail structure 182 into a plurality of pillar shaped upper selector electrodes 153 along the first horizontal direction hd1. Each respective pillar shaped upper selector electrode 153 underlies only one respective MTJ pillar structures 184. Likewise, each respective MTJ pillar structures 184 overlies only one respective pillar shaped upper selector electrode 153. Therefore, the respective pillar shaped upper selector electrodes 153 do not electrically short adjacent MTJ pillar structures 184 which are separated along the first horizontal direction hd1.

Each combination of an optional conductive material plate 160, an underlying patterned portion of a respective selector rail 150R, and an underlying segment of an optional respective metallic adhesion material portion 149, if present, constitutes a selector-containing notched rail structure 182. The two-dimensional array of magnetic tunnel junction pillar structures 184 is located above the array of selector-containing notched rail structures 182. Each vertical stack of a portion of the selector-containing notched rail structure 182 containing one pillar shaped upper selector electrode 153 and an overlying MTJ pillar structure 184 functions as a memory cell 180 described with reference to FIGS. 1 and 2. Each contiguous combination of memory cells 180 that are arranged along the first horizontal direction hd1 over the respective selector-containing notched rail structure 182 constitutes a selector-magnetic tunnel junction (selector-MTJ) assembly 180A. In other words, each selector-MTJ assembly 180A includes a row of memory cells 180 that include a portion of the common selector 182 and separate MTJ pillar structures 184 arranged along the first horizontal direction hd1.

Rows of selector-MTJ assemblies 180A can overlie the first electrically conductive lines 30. Each of the selector-MTJ assemblies 180A is located on a respective one of the first electrically conductive lines 30 and comprises a respective selector-containing notched rail structure 182 that extends along the first horizontal direction hd1 and a respective row of magnetic tunnel junction (MTJ) pillar structures 184 that are arranged along the first horizontal direction hd1 over the respective selector-containing notched rail structure 182.

In one embodiment, the non-Ohmic selector material portion 152 of each selector rail 150R may remain as a single continuous rail structure in the respective selector-containing notched rail structure 182 that laterally extends along the first horizontal direction hd1 and underlies a respective row of magnetic tunnel junctions 184 of the two-dimensional array of magnetic tunnel junctions 184. In one embodiment, the etch process forms periodic notches 182N (e.g., indentations) having the first pitch p1 along the first horizontal direction hd1 in an upper portion of the non-Ohmic selector material portion 152 of each selector rail 150R. Alternatively, the bottom surface of the notches 182N may be located in the same horizontal plane as the upper surface of the non-Ohmic selector material portion 152, such that there are no notches in the non-Ohmic selector material portion 152.

In one embodiment, the lower selector electrode 151 of each selector rail 150R may also remain as a single continuous rail structure in the respective selector-containing notched rail structure 182 that laterally extends along the first horizontal direction hd1 and underlies a respective row of magnetic tunnel junctions 184 of the two-dimensional array of magnetic tunnel junctions 184.

Each selector-containing notched rail structure 182 comprises a pair of lengthwise sidewalls that laterally extend along the first horizontal direction hd1. In one embodiment, two lengthwise sidewalls of the respective one of the first electrically conductive lines 30 that underlies the respective selector-containing notched rail structure 182 can be located within the same two vertical planes. Thus, the selector-containing notched rail structure 182 and the first electrically conductive lines (e.g., word lines) 30 are patterned using the same photolithography step (and optionally the same etching step. This reduces the number of lithography and/or etching steps in the process.

In one embodiment, each selector-containing notched rail structure 182 comprises a vertical stack including a lower selector electrode 151, a non-Ohmic selector material portion 152 overlying the lower selector electrode 151, and upper selector electrodes 153 overlying the non-Ohmic selector material portion 152. In one embodiment, each neighboring pair of upper selector electrodes 153 within each selector-containing notched rail structure 182 is laterally spaced apart from each other along the first horizontal direction hd1. In one embodiment, tapered sidewall surfaces of the non-Ohmic selector material portions 152 of the rows of selector-containing notched rail structures 182 can be physically exposed.

In one embodiment, the rows of MTJ pillar structures 184 overlying the respective selector-containing notched rail structures 182 can be arranged as a two-dimensional periodic array of MTJ pillar structures 184 having the first pitch p1 along the first horizontal direction hd1 and having the second pitch p2 along the second horizontal direction hd2. In one embodiment, each MTJ pillar structure 184 within the two-dimensional periodic array of MTJ pillar structures 184 has a respective tapered vertical cross-sectional profile. In one embodiment, each MTJ pillar structure 184 within the two-dimensional periodic array of MTJ pillar structures 184 has a lateral extent along the second horizontal direction hd2 that is greater than a width of a respective underlying first electrically conductive line 30 along the second horizontal direction hd2.

Upper regions of the selector-level dielectric material portions 40 that are not masked by the two-dimensional array of MTJ pillar structures 184 can be removed by the etch process. The selector-level dielectric material portions 40 laterally extend along the first horizontal direction hd1, are laterally interlaced with the rows of selector-containing notched rail structures 182 along the second horizontal direction hd2, and may contact bottom surfaces of a respective neighboring pair of rows of MTJ pillar structures 184 within the two-dimensional periodic array of MTJ pillar structures 184. In one embodiment, a recessed horizontal surface 40H may be formed within the vertically recessed areas of the selector-level dielectric material portions 40, as shown in FIG. 11B. The recessed horizontal surface can be adjoined to tapered sidewall segments 40T of a respective selector-level dielectric material portions 40.

In one embodiment, the dielectric liners 178 can laterally extend along the first horizontal direction hd1, can embed a respective one of the selector-level dielectric material portions 40, and can contact lengthwise sidewalls of a respective set of two selector-containing notched rail structures 182. Each dielectric liner 178 may contact bottom surfaces of a respective pair of rows of magnetic tunnel junction pillar structure 184 within the two-dimensional array of magnetic tunnel junction pillar structures 184.

The two-dimensional array of second etch mask plates 177 can be consumed during the etch process (which may be an anisotropic etch process, such as an ion bean etch process). The patterning film plates 176 can be subsequently removed, for example, by ashing.

Figures 12A, 12B, 12C:
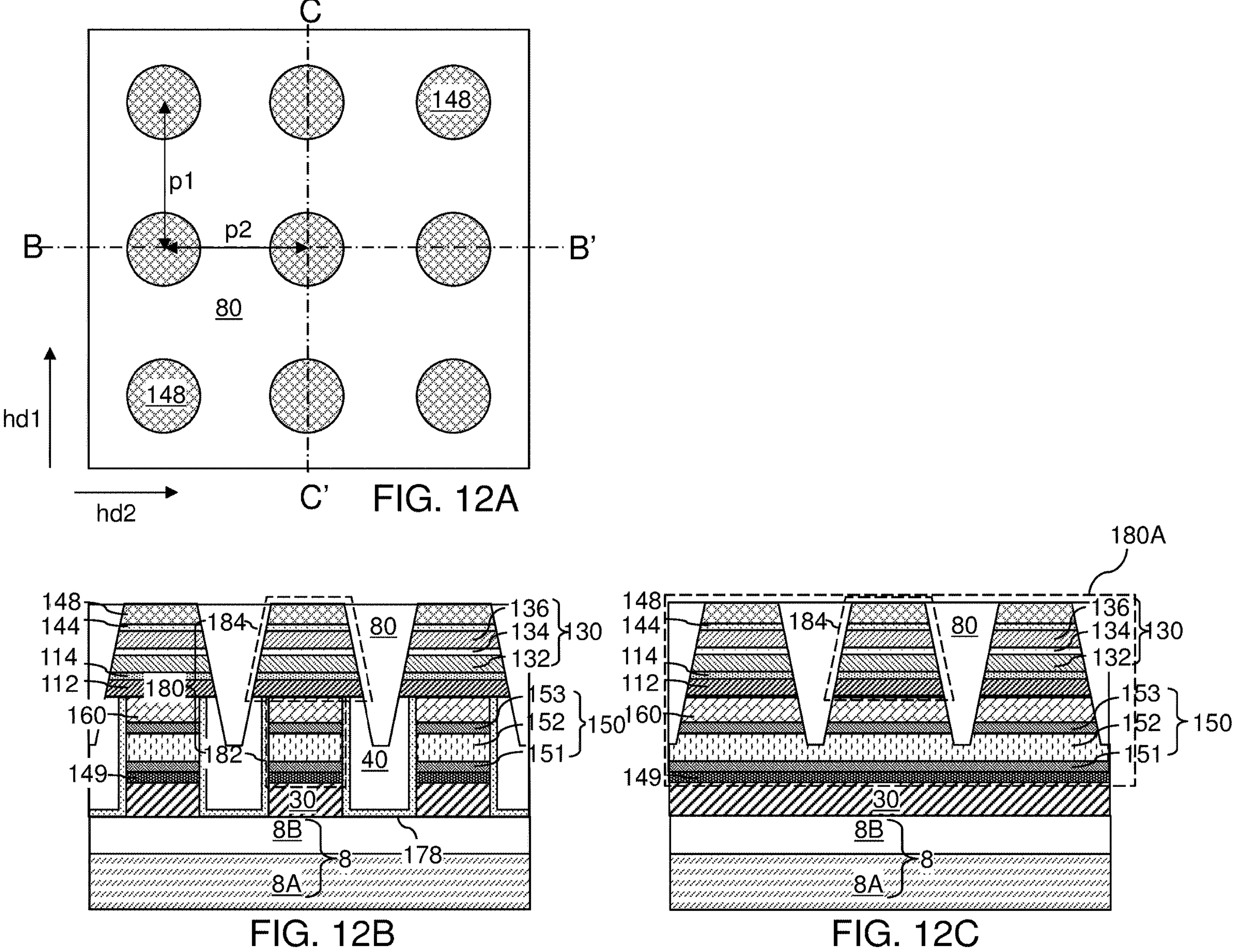
FIGS. 12A-12C are various views of the first exemplary structure after formation of a dielectric matrix layer according to an embodiment of the present disclosure.

Referring to FIGS. 12A-12C, a dielectric fill material can be deposited in the gaps between neighboring pairs of the MTJ pillar structures 184, and can be subsequently planarized to remove portions of the dielectric fill material from above the horizontal plane including the top surfaces of the MTJ pillar structures 184. The remaining portions of the dielectric fill material comprises a dielectric matrix layer 80. The dielectric matrix layer 80 laterally surrounds the two-dimensional array of magnetic tunnel junction pillar structures 184, and overlies the selector-level dielectric material portions 40. The dielectric matrix layer 80 comprises downward-protruding portions that extend downward below a horizontal plane including bottom surfaces of the two-dimensional array of magnetic tunnel junction pillar structures 184, and have tapered surfaces contacting the selector-level dielectric material portions 40.

The dielectric matrix layer 80 laterally surrounds the rows of selector-MTJ assemblies 180A. The two-dimensional periodic array of downward protrusions of the dielectric matrix layer 80 extends into boundaries between each neighboring pair of selector-containing notched rail structures 182. Generally, the two-dimensional periodic array of downward protrusions of the dielectric matrix layer 80 extends into regions of the selector-level dielectric material portions 40 that do not have an areal overlap with the two-dimensional periodic array of MTJ pillar structures 184.

In one embodiment, tapered downward protrusions of the dielectric matrix layer 80 contact each of selector-containing notched rail structures 182 along the first horizontal direction hd1. In one embodiment, each neighboring pair of upper selector electrodes 153 within each of selector-containing notched rail structures 182 is laterally spaced apart from each other by a respective portion of the tapered downward protrusions of the dielectric matrix layer 80, as shown in FIG. 12C.

In one embodiment, bottommost surface segments of the tapered downward protrusions of the dielectric matrix layer 80 contact the non-Ohmic selector material portions 152 of rows of selector-containing notched rail structures 182 and do not contact the lower selector electrodes 151.

Figures 13A, 13B, 13C:
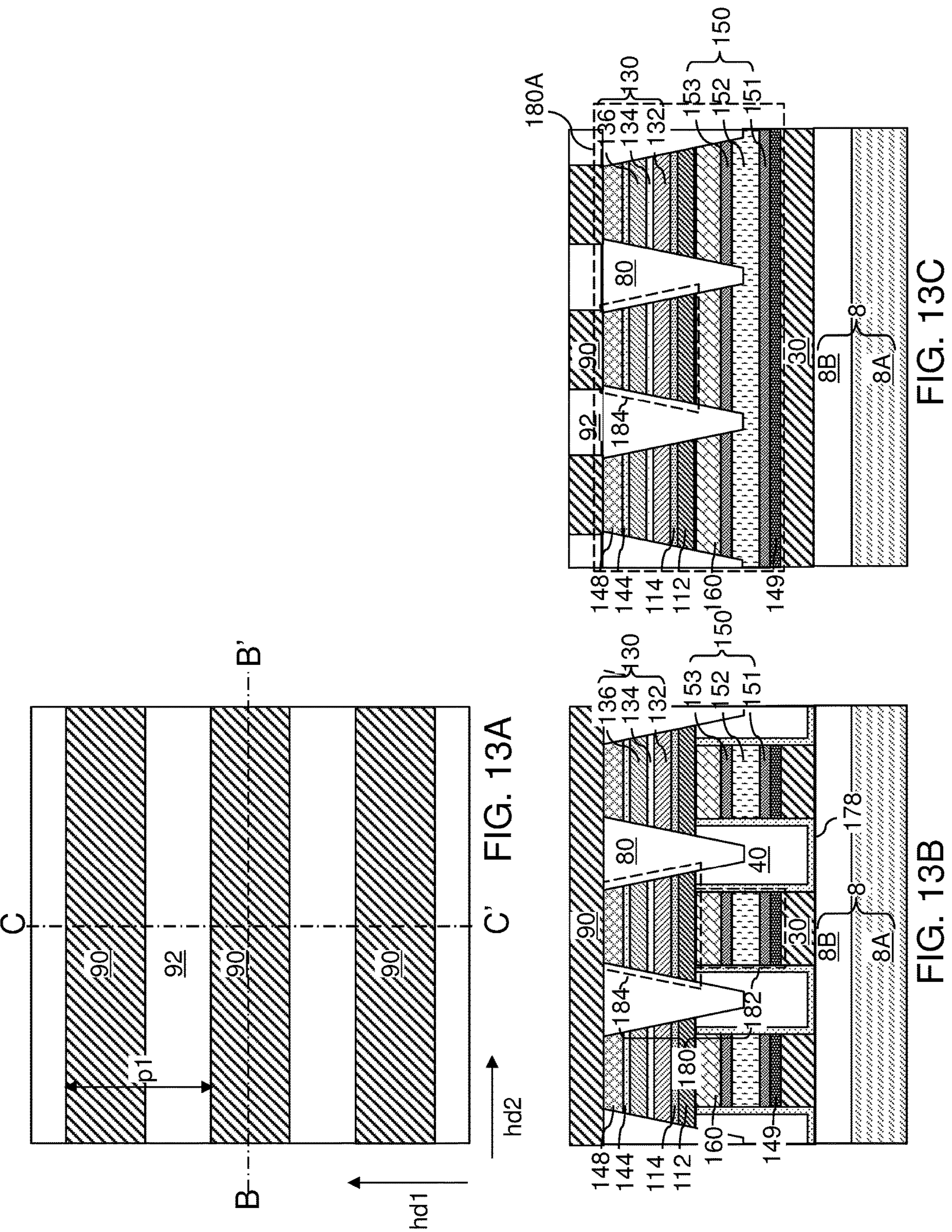
FIGS. 13A-13C are various views of the first exemplary structure after formation of second electrically conductive lines according to an embodiment of the present disclosure.

Referring to FIGS. 13A-13C, a dielectric material can be deposited over the two-dimensional array of MTJ pillar structures 184 to form a second line-level dielectric layer 92. Line trenches laterally extending along the second horizontal direction hd2 can be formed through the second line-level dielectric layer 92 above each column of MTJ pillar structures 184 arranged along the second horizontal direction hd2. A conductive material can be deposited in the line trenches, and excess portions of the conductive material can be removed from above the horizontal plane including the top surface of the second line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed. Alternatively, instead of using the above-described damascene process to form the second electrically conductive lines 90, these lines may be formed by a pattern and etch process. In the pattern and etch process, a continuous electrically conductive layer is patterned into the second electrically conductive lines 90 by photolithography and etching. The first line-level dielectric layer 92 is then deposited between the second electrically conductive lines 90 and optionally planarized with the top surfaces of the second electrically conductive lines 90.

Figures 14A, 14B, 14C:
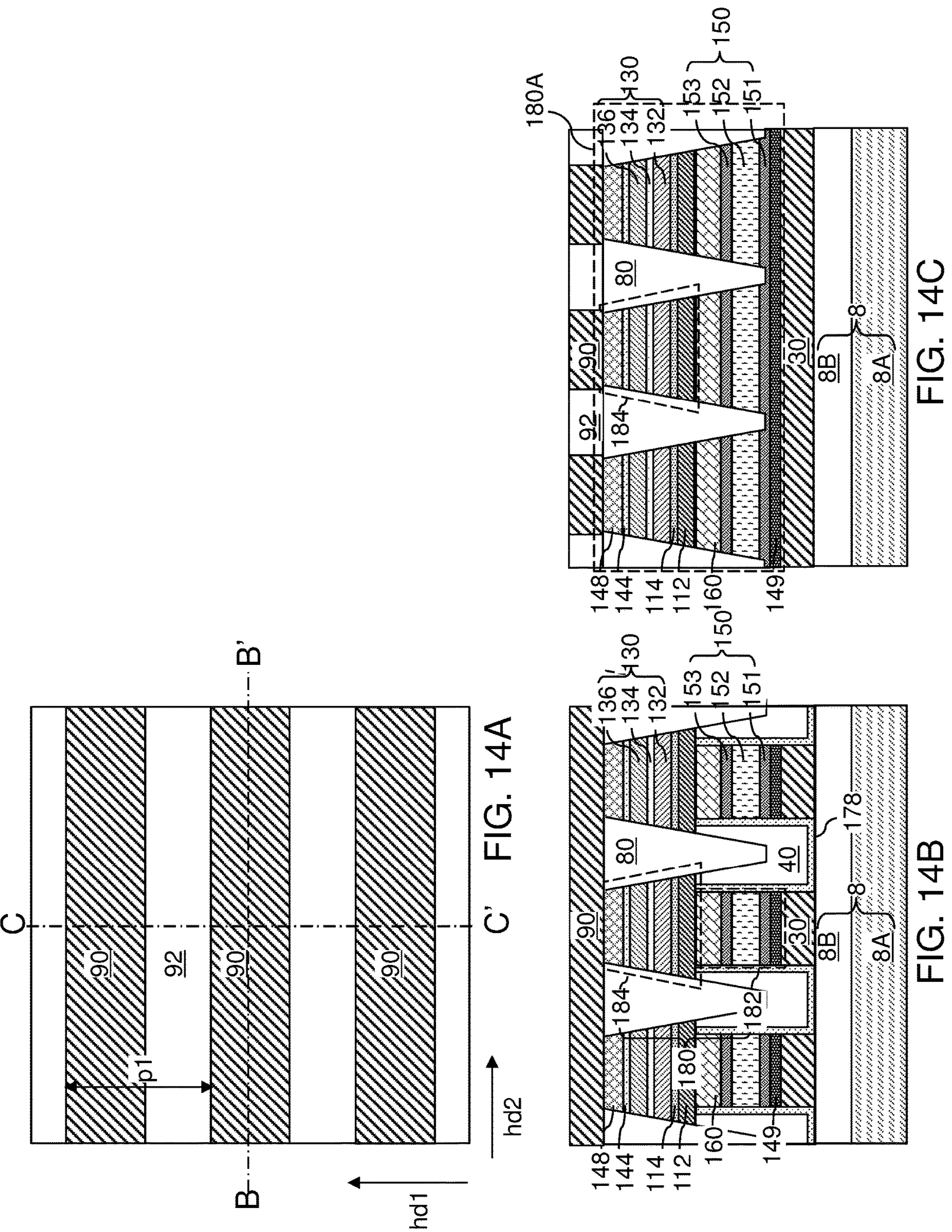
FIGS. 14A-14C are various views of a first alternative configuration of the first exemplary structure after formation of second electrically conductive lines according to an embodiment of the present disclosure.

Referring to FIGS. 14A-14C, an alternative configuration of the first exemplary structure can be derived from the first exemplary structure by extending the anisotropic etch process that divides each upper selector electrode 153 to divide each non-Ohmic selector material portion 152 (as provided at the processing steps of FIGS. 6A-6C) into a respective plurality of pillar shaped non-Ohmic selector material portions 152 that are separated from each other and arranged along the first horizontal direction hd1. In this case, the anisotropic etch process may form the periodic notches 182N (e.g., indentations) having the first pitch p1 along the first horizontal direction hd1 in an upper portion of the lower selector electrode 151 of each selector rail 150R. Upon formation of the dielectric matrix layer 80, the dielectric matrix layer 80 can contact indented surfaces of the lower selector electrodes 151.

In this alternative embodiment in which the notches 182N extend through the non-Ohmic selector material portions 152 and expose the lower selector electrodes 151, the bottommost surface segments of the tapered downward protrusions of the dielectric matrix layer 80 contact the lower selector electrodes 151 of the selector-containing notched rail structures 182 and do not contact the first electrically conductive lines 30.

Referring to FIGS. 1-14C and according to various embodiments of the present disclosure, a memory array comprises: first electrically conductive lines 30 laterally extending along a first horizontal direction hd1 and laterally spaced apart along a second horizontal direction hd2; selector-magnetic tunnel junction (selector-MTJ) assemblies 180A overlying the first electrically conductive lines 30, wherein each of the selector-MTJ assemblies 180A is located over a respective one of the first electrically conductive lines 30 and comprises a respective selector-containing notched rail structure 182 that extends along the first horizontal direction hd1 and a respective row of magnetic tunnel junction (MTJ) pillar structures 184 that are arranged along the first horizontal direction hd1 that overlie the respective selector-containing notched rail structure; a dielectric matrix layer 80 laterally surrounding the rows of selector-MTJ assemblies 180A, wherein a two-dimensional periodic array of downward protrusions of the dielectric matrix layer 80 extends into boundaries between each neighboring pair of the selector-containing notched rail structures 182; and second electrically conductive lines 90 laterally extending along the second horizontal direction hd2 and overlying a respective column of the MTJ pillar structures 184 that are arranged along the second horizontal direction hd2.

In one embodiment, each selector-containing notched rail structure 182 comprises a pair of lengthwise sidewalls that laterally extend along the first horizontal direction hd1. In one embodiment, the lengthwise sidewalls of all selector-containing notched rail structures 182 are located within two vertical planes that are perpendicular to the second horizontal direction hd2. In one embodiment, two lengthwise sidewalls of the respective one of the first electrically conductive lines 30 are located within the two vertical planes.

In one embodiment, the downward protrusions of the dielectric matrix layer 80 extend into notches 182N in the selector-containing notched rail structures 182. In one embodiment, each selector-containing notched rail structure 182 comprises a vertical stack including a lower selector electrode 151, a non-Ohmic selector material portion 152 overlying the lower selector electrode 151, and an upper selector electrode 153 overlying the non-Ohmic selector material portion 152. A neighboring pair of the upper selector electrodes 153 within each of the selector-containing notched rail structures 182 are laterally spaced apart from each other by a respective portion of the downward protrusions of the dielectric matrix layer 80. In one embodiment, the downward protrusions comprise tapered downward protrusions.

In one embodiment, bottommost surface segments of the tapered downward protrusions of the dielectric matrix layer 80 contact the non-Ohmic selector material portions 152 of the selector-containing notched rail structures 182 and do not contact the lower selector electrodes 151.

In one embodiment, bottommost surface segments of the tapered downward protrusions of the dielectric matrix layer 80 contact the lower selector electrodes 151 of the selector-containing notched rail structures 182 and do not contact the first electrically conductive lines 30.

In one embodiment, the MTJ pillar structures 184 are arranged as a two-dimensional periodic array of MTJ pillar structures 184 having a first pitch p1 along the first horizontal direction hd1 and having a second pitch along the second horizontal direction hd2; and each MTJ pillar structure 184 within the two-dimensional periodic array of MTJ pillar structures 184 has a respective tapered vertical cross-sectional profile.

In one embodiment, each MTJ pillar structure 184 within the two-dimensional periodic array of MTJ pillar structures 184 has a lateral extent along the second horizontal direction hd2 that is greater than a width of a respective underlying first electrically conductive line 30 along the second horizontal direction hd2.

In one embodiment, the memory array may comprise selector-level dielectric material portions 40 laterally extending along the first horizontal direction hd1, laterally interlaced with the selector-containing notched rail structures 182 along the second horizontal direction hd2, and contacting bottom surfaces of a respective neighboring pair of rows of MTJ pillar structures 184 within the two-dimensional periodic array of MTJ pillar structures 184.

In one embodiment, the downward protrusions of the dielectric matrix layer 80 extend into regions of the selector-level dielectric material portions 40 that do not have an areal overlap with the two-dimensional periodic array of MTJ pillar structures 184.

In one embodiment, the memory array comprises dielectric spacers 178 laterally extending along the first horizontal direction hd1, embedding a respective one of the selector-level dielectric material portions 40, and contacting lengthwise sidewalls of a respective set of two of the selector-containing notched rail structures 182.

Figure 3C:
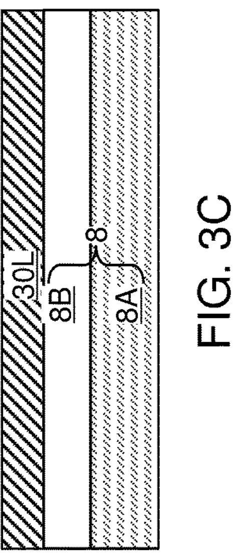
Figure 15C:
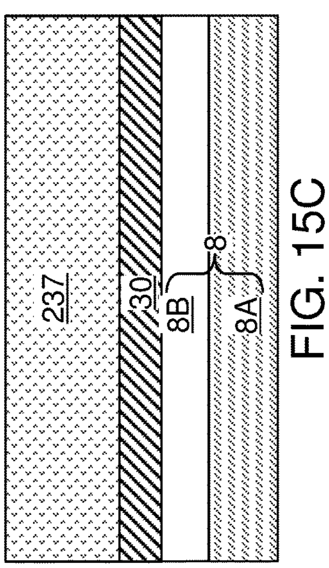
FIGS. 15A-15C are various views of a second exemplary structure after formation of first electrically conductive lines according to an embodiment of the present disclosure.
Figure 15A:
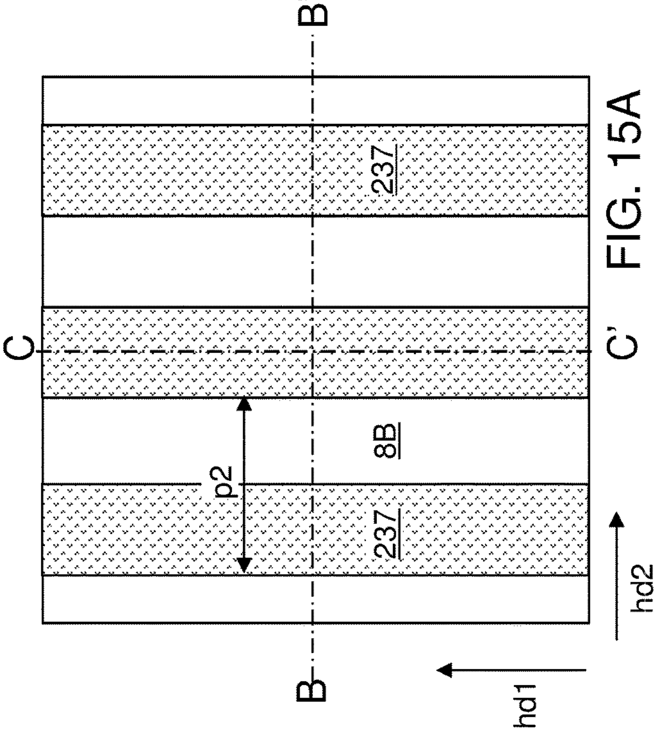
Figure 15B:
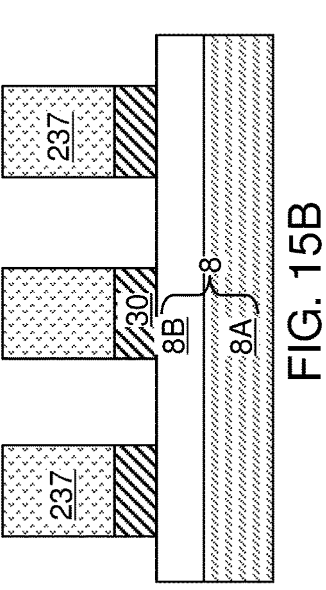

Referring to FIGS. 15A-15C, a second exemplary structure according to a second embodiment of the present disclosure can be derived from the first exemplary structure illustrated in FIGS. 3A-3C by forming a patterned photoresist layer 237 over the first electrode material layer 30L. The patterned photoresist layer 237 may have a periodic line-and-space pattern in which each line laterally extends along a first horizontal direction hd1. The pitch of the periodic line-and-space pattern along a second horizontal direction hd2 that is perpendicular to the first horizontal direction hd1 is herein referred to as a second pitch p2. The second pitch p2 may be in a range from 10 nm to 300 nm, such as from 30 nm to 100 nm, although lesser and greater dimensions may also be employed for the second pitch p2.

An anisotropic etch can be performed to transfer the pattern in the patterned photoresist layer 237 through the first electrode material layer 30L. Patterned portions of the first electrically conductive layer 30L comprise first electrically conductive lines 30. The first electrically conductive lines 30 can laterally extend along the first horizontal direction hd1, and can have a uniform width along the second horizontal direction hd2. The first electrically conductive lines 30 may comprise word lines formed as a periodic one-dimensional array of first electrically conductive lines 30 having a periodicity of the second pitch p2 along the second horizontal direction hd2. The patterned photoresist layer 237 can be subsequently removed, for example, by ashing.

Figures 16A, 16B, 16C:
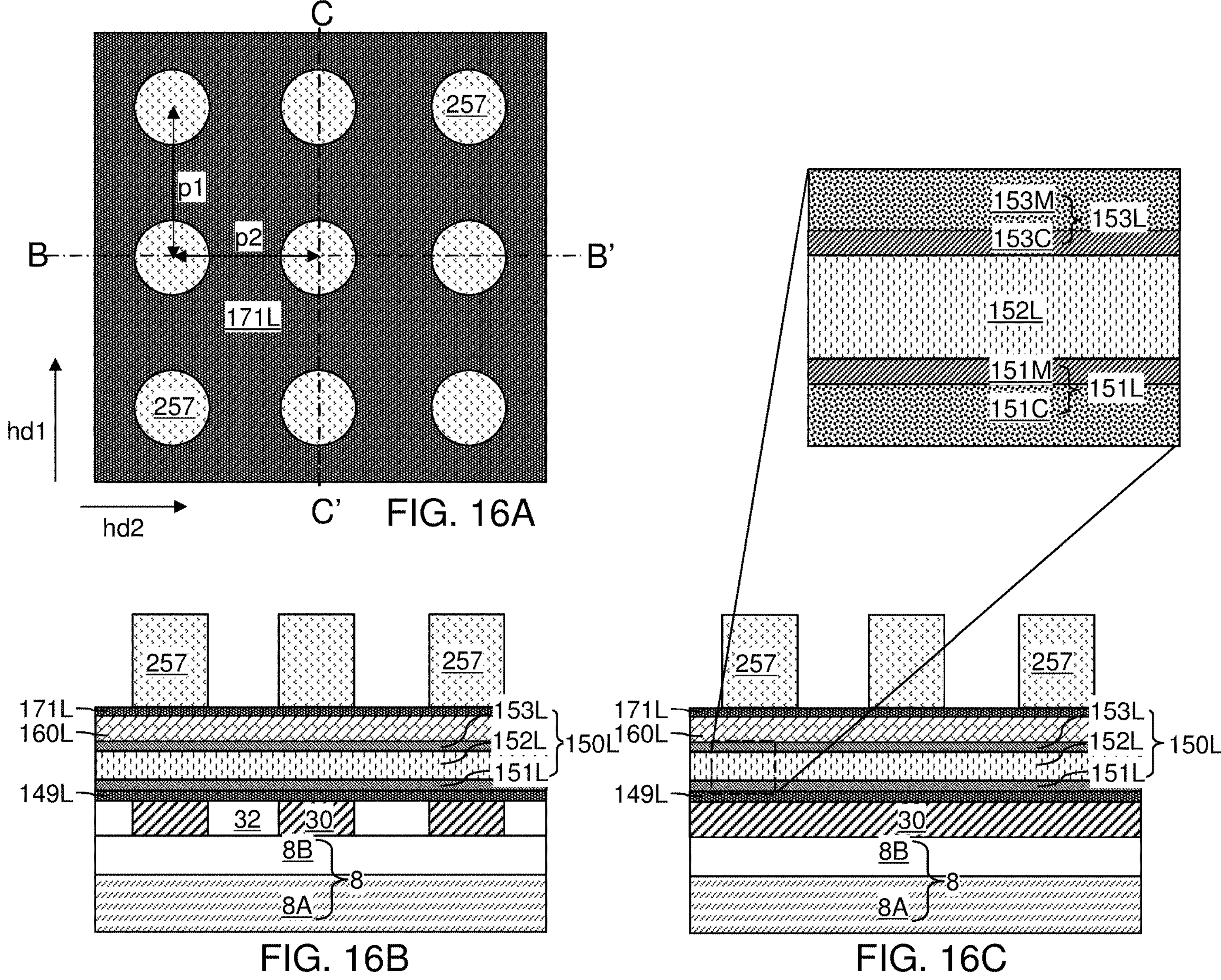
FIGS. 16A-16C are various views of the second exemplary structure after formation of selector-level material layers, a first pattern transfer assist layer, and a first patterned photoresist layer according to an embodiment of the present disclosure.

Referring to FIGS. 16A-16C, a dielectric fill material, such as silicon oxide or organosilicate glass, can be deposited in the trenches between neighboring pairs of first electrically conductive lines 30. Excess portions of the dielectric fill material can be removed from above the horizontal plane including the top surfaces of the first electrically conductive lines 30 by performing a planarization process such as a recess etch process or a chemical mechanical polishing (CMP) process. Each remaining portion of the dielectric fill material comprise dielectric material rails, which are herein referred to as first inter-electrode dielectric material rails 32.

Subsequently, an optional metallic adhesion layer 149L, selector-level material layers (150L, 160L), and an optional first image transfer assist layer 171L can be formed over the first electrically conductive lines 30. Each of the optional metallic adhesion layer 149L, the selector-level material layers (150L, 160L), and the optional first image transfer assist layer 171L may be the same as described with reference to FIGS. 4A-4C.

A photoresist layer can be applied over the optional first image transfer assist layer 171L, and can be lithographically patterned to form a patterned photoresist layer 257 including a two-dimensional array of discrete patterned photoresist material portions. The two-dimensional array of discrete patterned photoresist material portions may comprise columns of discrete patterned photoresist material portion. Each column of discrete patterned photoresist material portions may be arranged along the first horizontal direction hd1 with a first pitch p1 over a respective one of the first electrically conductive lines 30. The columns of discrete patterned photoresist material portions may be laterally spaced apart along the second horizontal direction hd2 with a second pitch p2. In one embodiment, the two-dimensional array of discrete patterned photoresist material portions may be a rectangular periodic array of discrete patterned photoresist material portions having the first pitch p1 along the first horizontal direction hd1 and having the second pitch p2 along the second horizontal direction hd2. Generally, selector material layers 150L can be formed over the first electrically conductive lines 30, and a patterned etch mask layer including a two-dimensional array of discrete patterned etch mask material portions can be formed over the selector material layers 150L.

Figures 17A, 17B, 17C:
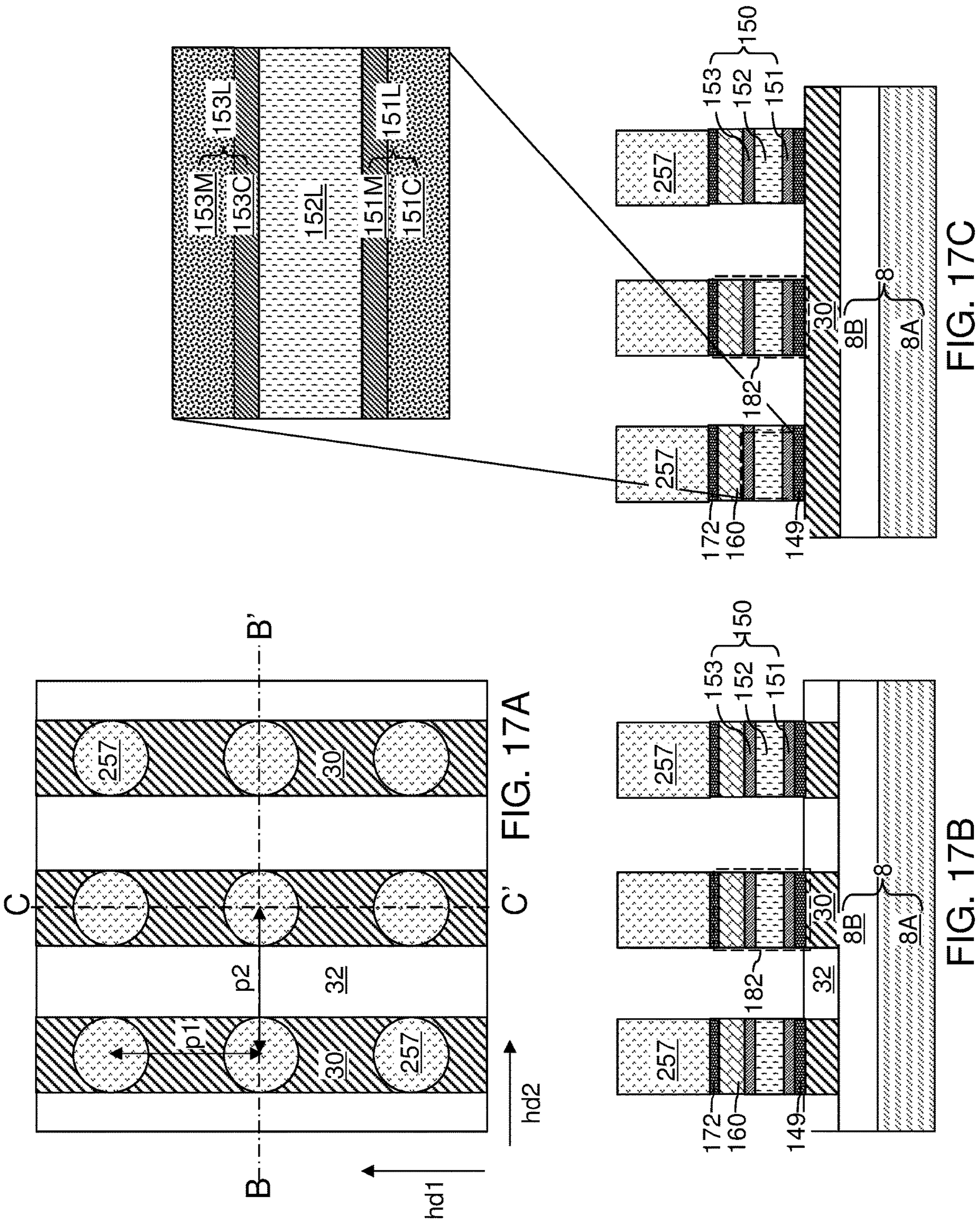
FIGS. 17A-17C are various views of the second exemplary structure after formation of a two-dimensional array of selector elements according to an embodiment of the present disclosure.

Referring to FIGS. 17A-17C, an anisotropic etch process can be performed to transfer the pattern in the patterned photoresist layer 257 through the optional first image transfer assist layer 171L, the selector-level material layers (150L, 160L), and the optional metallic adhesion layer 149L. A two-dimensional array of pillar structures (149, 150, 160, 172) can be formed over the first electrically conductive lines 30. Each pillar structure (149, 150, 160, 172) can be a discrete patterned portion of the layer stack including the optional metallic adhesion layer 149L, the selector-level material layers (150L, 160L), and the optional first image transfer assist layer 171L. Specifically, each pillar structure (149, 150, 160, 172) may include, from bottom to top, a metallic adhesion material portion 149, a selector element 150, a conductive material plate 160, and an image transfer assist material plate 172. Each metallic adhesion material portion can be a patterned portion of the metallic adhesion layer 149L. Each selector element comprises a vertical stack of a lower selector electrode 151, a non-Ohmic selector material portion 152, and an upper selector electrode 153. Each image transfer assist material plate 172 can be a patterned portion of the image transfer assist layer 171L. The patterned photoresist layer 257 can be subsequently removed, for example, by ashing.

Generally, unmasked portions of the selector material layers 150L can be anisotropically etched by performing a reactive ion etch process employing at least one etchant gas that etches materials of the selector material layers 150L. In one embodiment, each sidewall of the conductive material plates 160 can be vertically coincident with a sidewall of a respective one of the selector elements 150. In one embodiment, each of the selector elements 150 comprises a respective cylindrical sidewall.

Figures 18A, 18B, 18C:
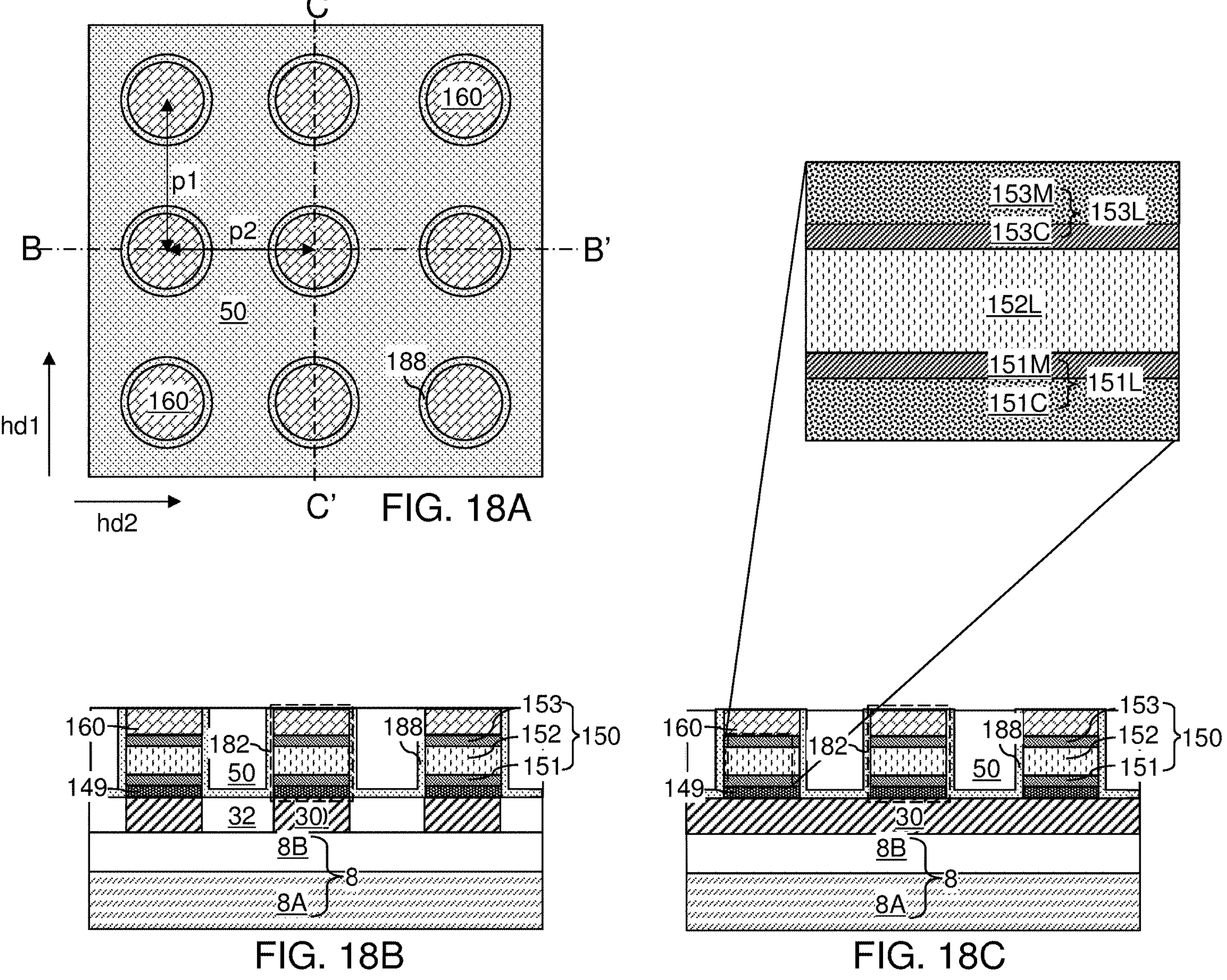
FIGS. 18A-18C are various views of the second exemplary structure after formation of a dielectric spacer material layer and a selector-level dielectric matrix layer according to an embodiment of the present disclosure.

Referring to FIGS. 18A-18C, an optional dielectric spacer material layer 188L can be conformally deposited over the two-dimensional array of pillar structures (149, 150, 160, 172) and over the first electrically conductive lines 30. The dielectric spacer material layer 188L may comprise the same material as, and may have the same thickness range as, the dielectric spacer material layer 178L described with reference to the first exemplary structure.

Subsequently, a dielectric fill material can be deposited in the gaps between neighboring pairs of the pillar structures (149, 150, 160, 172) to fill the volumes of the gaps. The dielectric fill material may comprise silicon oxide, organosilicate glass, silicon nitride, or a dielectric metal oxide. For example, the dielectric fill material may comprise undoped silicate glass (i.e., silicon oxide) or a doped silicate glass. A planarization process, such as a chemical mechanical polishing process can be performed to remove portions of the dielectric fill material that are deposited above the horizontal plane including the top surfaces of the conductive material plates 160. Top portions of the dielectric spacer material layer 188L and the image transfer assist material plates 172 can be collaterally removed by the planarization process. Each pillar structure (149, 150, 160) comprises, from bottom to top, a metallic adhesion material portion 149, a selector element 150, and a conductive material plate 160. Remaining portions of the dielectric fill material that fills the gaps between neighboring pairs of the pillar structures (149, 150, 160) is a dielectric matrix layer, which is herein referred to as a selector-level dielectric matrix layer 50. The selector-level dielectric matrix layer 50 is a unitary structure, i.e., a single continuous structure of which all portions are interconnected among one another without any interface thereamongst. The remaining portion of the dielectric spacer material layer 188L is herein referred to as a dielectric spacer liner 188. The dielectric spacer liner 188 laterally surrounds and contacts each selector element 150 within the two-dimensional array of selector elements 150. The dielectric matrix layer 50 overlies a horizontally-extending portion of the dielectric spacer liner 188. In one embodiment, the top surfaces of the dielectric spacer liner 188 and the top surface of the dielectric matrix layer 50 are located within a same horizontal plane, which may be the horizontal plane including the top surfaces of the conductive material plates 160.

Figures 19A, 19B, 19C:
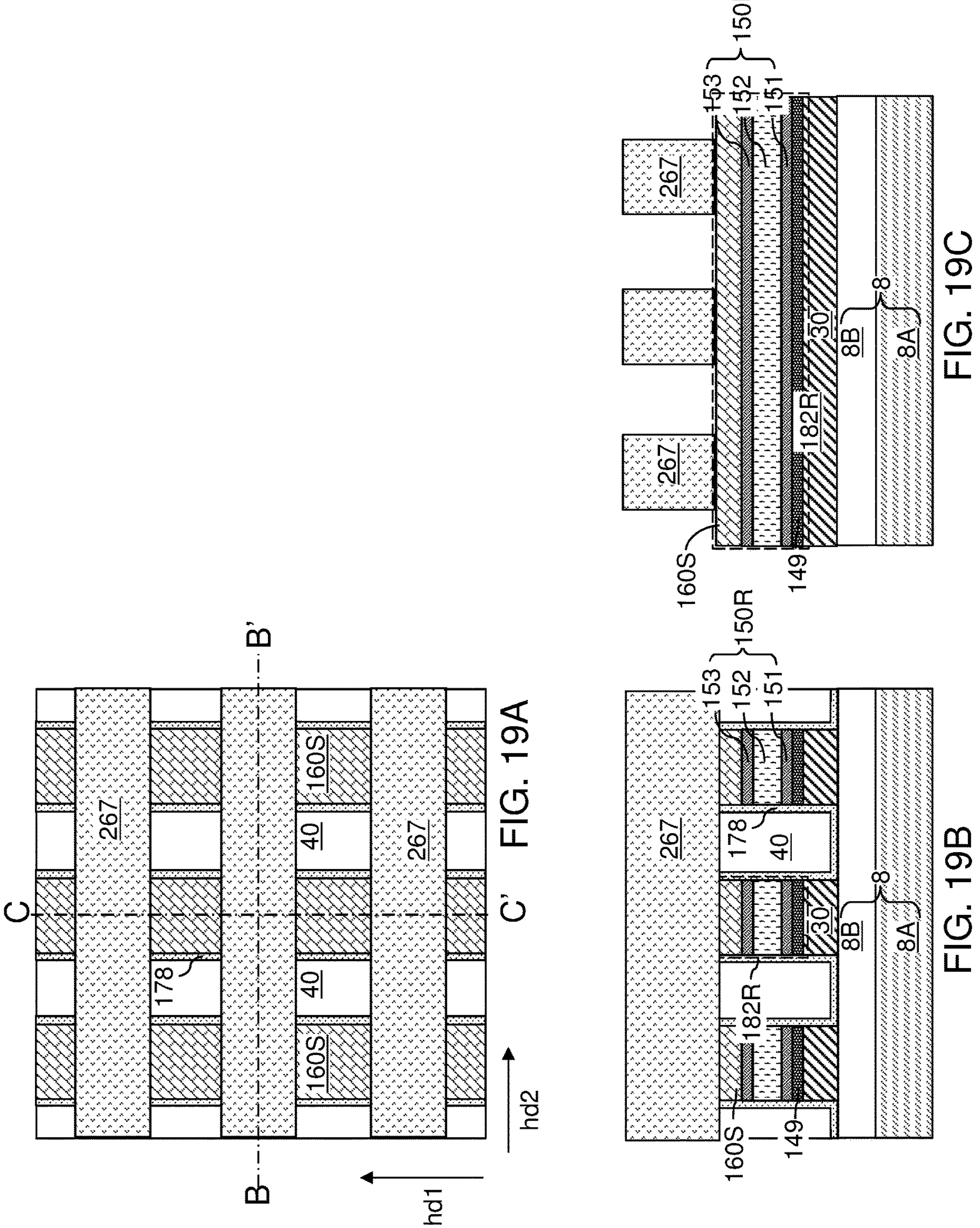
FIGS. 19A-19C are various views of an alternative configuration of the second exemplary structure after formation of a pattern transfer assist layer according to an alternative embodiment of the present disclosure.

Referring to FIGS. 19A-19C, an alternative configuration of the second exemplary structure according to an alternative embodiment of the present disclosure can be derived from the first exemplary structure illustrated in FIGS. 8A-8C by forming a patterned photoresist layer 267 over the first selector-level dielectric material portions 40 and the selector rails 150R. The patterned photoresist layer 267 comprises rails which extend along the second horizontal direction hd2 and which are spaced apart along the first horizontal direction hd1. Thus, the rails of the patterned photoresist layer 267 extend perpendicular to the selector rails.

Figure 20C:
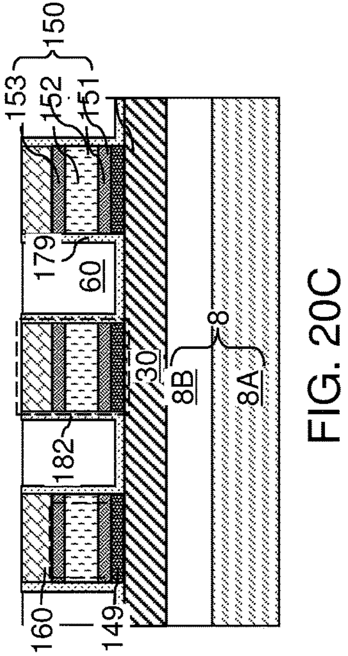
FIGS. 20A-20C are various views of the second exemplary structure after formation of a dielectric spacer material layer and a selector-level dielectric matrix layer according to an embodiment of the present disclosure.
Figure 20A:
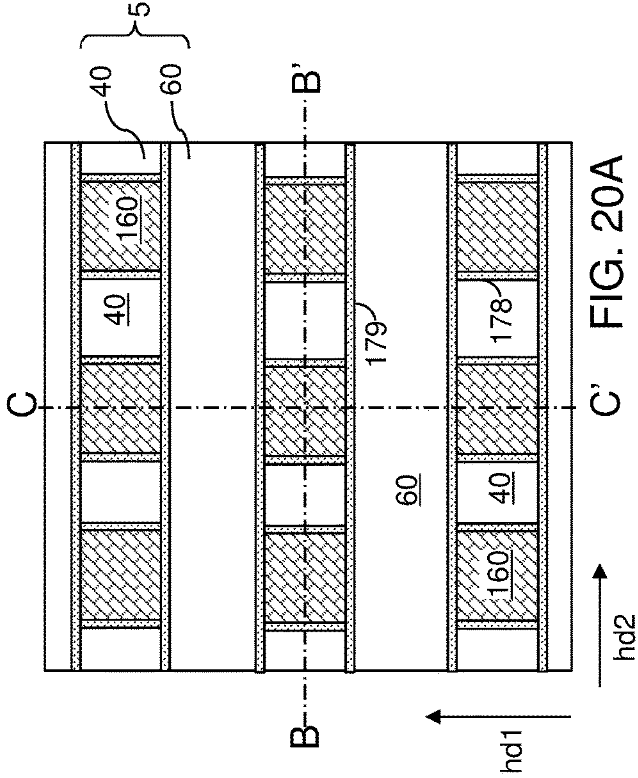
Figure 20B:
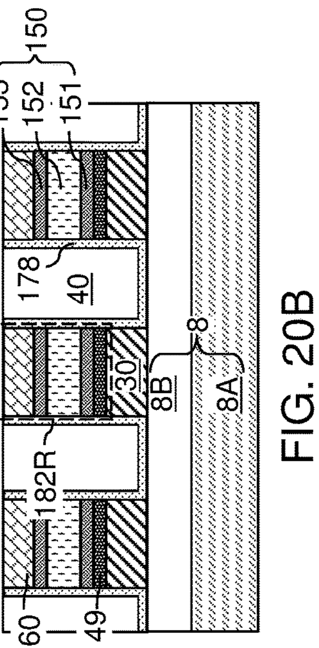

Referring to FIGS. 20A-20C, an anisotropic etch process can be performed to transfer the pattern in the patterned photoresist layer 267 through the first selector-level dielectric material portions 40 and the selector rails 150R. A two-dimensional array of pillar structures (149, 150, 160) can be formed over the first electrically conductive lines 30. In this alternative embodiment, the pillar structures (149, 150, 160) may have a rectangular (e.g., square) horizontal cross-sectional shape instead of the circular horizontal cross-sectional shape shown in FIG. 18A.

An optional dielectric spacer material layer can be conformally deposited over in the trenches between rows of alternating pillar structures (149, 150, 160), dielectric spacers 178 and first selector-level dielectric material portions 40 which extend along the second horizontal direction hd2. The trenches also extend in the second horizontal direction hd2. The dielectric spacer material layer may comprise the same material as, and may have the same thickness range as, the dielectric spacer material layer 178L described with reference to the first exemplary structure.

Subsequently, a dielectric fill material can be deposited in the gaps between neighboring pairs of the pillar structures (149, 150, 160) to fill the volumes of the trenches. The dielectric fill material may comprise silicon oxide, organosilicate glass, silicon nitride, or a dielectric metal oxide. For example, the dielectric fill material may comprise undoped silicate glass (i.e., silicon oxide) or a doped silicate glass. A planarization process, such as a chemical mechanical polishing process can be performed to remove portions of the dielectric fill material that are deposited above the horizontal plane including the top surfaces of the conductive material plates 160. Top portions of the dielectric spacer material layer can be collaterally removed by the planarization process. Each pillar structure (149, 150, 160) comprises, from bottom to top, a metallic adhesion material portion 149, a selector element 150, and a conductive material plate 160. Remaining portions of the dielectric fill material that fills the gaps between neighboring pairs of the pillar structures (149, 150, 160) comprise second selector-level dielectric material portions 60. Remaining portions of the dielectric spacer material layer comprise a dielectric spacer rail 179 formed on the sidewalls of the rows of alternating pillar structures (149, 150, 160), dielectric spacers 178 and first selector-level dielectric material portions 40. Each dielectric spacer rail 179 extends in the second horizontal direction hd2 and contacts sidewalls of plural pillar structures (149, 150, 160) that face second horizontal direction hd2.

In this alternative embodiment, each pillar structure (149, 150, 160) is separated from an adjacent pillar structure (149, 150, 160) by two dielectric spacers 178 and the first selector-level dielectric material portion 40 along the second horizontal direction hd2. In contrast, each pillar structure (149, 150, 160) is separated from an adjacent pillar structure (149, 150, 160) by two dielectric spacer rails 179 and the second selector-level dielectric material portion 60 along the second horizontal direction hd2. The combination of the first selector-level dielectric material portion 40 and the second selector-level dielectric material portion 60 comprises the select-level dielectric matrix layer 50. In this alternative embodiment, the select-level dielectric matrix layer 50 may be discontinuous because its portions are separated along the first horizontal direction by the dielectric spacer rails 179.

Figure 21A:
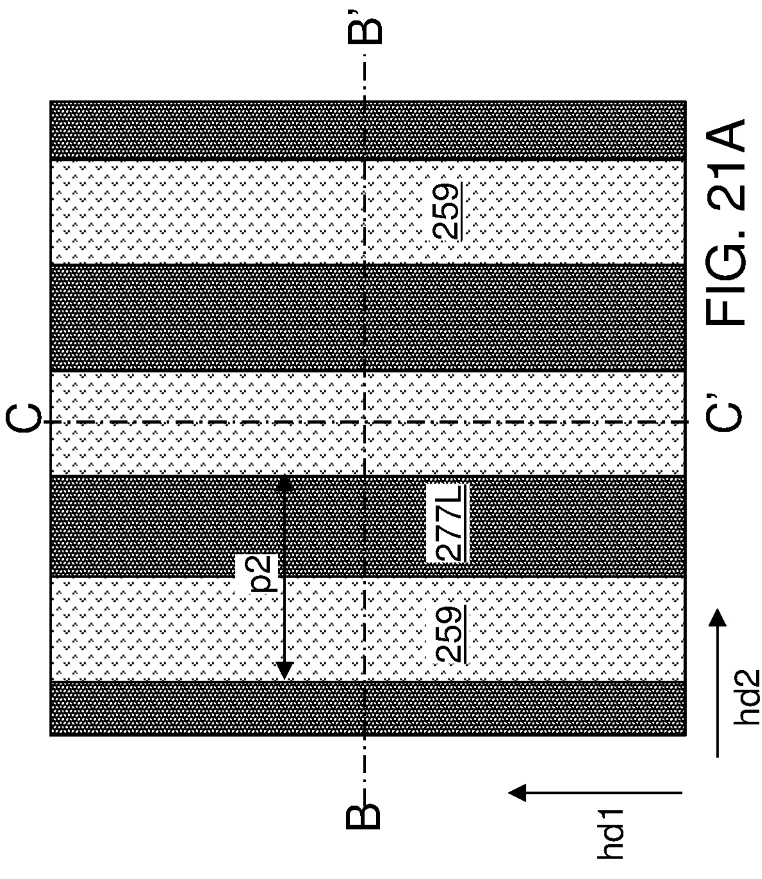
FIGS. 21A-21C are various views of the second exemplary structure after formation of magnetic tunnel junction material layers, a patterning film, a second pattern transfer assist layer, and a second patterned photoresist layer according to an embodiment of the present disclosure.
Figures 21B, 21C:
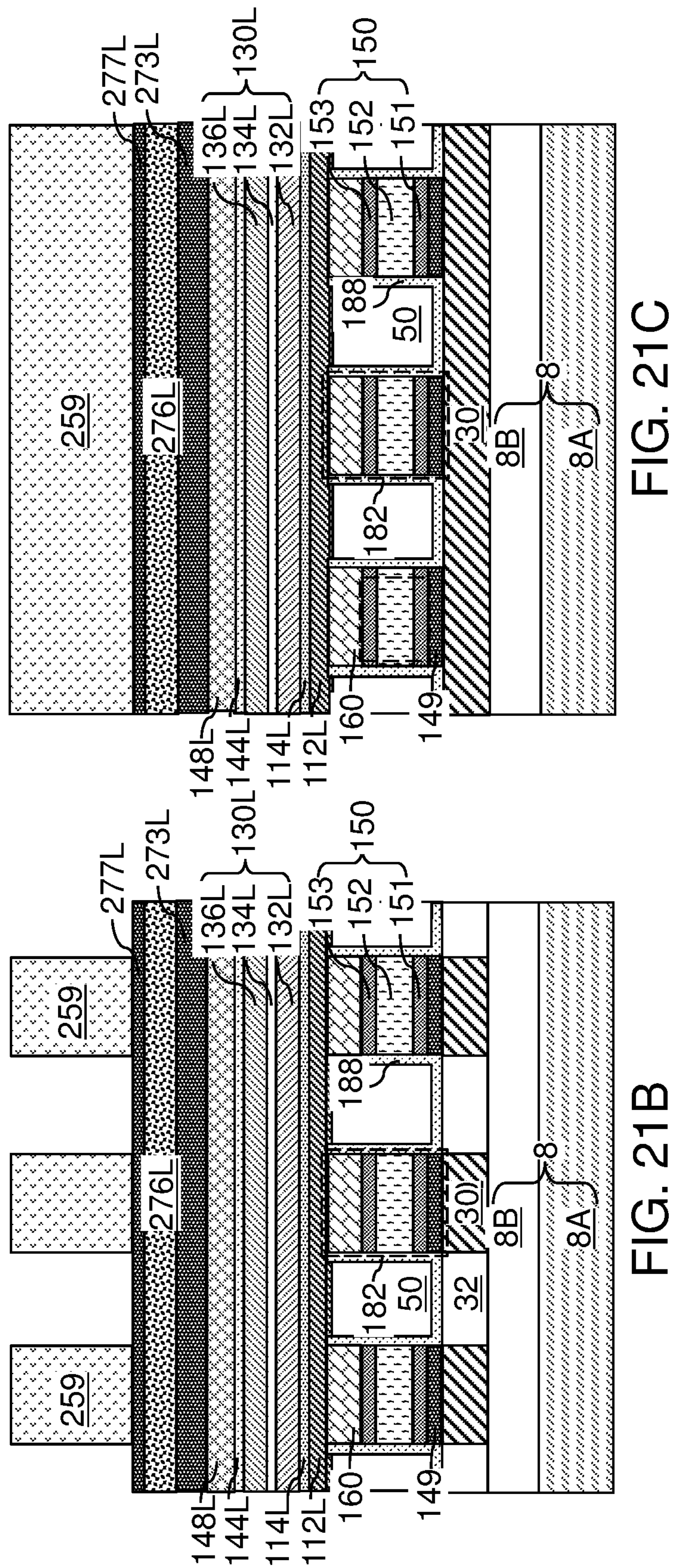

Referring to FIGS. 21A-21C, magnetic tunnel junction-level (MTJ-level) material layers (112L, 114L, 130L, 144L, 148L) can be formed over the two-dimensional array of pillar structures (149, 150, 160) of the second exemplary structure of FIGS. 18A-18C or of the alternative configuration of the second exemplary structure of FIGS. 20A-20C. While the pillar structures (149, 150, 160) of the second exemplary structure of FIGS. 18A-18C are shown in FIGS. 21B and 21C, in the alternative embodiment, the pillar structures (149, 150, 160) of the alternative configuration of the second exemplary structure of FIGS. 20A-20C may be used instead. The MTJ-level material layers (112L, 114L, 130L, 144L, 148L) may be the same as described with reference to FIGS. 9A-9C.

An optional first image transfer assist layer 273L, a patterning film 276L, and an optional second image transfer assist layer 277L can be formed over the MTJ-level material layers (112L, 114L, 130L, 144L, 148L).

The optional first image transfer assist layer 273L includes a material that can provide a high etch resistance for an anisotropic etch process to be subsequently employed with respect to the materials of the underlying layers, thereby providing a high etch selectivity for the etch process that patterns the underlying layers. For example, the optional first image transfer assist layer 273L may comprise a metal such as TiN, TaN, WN, Ti, Ta, W, Cr, Pt, or Ru. For example, the first image transfer assist layer 273L may comprise a bilayer comprising a lower TiN sublayer and an upper Ru or Pt protective sublayer. The thickness of the first image transfer assist layer 273L may be in a range from 1 nm to 30 nm, such as from 2 nm to 10 nm, although lesser and greater thicknesses may also be employed.

The patterning film 276L comprises a carbon-based material that can enhance pattern fidelity during subsequent anisotropic etch processes. For example, the patterning film 276L may be composed primarily of amorphous carbon or diamond-like carbon.

The optional second image transfer assist layer 277L, if present, includes a material that can provide a high etch resistance for an anisotropic etch process to be subsequently employed with respect to the material of the patterning film 276L. For example, the optional second image transfer assist layer 277L may comprise a metal such as Cr or Ru. The thickness of the second image transfer assist layer 277L may be in a range from 1 nm to 30 nm, such as from 2 nm to 10 nm, although lesser and greater thicknesses may also be employed.

A photoresist layer can be applied over the patterning film 276L, and the optional first and second image transfer assist layers (273L, 277L), and can be lithographically patterned to form a second patterned photoresist layer 259. The patterning may comprise self-aligned double patterning (SADP) or conventional photoresist exposure and development. In one embodiment, the second patterned photoresist layer 259 may be formed as a one-dimensional array of discrete patterned photoresist strip (e.g., rail) portions. Each discrete patterned photoresist strip portion laterally extends along the first horizontal direction hd1 and overlies a respective column of pillar structures (149, 150, 160) that are arranged along the first horizontal direction hd1. The discrete patterned photoresist strip portions can be formed as a periodic one-dimensional array having the second pitch p2 along the second horizontal direction hd2.

Figures 22A, 22B, 22C:
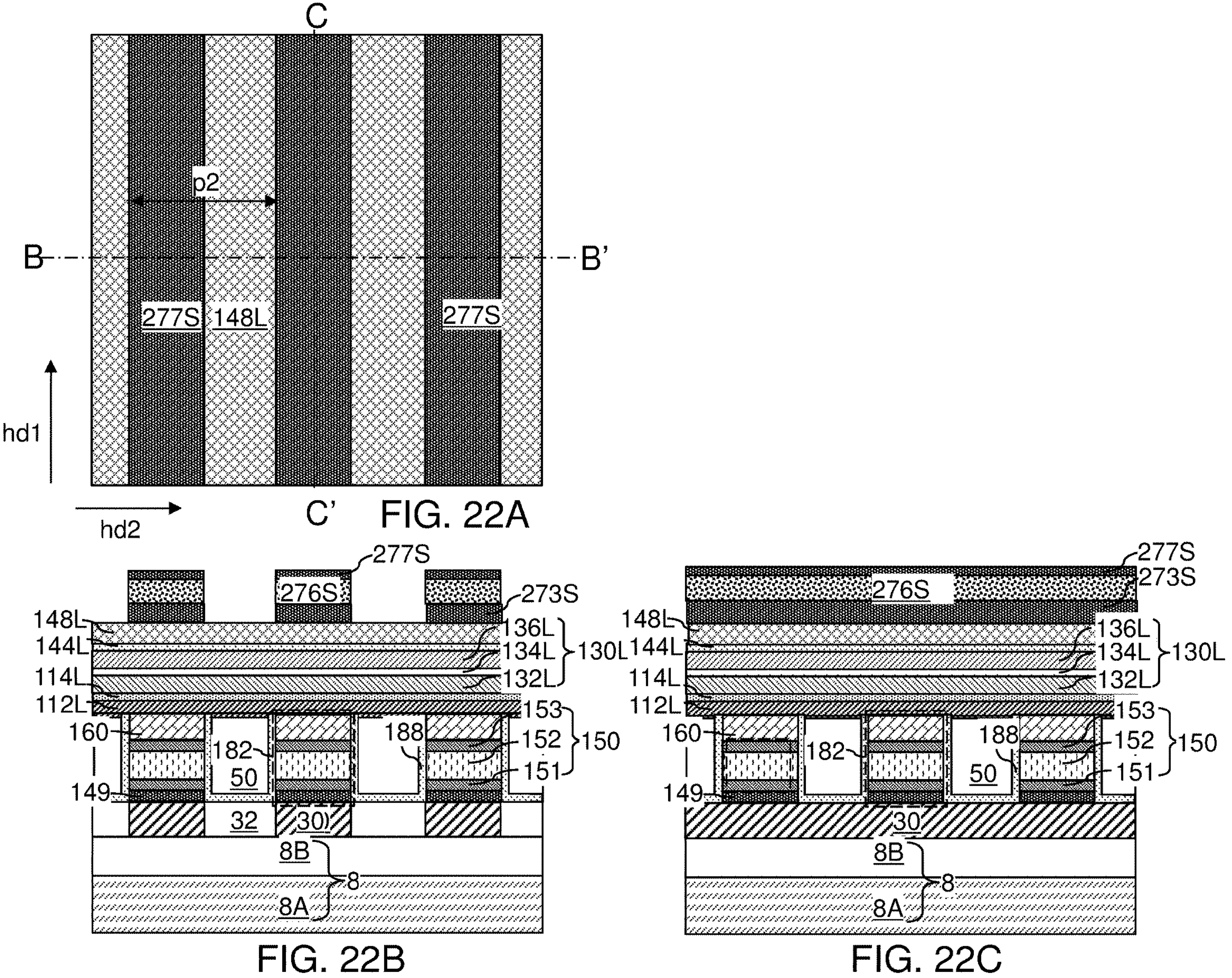
FIGS. 22A-22C are various views of the second exemplary structure after formation of a one-dimensional array of first etch mask structures according to an embodiment of the present disclosure.

Referring to FIGS. 22A-22C, the pattern in the first patterned photoresist layer 259 can be transferred through the optional second image transfer assist layer 277L, the patterning film 276L, and the optional first image transfer assist layer 273L. First line-shaped etch mask structures (273S, 276S, 277S) can be formed over the MTJ-level material layers (112L, 114L, 130L, 144L, 148L). Each first line-shaped etch mask structure (273S, 276S, 277S) may comprise a patterning film strip 276S, a first image transfer assist material strip 273S, and/or a second image transfer assist material strip 277S. Each patterning film strip 276S may be a patterned portion of the patterning film 276L. Each first image transfer assist material strip 273S can be a patterned portion of the first image transfer assist layer 273L. Each second image transfer assist material strip 277S can be a patterned portion of the second image transfer assist layer 277L. The first patterned photoresist layer 259 can be subsequently removed, for example, by ashing.

Figures 23A, 23B, 23C:
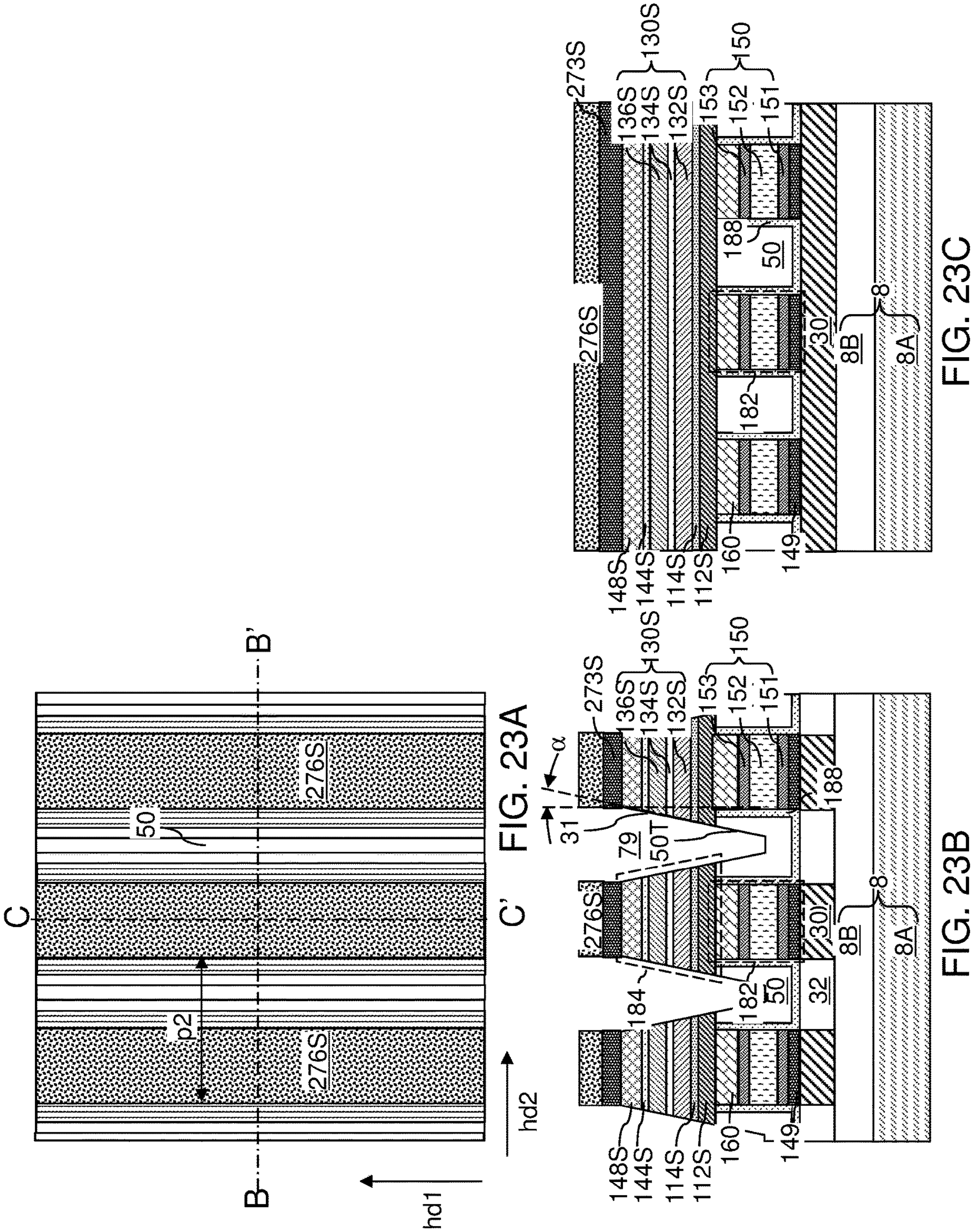
FIGS. 23A-23C are various views of the second exemplary structure after formation of a one-dimensional array of magnetic tunnel junction strips according to an embodiment of the present disclosure.

Referring to FIGS. 23A-23C, a first pattern transfer process can be performed to transfer the pattern in the first line-shaped etch mask structures (273S, 276S, 277S) through the MTJ-level material layers (112L, 114L, 130L, 144L, 148L) and partly into the selector-level dielectric matrix layer 50. In one embodiment, the first pattern transfer process may comprise a first ion beam etch (i.e., ion beam milling) process in which the first line-shaped etch mask structures (273S, 276S, 277S) are employed as an etch mask. The angles of the ion beams employed during the first ion beam etch process can be selected such that sidewalls of the patterned portions of the MTJ-level material layers (112L, 114L, 130L, 144L, 148L) are formed with a taper angle with respect to the vertical direction. The patterned portions of the MTJ-level material layers (112L, 114L, 130L, 144L, 148L) can comprise a one-dimensional array of magnetic tunnel junction strips (e.g., rails) 130S. Each magnetic tunnel junction strip 130S comprises a respective strip stack of a reference layer strip 132S, a nonmagnetic tunnel barrier layer strip 134S, and a free layer strip 136S. Each patterned portion of the continuous metallic capping layer 148L, if employed, comprises a metallic capping strip 148S. Each patterned portion of the continuous dielectric capping layer 144L, if employed, comprises a dielectric capping strip 144S. Each patterned portion of the continuous antiferromagnetic coupling layer 114L, if employed, comprises an antiferromagnetic coupling strip 114S. Each patterned portion of the continuous superlattice layer 112L, if employed, comprises a superlattice strip 112S.

In an alternative embodiment, the first ion beam etch process used to form the magnetic tunnel junction strip 130S comprises two separate ions beam etch steps. In a first step, the first ion beam etch continues until the nonmagnetic tunnel barrier layer strip 134L is reached or etched through. Then, a dielectric liner, such as a silicon nitride liner, is deposited over the metallic capping strip 148S the dielectric capping strip 144S and the free layer strip 136S. In a second step, the first ion beam etch is restarted after the formation of the dielectric liner to etch through the reference layer 132L and any other underlying conductive layers to complete the magnetic tunnel junction strip 130S.

The first ion beam etch process forms first line trenches 79 between neighboring pairs of magnetic tunnel junction strips 130S. Generally, the first line trenches 79 can be formed by performing a first ion beam etch process employing a set of first line-shaped etch mask structures (273S, 276S, 277S) that laterally extend along the first horizontal direction hd1 and are laterally spaced apart along the second horizontal direction hd2. In one embodiment, each of the first line trenches 79 may be laterally bounded a respective pair of first tapered planar sidewalls 31 of the magnetic tunnel junction strips 130S. As used herein, a planar sidewall refers to a sidewall that is contained within a flat plane, i.e., a plane without a curvature. A tapered planar sidewall refers to a planar sidewall having a non-zero angle with respect to a vertical direction. In one embodiment, the magnitude of the tilt angles of the first tapered planar sidewalls 31 may be the same. In one embodiment, the respective pair of first tapered planar sidewalls 31 laterally extend along the first horizontal direction hd1, and are tilted from a vertical direction toward or away from the second horizontal direction hd2 with first tilt angles α that are equal in magnitude and different in tilt directions. The magnitude of the first tilt angle α may be in a range from 1 degree to 30 degrees, such as from 3 degrees to 10 degrees, although lesser and greater first tilt angles α may also be employed.

In one embodiment, the first line trenches 79 may be formed such that bottom surfaces of the first line trenches 79 are formed below the horizontal plane including bottommost surfaces of the one-dimensional array of magnetic tunnel junction strips 130S. In one embodiment, the bottom surfaces of the first line trenches 79 are formed below the horizontal plane including the top surfaces of the pillar structures (149, 150, 160). In one embodiment, tapered planar sidewalls 50T of the select-level dielectric matrix layer 50 may be physically exposed to the first line trenches 79. The first line-shaped etch mask structures (273S, 276S, 277S) can be subsequently removed.

Figures 24A, 24B, 24C:
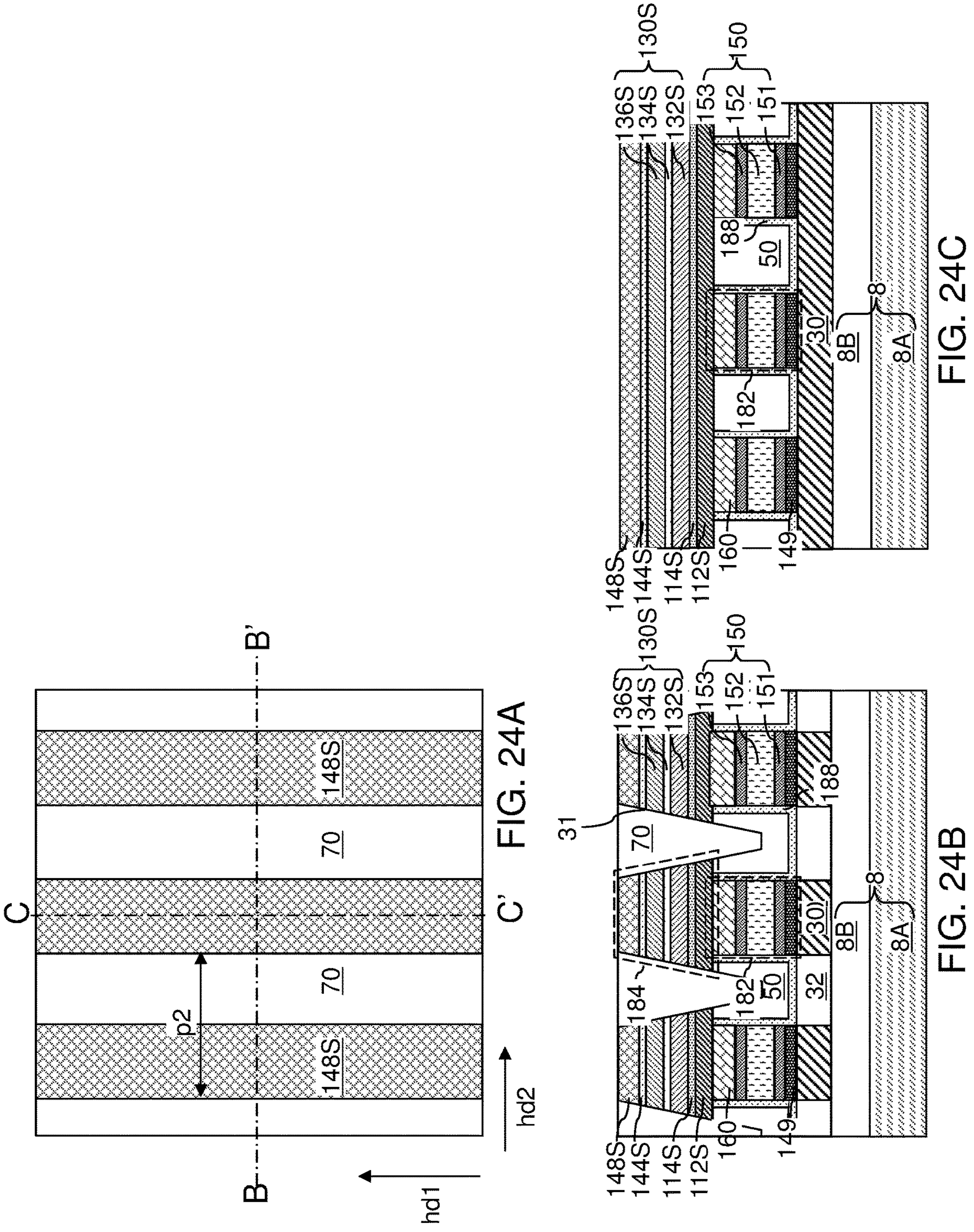
FIGS. 24A-24C are various views of the second exemplary structure after formation of first junction-level dielectric material rails according to an embodiment of the present disclosure.

Referring to FIGS. 24A-24C, a first dielectric fill material such as silicon oxide can be deposited in the first line trenches 79. Excess portions of the first dielectric fill material can be removed from above the horizontal plane including the top surfaces of the metallic capping strips 148S by a planarization process, which may employ a recess etch process or a chemical mechanical polishing (CMP) process. Each remaining portion of the first dielectric fill material filling a respective first line trench 79 constitutes a dielectric material rail, which is herein referred to as a first junction-level dielectric material rail 70 or as a first dielectric material portion 70. In one embodiment, a first junction-level dielectric material rail 70 can be formed between a neighboring pair of magnetic tunnel junction strips 130S. Generally, a first junction-level dielectric material rail 70 can be formed between and can contact a neighboring pair of first tapered planar sidewalls 31. A one-dimensional array of junction-level dielectric material rails 70 may be laterally interlaced with a one-dimensional array of strip stacks (112S, 114S, 130S, 144S, 148S) along the second horizontal direction hd2. Each strip stack includes an optional superlattice strip 112S, an optional antiferromagnetic coupling strip 114S, a magnetic tunnel junction strip 130S, an optional dielectric capping strip 144S, and an optional metallic capping strip 148S.

Figures 25A, 25B, 25C:
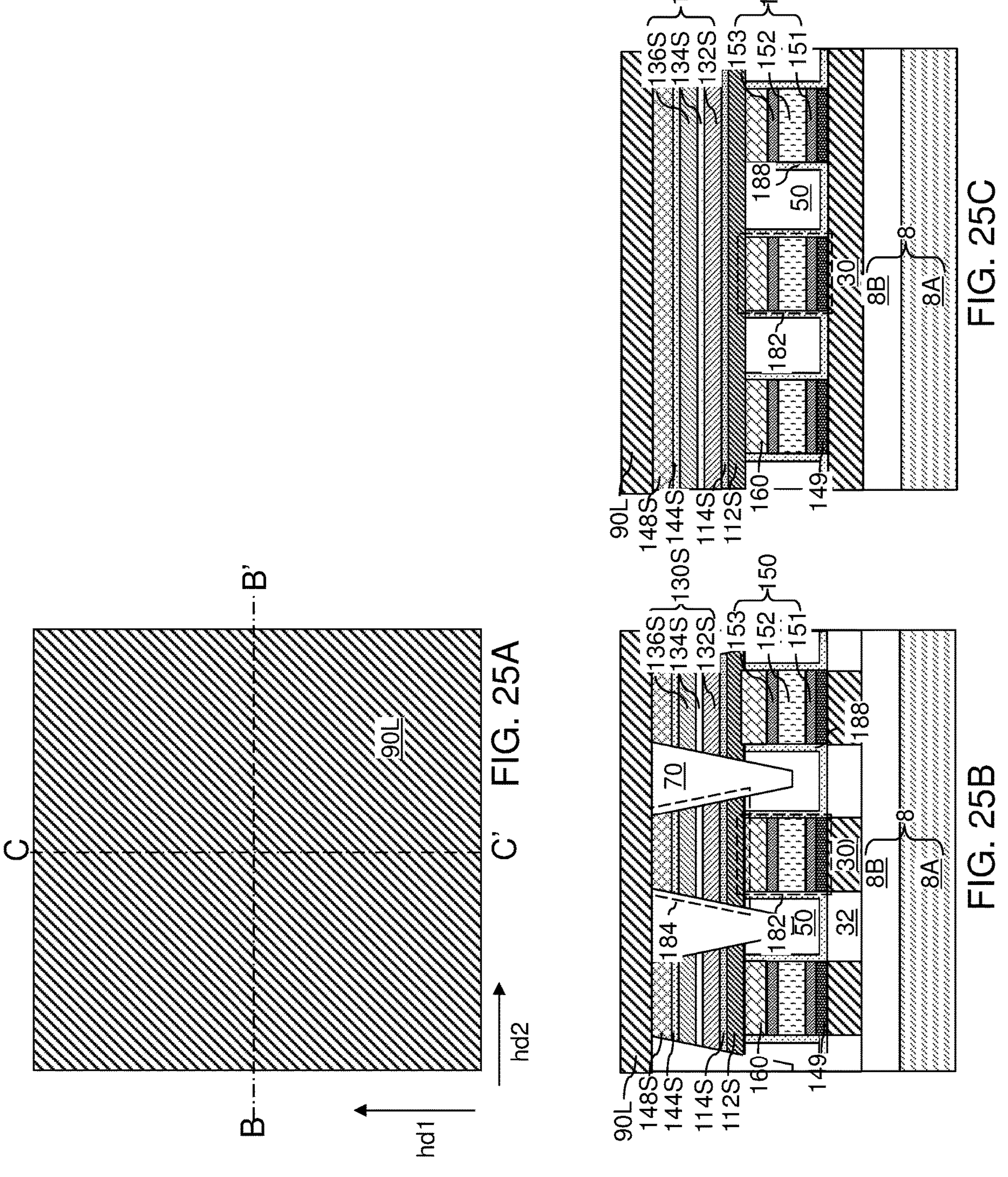
FIGS. 25A-25C are various views of the second exemplary structure after formation of a second electrode layer according to an embodiment of the present disclosure.

Referring to FIGS. 25A-25C, a second electrode material layer 90L is formed over the laterally alternating sequence of strip stacks (112S, 114S, 130S, 144S, 148S) and first junction-level dielectric material rails 70. The second electrode material layer 90L can comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrode material layer 90L can be in a range from 20 nm to 100 nm, although lesser and greater thicknesses can also be employed.

Figures 26A, 26B, 26C:
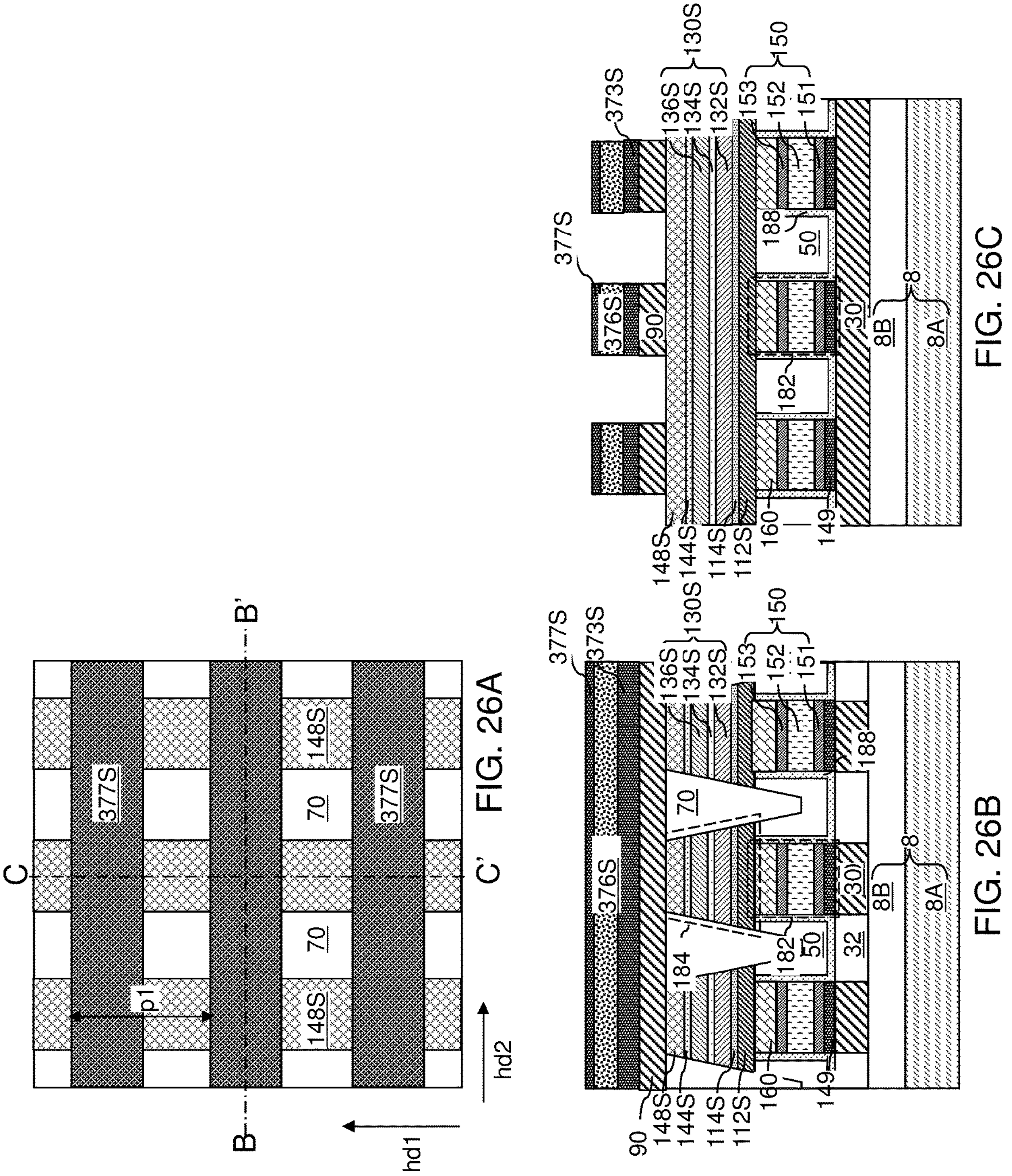
FIGS. 26A-26C are various views of the second exemplary structure after formation of a one-dimensional array of second etch mask structures and second electrically conductive lines according to an embodiment of the present disclosure.

Referring to FIGS. 26A-26C, a one-dimensional array of second line-shaped etch mask structures (373S, 376S, 377S) can be formed over the second electrode material layer 90L. The second line-shaped etch mask structures (373S, 376S, 377S) can be formed by depositing and patterning at least one patterning material layer including an optional bottom image transfer assist layer, a patterning film, and an optional top image transfer assist layer such that each patterned portion laterally extends along the second horizontal direction hd1 with a uniform width and a first pitch p1 along the first horizontal direction hd1. The patterning of the optional bottom image transfer assist layer, the patterning film, and the optional top image transfer assist layer can be effected by applying and patterning a photoresist layer over the at least one patterning material layer, and by transferring the pattern in the photoresist layer through the at least one patterning material layer. The photoresist layer can be subsequently removed, for example, by ashing.

Each second line-shaped etch mask structure (373S, 376S, 377S) may comprise a patterning film strip 376S, a bottom image transfer assist material strip 373S, and/or a top image transfer assist material strip 377S. Each patterning film strip 376S may be a patterned portion of the patterning film. Each bottom image transfer assist material strip 373S can be a patterned portion of the bottom image transfer assist layer. Each top image transfer assist material strip 377S can be a patterned portion of the top image transfer assist layer. Each second line-shaped etch mask structure (373S, 376S, 377S) has an areal overlap with a respective row of pillar structures (149, 150, 160) that are arranged along the second horizontal direction hd2.

Exposed portions of the second electrode material layer 90L may be etched by any suitable etching process, such as a reactive ion etch process, using the line-shaped etch mask structure (373S, 376S, 377S) as mask. The etching forms the second electrically conductive lines 90. Each second electrically conductive line 90 may contact top surfaces of a respective row of metallic capping layers 148 that are arranged along the second horizontal direction hd2.

Figures 27A, 27B, 27C:
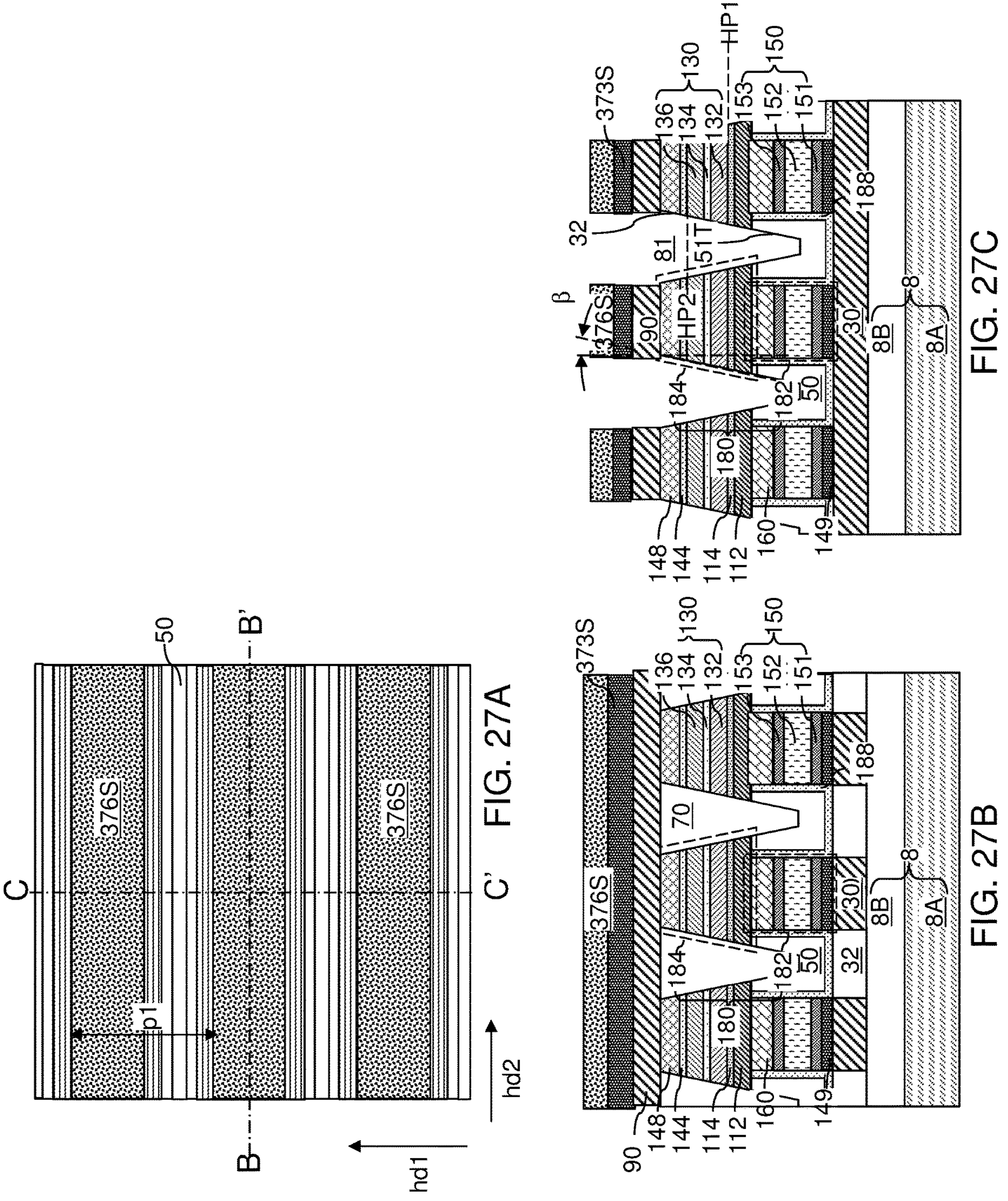
FIGS. 27A-27C are various views of the second exemplary structure after formation a two-dimensional array of magnetic tunnel junction pillar structures according to an embodiment of the present disclosure.

Referring to FIGS. 27A-27C, a second pattern transfer process can be performed to transfer the pattern in the second line-shaped etch mask structures (373S, 376S, 377S) and the second electrically conductive lines 90 through the laterally alternating sequence of strip stacks (112S, 114S, 130S, 144S, 148S) and the first junction-level dielectric material rails 70 and optionally into an upper portion of the selector-level dielectric matrix layer 50. In one embodiment, the second pattern transfer process may comprise a second ion beam etch process in which the second line-shaped etch mask structures (373S, 376S, 377S) are employed as an etch mask. The angles of the ion beams employed during the second ion beam etch process can be selected such that sidewalls of the patterned portions of the laterally alternating sequence of strip stacks (112S, 114S, 130S, 144S, 148S) and the first junction-level dielectric material rails 70 are formed with a taper angle with respect to the vertical direction. The patterned portions of the strip stacks (112S, 114S, 130S, 144S, 148S) can comprise a two-dimensional array of magnetic tunnel junctions 130. Each patterned portion of the metallic capping strips 148L, if employed, comprises a metallic capping layer 148. Each patterned portion of the dielectric capping strips 144S, if employed, comprises a dielectric capping layer 144. Each patterned portion of the antiferromagnetic coupling strips 114S, if employed, comprises an antiferromagnetic coupling layer 114. Each patterned portion of the superlattice strips 112S, if employed, comprises a superlattice layer 112.

The second ion beam etch process forms second line trenches 81 between neighboring rows of magnetic tunnel junctions 130 and the second electrically conductive lines 90 that are arranged along the second horizontal direction hd2. Generally, the second line trenches 81 can be formed by performing a second ion beam etch process employing as a mask a set of second line-shaped etch mask structures (273S, 276S, 277S) and the underlying second electrically conductive lines 90 that laterally extend along the second horizontal direction hd2 and are laterally spaced apart along the first horizontal direction hd1. In one embodiment, each of the second line trenches 81 may be laterally bounded a respective pair of second tapered planar sidewalls 32 of the magnetic tunnel junctions 130. In one embodiment, the magnitude of the tilt angles of the second tapered planar sidewalls 32 may be the same. In one embodiment, the second tapered planar sidewalls 32 laterally extend along the second horizontal direction hd2, and are tilted from a vertical direction toward or away from the first horizontal direction hd1 with second tilt angles R that are equal in magnitude and different in tilt directions. The magnitude of the second tilt angle $\alpha$ may be in a range from 1 degree to 30 degrees, such as from 3 degrees to 10 degrees, although lesser and greater second tilt angles $\alpha$ may also be employed.

In one embodiment, the second line trenches 81 may be formed such that bottom surfaces of the second line trenches 81 are formed below the horizontal plane including bottommost surfaces of the two-dimensional array of magnetic tunnel junctions 130. In one embodiment, the bottom surfaces of the second line trenches 81 are formed below the horizontal plane including the top surfaces of the pillar structures (149, 150, 160). In one embodiment, tapered planar sidewalls 51T of the select-level dielectric matrix layer 50 may be physically exposed to the second line trenches 81.

In one embodiment, each of the second line trenches 81 may be laterally bounded by multiple pairs of second tapered planar sidewalls 32 of the magnetic tunnel junctions 130 and vertical sidewalls of the second electrically conductive lines 90. Each pair of the second tapered planar sidewalls 32 within the multiple pairs can laterally extend along the second horizontal direction hd2, and can be tilted from the vertical direction toward or away from the first horizontal direction hd1 with second tilt angles R that are equal in magnitude and different in tilt directions. In one embodiment, each magnetic tunnel junction within the two-dimensional array of magnetic tunnel junctions 130 comprises a respective reference layer 132, a respective nonmagnetic tunnel barrier layer 134, and a respective free layer 136.

Generally, each first dielectric material portion 70 may or may not be divided into a respective column of first dielectric material portions 70 that are arranged along the first horizontal direction. Any remaining portions of the second line-shaped etch mask structures (373S, 376S, 377S) can be subsequently removed to expose the second electrically conductive lines 90.

Figures 28A, 28B, 28C:
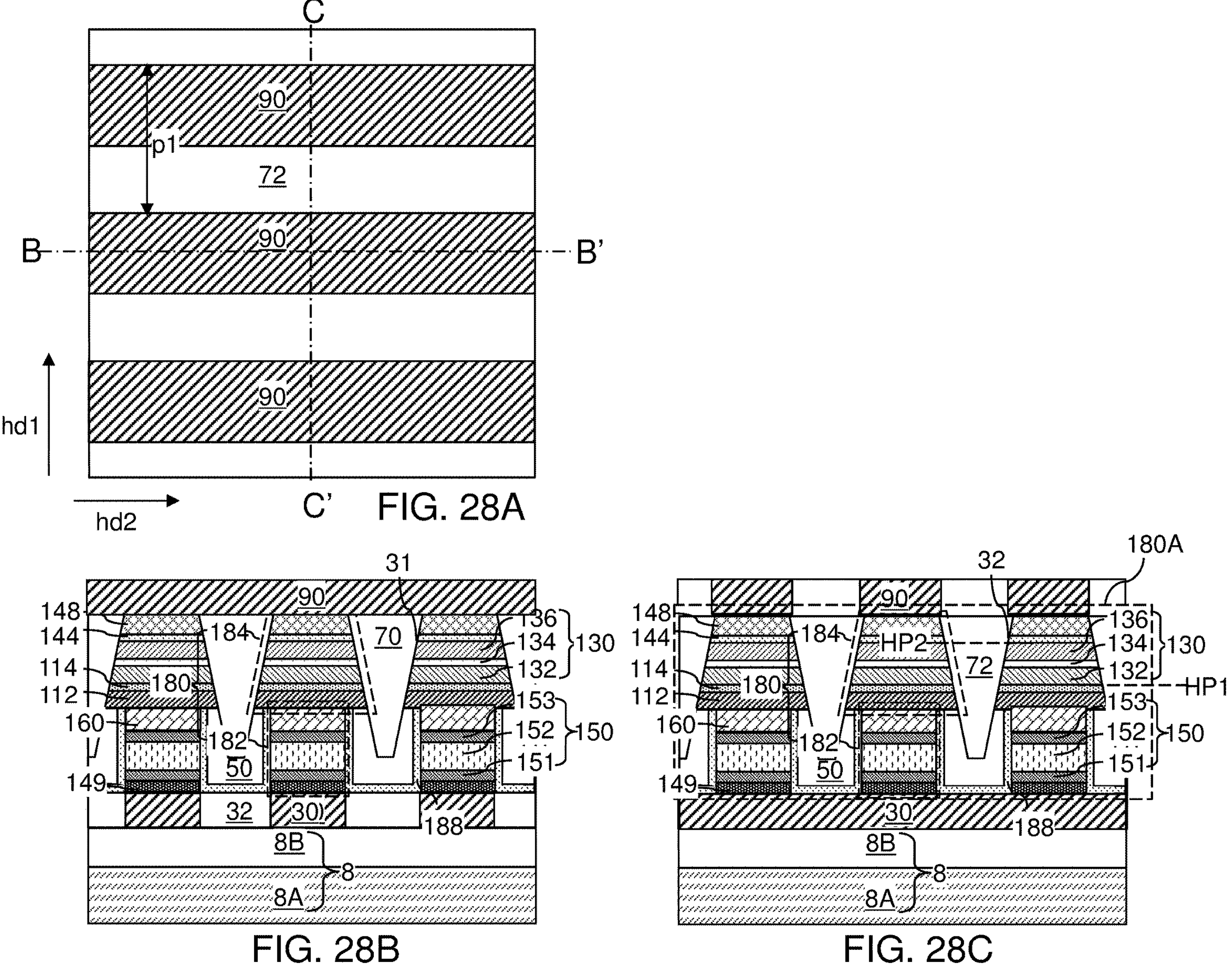
FIGS. 28A-28C are various views of the second exemplary structure after formation of second junction-level dielectric material rails according to an embodiment of the present disclosure.

Referring to FIGS. 28A-28C, an optional dielectric liner (e.g., silicon nitride liner) material and a second dielectric fill material, such as silicon oxide, can be deposited in the second line trenches 81. Excess portions of the dielectric liner material (if present) and the second dielectric fill material can be removed from above the horizontal plane including the top surfaces of the second electrically conductive lines 90 by a planarization process, which may comprise a recess etch process and/or a chemical mechanical polishing (CMP) process. Each remaining portion of the second dielectric fill material filling a respective second line trench 81 constitutes a second junction-level dielectric material rail 72, which is also referred to as a second dielectric material portion 72. Each remaining portion of the dielectric liner material forms an optional dielectric liner (not shown).

Generally, second dielectric material portions 72 comprising a second dielectric fill material contacts a respective subset of the second tapered planar sidewalls 32. In one embodiment, each of the second dielectric material portions 72 either directly contacts two rows of second tapered planar sidewalls 32 or contacts a dielectric liner located on the two rows of second tapered planar sidewalls 32. Each row of second tapered planar sidewalls 32 is arranged along the second horizontal direction hd2 in a respective straight line.

In one embodiment, each of the second dielectric material portions 72 vertically extends at least from a first horizontal plane HP1 including bottommost surfaces of the two-dimensional array of magnetic tunnel junctions 130 and at least to a second horizontal plane HP2 including topmost surfaces of the two-dimensional array of magnetic tunnel junctions 130.

In one embodiment, each of the second dielectric material portions 72 comprises a pair of tapered planar lengthwise sidewalls that laterally extend along the first horizontal direction hd1 and contacts a respective plurality of first dielectric material portions 70 among the first dielectric material portions 70. In case the second line trenches 81 divide each first junction-level dielectric material rail 70 into a respective plurality of first dielectric material portions 70, each of the first dielectric material portions 70 contacts not more than two first tapered planar sidewalls 31 among the first tapered planar sidewalls 31. In case the second line trenches 81 does not divide each first junction-level dielectric material rail 70 into discrete first dielectric material portions, each first junction-level dielectric material rail 70 (i.e., each first dielectric material portions 70) continuously extends along the first horizontal direction hd1 with indentations underlying the second junction-level dielectric material rails 70, and contacts two columns of first tapered planar sidewalls 31 that are arranged along the first horizontal direction hd1.

Figures 29A, 29B, 29C:
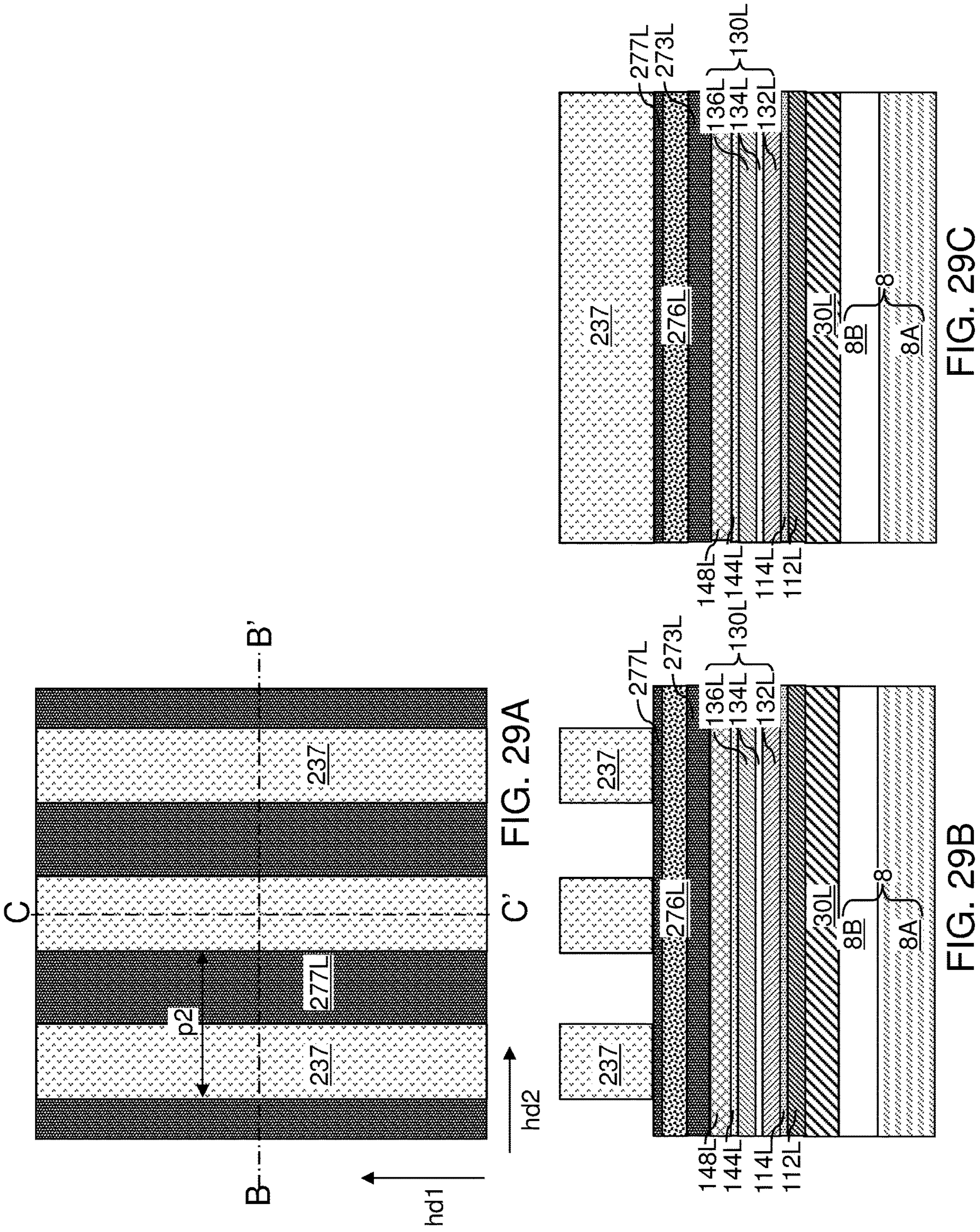
FIGS. 29A-29C are various views of a third exemplary structure after formation of a first electrically conductive layer, magnetic tunnel junction material layers, a patterning film, a first pattern transfer assist layer, and a first patterned photoresist layer according to an embodiment of the present disclosure.

Referring to FIGS. 29A-29C, a third exemplary structure according to a third embodiment of the present disclosure can be derived from the first exemplary structure illustrated in FIGS. 3A-3C by forming magnetic tunnel junction-level (MTJ-level) material layers (112L, 114L, 130L, 144L, 148L), an optional first image transfer assist layer 273L, a patterning film 276L, and an optional second image transfer assist layer 277L as described with reference to FIGS. 21A-21C. A patterned photoresist layer 259 can be formed above the optional first image transfer assist layer 273L, the patterning film 276L, and the optional second image transfer assist layer 277L. The pattern in the patterned photoresist layer 259 of FIGS. 29A-29C may the same as the pattern in the patterned photoresist layer 259 described with reference to FIGS. 21A-21C. The patterning of the patterned photoresist layer 259 may comprise self-aligned double patterning (SADP) or conventional photoresist exposure and development.

Figures 30A, 30B, 30C:
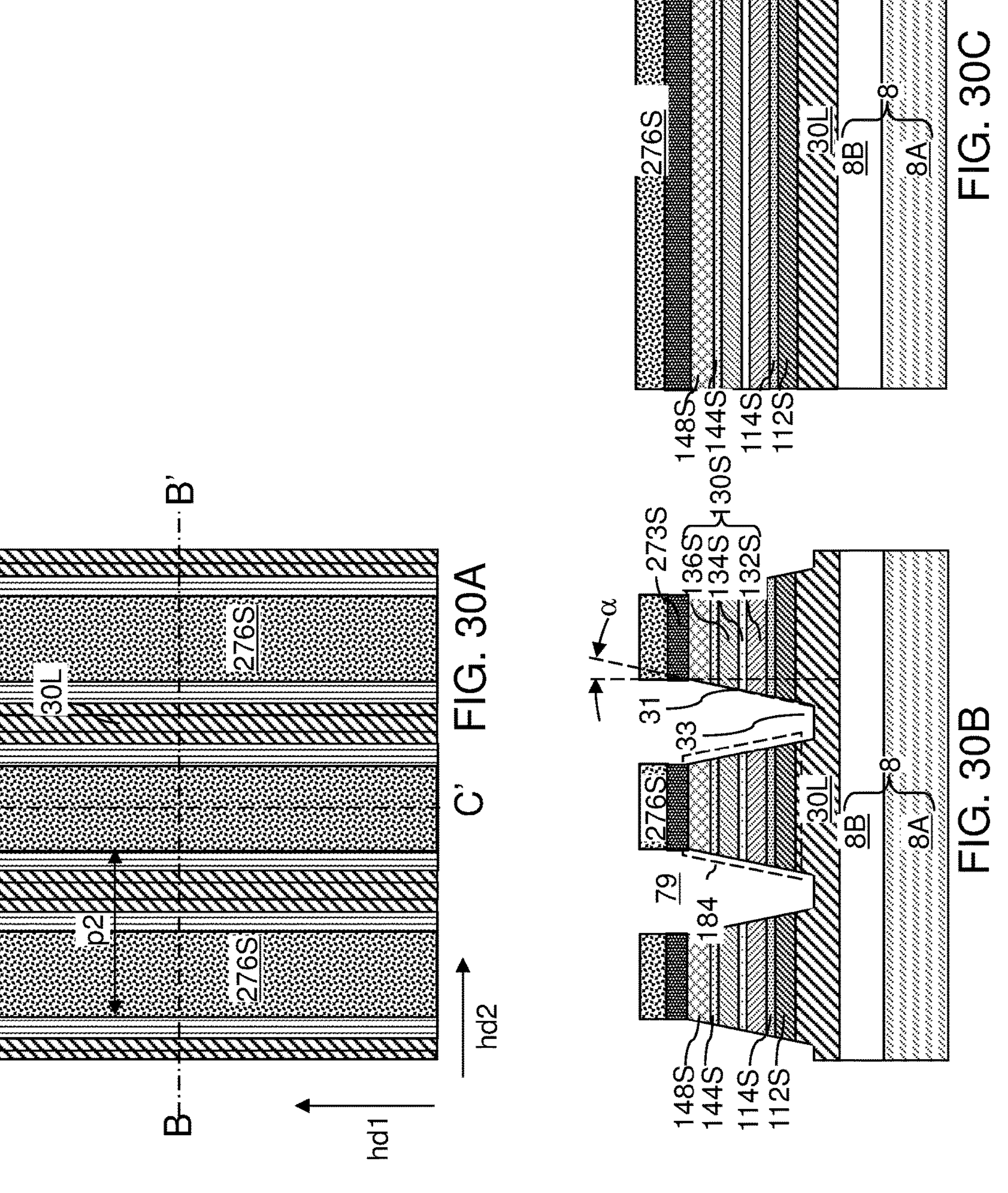
FIGS. 30A-30C are various views of the third exemplary structure after formation of magnetic tunnel junction strips according to an embodiment of the present disclosure.

Referring to FIGS. 30A-30C, the processing steps described with reference to FIGS. 22A-22C and 23A-23C can be performed. The optional first image transfer assist layer 273L, the patterning film 276L, and the optional second image transfer assist layer 277L can be patterned into a one-dimensional array of first line-shaped etch mask structure (273S, 276S, 277S).

The pattern in the one-dimensional array of first line-shaped etch mask structure (273S, 276S, 277S) can be transferred through the magnetic tunnel junction-level (MTJ-level) material layers (112L, 114L, 130L, 144L, 148L) by a first pattern transfer process, which may comprise a first ion beam etch process. The angles of the ion beams employed during the first ion beam etch process can be selected such that sidewalls of the patterned portions of the MTJ-level material layers (112L, 114L, 130L, 144L, 148L) are formed with a taper angle with respect to the vertical direction. The patterned portions of the MTJ-level material layers (112L, 114L, 130L, 144L, 148L) can comprise a one-dimensional array of magnetic tunnel junction strips 130S. Each patterned portion of the continuous metallic capping layer 148L, if employed, comprises a metallic capping strip 148S. Each patterned portion of the continuous dielectric capping layer 144L, if employed, comprises a dielectric capping strip 144S. Each patterned portion of the continuous antiferromagnetic coupling layer 114L, if employed, comprises an antiferromagnetic coupling strip 114S. Each patterned portion of the continuous superlattice layer 112L, if employed, comprises a superlattice strip 112S.

In one embodiment, the first ion beam etch process used to form the magnetic tunnel junction strip 130S comprises two separate ions beam etch steps. In a first step, the first ion beam etch continues until the nonmagnetic tunnel barrier layer strip 134L is reached or etched through. Then, a dielectric liner, such as a silicon nitride liner, is deposited over the metallic capping strip 148S the dielectric capping strip 144S and the free layer strip 136S. In a second step, the first ion beam etch is restarted after the formation of the dielectric liner to etch through the reference layer 132L and any other underlying conductive layers to complete the magnetic tunnel junction strip 130S.

Optionally, an electrically conductive carbon or carbon-nitride layer may be provided between the first electrode material layer 30L and the magnetic tunnel junction strip 130S. This layer can act as an ion beam etch stop and reduce or prevent conductive material from the first electrode material layer 30L from redepositing on the magnetic tunnel junction strip 130S sidewalls.

The first ion beam etch process forms first line trenches 79 between neighboring pairs of magnetic tunnel junction strips 130S. Generally, the first line trenches 79 can be formed by performing a first ion beam etch process employing a set of first line-shaped etch mask structures (273S, 276S, 277S) that laterally extend along the first horizontal direction hd1 and are laterally spaced apart along the second horizontal direction hd2. In one embodiment, each of the first line trenches 79 may be laterally bounded a respective pair of first tapered planar sidewalls 31 of the magnetic tunnel junction strips 130S. As used herein, a planar sidewall refers to a sidewall that is contained within a flat plane, i.e., a plane without a curvature. A tapered planar sidewall refers to a planar sidewall having a non-zero angle with respect to a vertical direction. In one embodiment, the magnitude of the tilt angles of the first tapered planar sidewalls 31 may be the same. In one embodiment, the respective pair of first tapered planar sidewalls 31 laterally extend along the first horizontal direction hd1, and are tilted from a vertical direction toward or away from the second horizontal direction hd2 with first tilt angles $\alpha$ that are equal in magnitude and different in tilt directions. The magnitude of the first tilt angle $\alpha$ may be in a range from 1 degree to 30 degrees, such as from 3 degrees to 10 degrees, although lesser and greater first tilt angles $\alpha$ may also be employed.

In one embodiment, the first line trenches 79 may be formed such that bottom surfaces of the first line trenches 79 are formed below the horizontal plane including bottommost surfaces of the one-dimensional array of magnetic tunnel junction strips 130S. In one embodiment, the bottom surfaces of the first line trenches 79 are formed below the horizontal plane including the top surface of the first electrically conductive layer 30L. In this case, the first electrically conductive layer 30L may comprise line-shaped grooves 33 laterally extending along the first horizontal direction hd1. A portion of each first line-shaped etch mask structures (273S, 276S, 277S) may be collaterally removed during the first ion beam etch process. For example, the second image transfer assist material strips 277S may be collaterally removed during the first ion beam etch process.

Referring to FIGS. 31A-31C, a dielectric liner material layer (e.g., silicon nitride layer) may be optionally deposited over the strip stacks (112S, 114S, 130S, 144S, 148S) and remaining portions of the first line-shaped etch mask structures (273S, 276S, 277S). The dielectric liner material layer may be deposited by a conformal deposition process such as a chemical vapor deposition process. An anisotropic etch process may be performed to remove horizontally-extending portions of the dielectric liner material layer. Remaining portions of the dielectric liner material layer that remains on the first tapered planar sidewalls 31 comprise dielectric spacers 138, which are herein referred to as junction-level dielectric spacers 138. The dielectric spacers 138 contact a respective first tapered planar sidewall 31 among the first tapered planar sidewalls 31.

Referring to FIGS. 32A-32C, an additional anisotropic etch process (e.g., different than the ion beam etch process), such as a reactive ion etch process, can be performed to etch unmasked portions of the first electrically conductive layer 30L. Remaining portions of the first electrically conductive layer 30L comprise first electrically conductive lines 30. In one embodiment, each of the dielectric spacers 138 contacts an upper segment of a sidewall of a respective one of the first electrically conductive lines 30. In one embodiment, each of the first electrically conductive lines 30 may comprise a pair of chamfered sidewalls that laterally extend along the first horizontal direction hd1. Each chamfered sidewall of the first electrically conductive lines 30 may contact a bottom portion of a respective dielectric spacer 138. In one embodiment, each first electrically conductive line 30 may comprise a pair of vertical lengthwise sidewalls that are vertically coincident with a bottom portion of an outer sidewall of a respective dielectric spacer 138. Remaining portions of the first line-shaped etch mask structures (273S, 276S, 277S) can be subsequently removed.

Referring to FIGS. 33A-33C, the processing steps described with reference to FIGS. 24A-24C can be performed to form first junction-level dielectric material rails 70, which are also referred to as first dielectric material portions 70. In one embodiment, a first junction-level dielectric material rail 70 can be formed between a neighboring pair of magnetic tunnel junction strips 130S. Generally, a first junction-level dielectric material rail 70 can be formed between a neighboring pair of first tapered planar sidewalls 31. A one-dimensional array of junction-level dielectric material rails 70 may be laterally interlaced with a one-dimensional array of strip stacks (112S, 114S, 130S, 144S, 148S) of an optional superlattice strip 112S, an optional antiferromagnetic coupling strip 114S, a magnetic tunnel junction strip 130S, an optional dielectric capping strip 144S, and an optional metallic capping strip 148S along the second horizontal direction hd2.

Figures 34A, 34B, 34C:
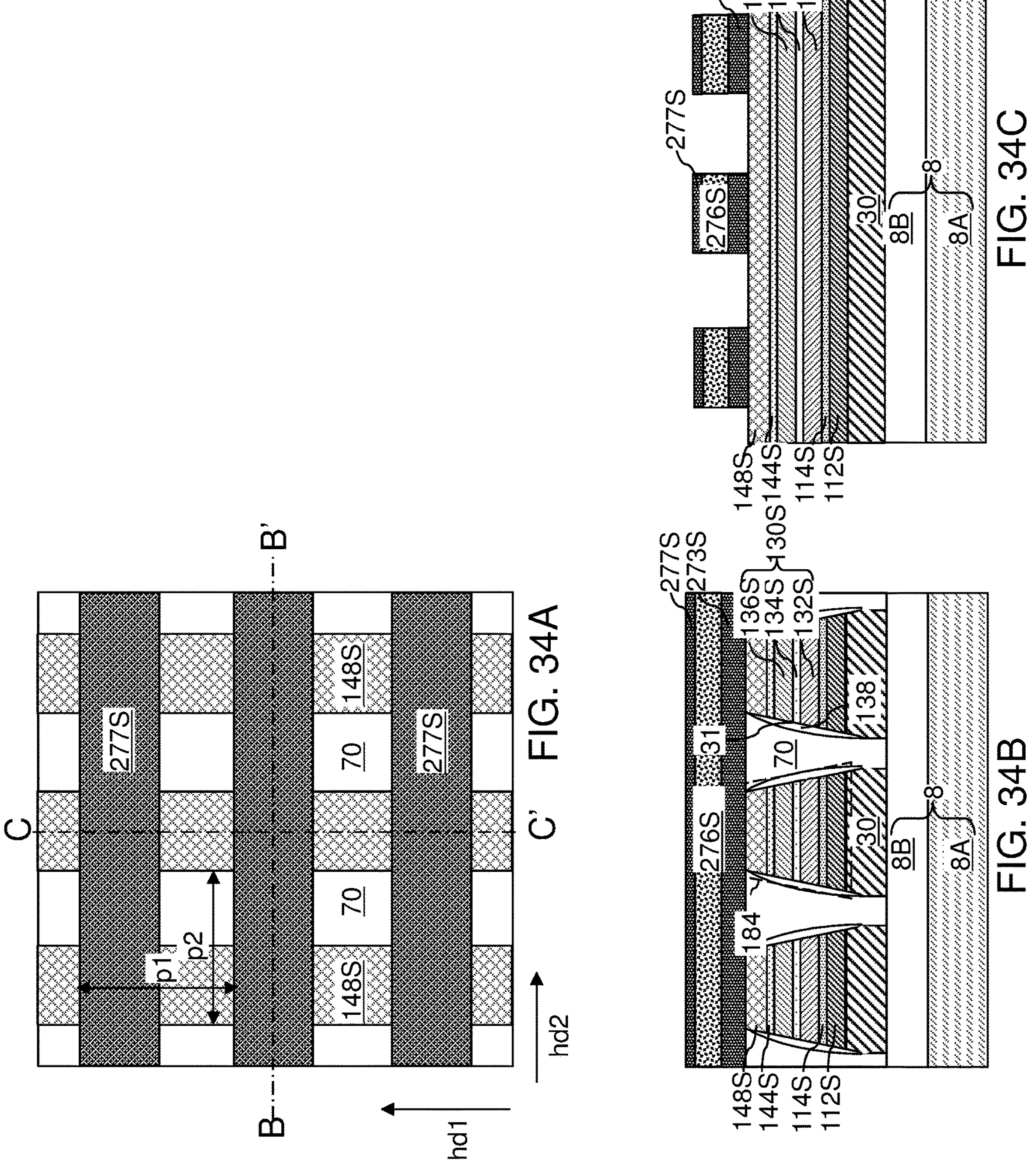
FIGS. 34A-34C are various views of the third exemplary structure after application and patterning of a patterning film and a second pattern transfer assist layer according to an embodiment of the present disclosure.

Referring to FIGS. 34A-34C, the processing steps described with reference to FIGS. 26A-26C can be performed to form a one-dimensional array of second line-shaped etch mask structures (373S, 376S, 377S) over a laterally alternating sequence of strip stacks (112S, 114S, 130S, 144S, 148S) and first junction-level dielectric material rails 70. Each second line-shaped etch mask structure (373S, 376S, 377S) may comprise a patterning film strip 376S, a bottom image transfer assist material strip 373S, and/or a top image transfer assist material strip 377S.

Figures 35A, 35B, 35C:
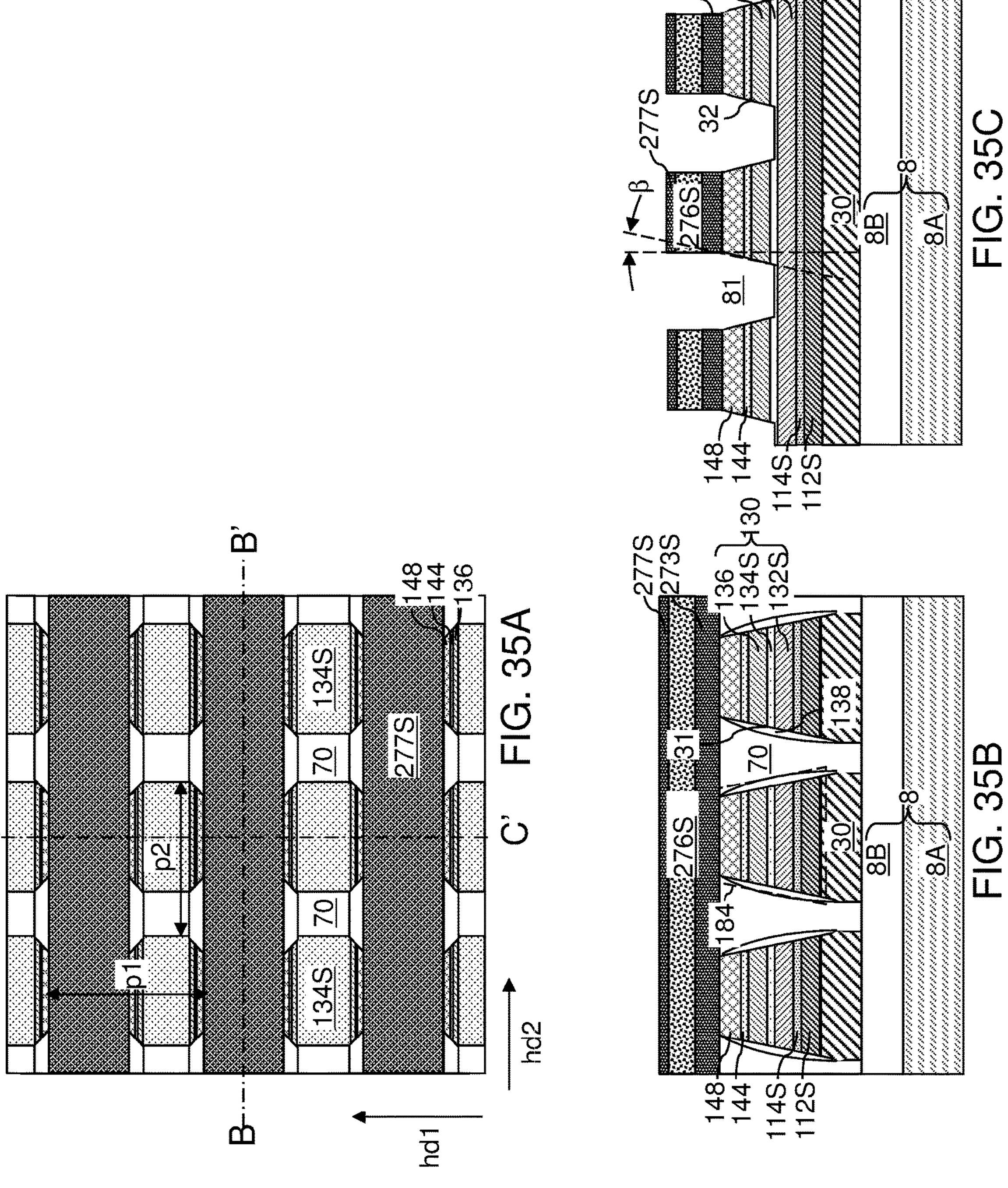
FIGS. 35A-35C are various views of the third exemplary structure after formation of a two-dimensional array of magnetic tunnel junctions according to an embodiment of the present disclosure.

Referring to FIGS. 35A-35C, the processing steps described with reference to FIGS. 27A-27C can be performed. Specifically, a second pattern transfer process can be performed to transfer the pattern in the second line-shaped etch mask structures (373S, 376S, 377S) into the laterally alternating sequence of strip stacks (112S, 114S, 130S, 144S, 148S) and into the first junction-level dielectric material rails 70 and optionally into an upper portion of the selector-level dielectric matrix layer 50. In one embodiment, the second pattern transfer process may comprise a second ion beam etch process in which the second line-shaped etch mask structures (373S, 376S, 377S) are employed as an etch mask. The angles of the ion beams employed during the second ion beam etch process can be selected such that sidewalls of the patterned portions of the laterally alternating sequence of strip stacks (112S, 114S, 130S, 144S, 148S) and the first junction-level dielectric material rails 70 are formed with a taper angle with respect to the vertical direction. The patterned portions of the strip stacks (112S, 114S, 130S, 144S, 148S) can comprise a two-dimensional array of magnetic tunnel junctions 130. Each patterned portion of the metallic capping strips 148L, if employed, comprises a metallic capping layer 148. Each patterned portion of the dielectric capping strips 144S, if employed, comprises a dielectric capping layer 144.

In one embodiment, the dose and the energy of the ions during the second ion beam etch process can be selected such that the bottom surfaces of the second line trenches 81 are formed above the horizontal plane including the bottom surfaces of the magnetic tunnel junction strips 130S. In this case, each row of magnetic tunnel junctions 130 arranged along the first horizontal direction hd1 may be interconnected with each other through a respective reference layer strip 132S. In this case, each reference layer within a magnetic tunnel junction 130 can comprise a respective portion of a reference layer strip 132S. In one embodiment, each row of magnetic tunnel junctions 130 arranged along the first horizontal direction hd1 may be interconnected with each other through a respective nonmagnetic tunnel barrier layer strip 134S. In this case, each nonmagnetic tunnel barrier layer within a magnetic tunnel junction 130 can comprise a respective portion of a nonmagnetic tunnel barrier layer strip 134S.

The second ion beam etch process forms second line trenches 81 between neighboring rows of magnetic tunnel junctions 130 that are arranged along the second horizontal direction hd2. Generally, the second line trenches 81 can be formed by performing a second ion beam etch process employing a set of second line-shaped etch mask structures (273S, 276S, 277S) that laterally extend along the second horizontal direction hd2 and are laterally spaced apart along the first horizontal direction hd1. In one embodiment, each of the second line trenches 81 may be laterally bounded a respective pair of second tapered planar sidewalls 32 of the magnetic tunnel junctions 130. In one embodiment, the magnitude of the tilt angles of the second tapered planar sidewalls 32 may be the same. In one embodiment, the second tapered planar sidewalls 32 laterally extend along the second horizontal direction hd2, and are tilted from a vertical direction toward or away from the first horizontal direction hd1 with second tilt angles β that are equal in magnitude and different in tilt directions. The magnitude of the second tilt angle α may be in a range from 1 degree to 30 degrees, such as from 3 degrees to 10 degrees, although lesser and greater second tilt angles α may also be employed.

In one embodiment, each of the second line trenches 81 may be laterally bounded by multiple pairs of second tapered planar sidewalls 32 of the magnetic tunnel junctions 130. Each pair of the second tapered planar sidewalls 32 within the multiple pairs can laterally extend along the second horizontal direction hd2, and can be tilted from the vertical direction toward or away from the first horizontal direction hd1 with second tilt angles R that are equal in magnitude and different in tilt directions. In one embodiment, each magnetic tunnel junction within the two-dimensional array of magnetic tunnel junctions 130 comprises a respective reference layer (as embodied as a portion of a reference layer strip 132S), a respective nonmagnetic tunnel barrier layer (which may be embodied as a discrete nonmagnetic tunnel barrier layer or as a portion of a nonmagnetic tunnel barrier layer strip 134S), and a respective free layer 136.

Referring to FIGS. 36A-36C, any remaining portions of the second line-shaped etch mask structures (373S, 376S, 377S) can be removed.

Referring to FIGS. 37A-37C, the processing steps described with reference to FIGS. 28A-28C can be performed to form second junction-level dielectric material rails 72, which are also referred to as second dielectric material portions 72. Generally, second dielectric material portions 72 comprising a second dielectric fill material contacts a respective subset of the second tapered planar sidewalls 32 or a dielectric liner located on the respective subset of the second tapered planar sidewalls 32. In one embodiment, each of the second dielectric material portions 72 contacts two rows of second tapered planar sidewalls 32 or a dielectric liner located of these sidewalls 32. Each row of second tapered planar sidewalls 32 is arranged along the second horizontal direction hd2 in a respective straight line.

In one embodiment, each of the second dielectric material portions 72 vertically extends at least from the nonmagnetic tunnel barrier layer 134 of the two-dimensional array of magnetic tunnel junctions 130 and at least to a second horizontal plane HP2 including topmost surfaces of the two-dimensional array of magnetic tunnel junctions 130.

In one embodiment, each of the second dielectric material portions 72 comprises a pair of tapered planar lengthwise sidewalls that laterally extend along the first horizontal direction hd1 between a respective plurality of first dielectric material portions 70. In one embodiment, each first junction-level dielectric material rail 70 (i.e., each first dielectric material portions 70) continuously extends along the first horizontal direction hd1 with indentations underlying the second junction-level dielectric material rails 70, and contacts two columns of first tapered planar sidewalls 31 that are arranged along the first horizontal direction hd1.

Figure 38A:
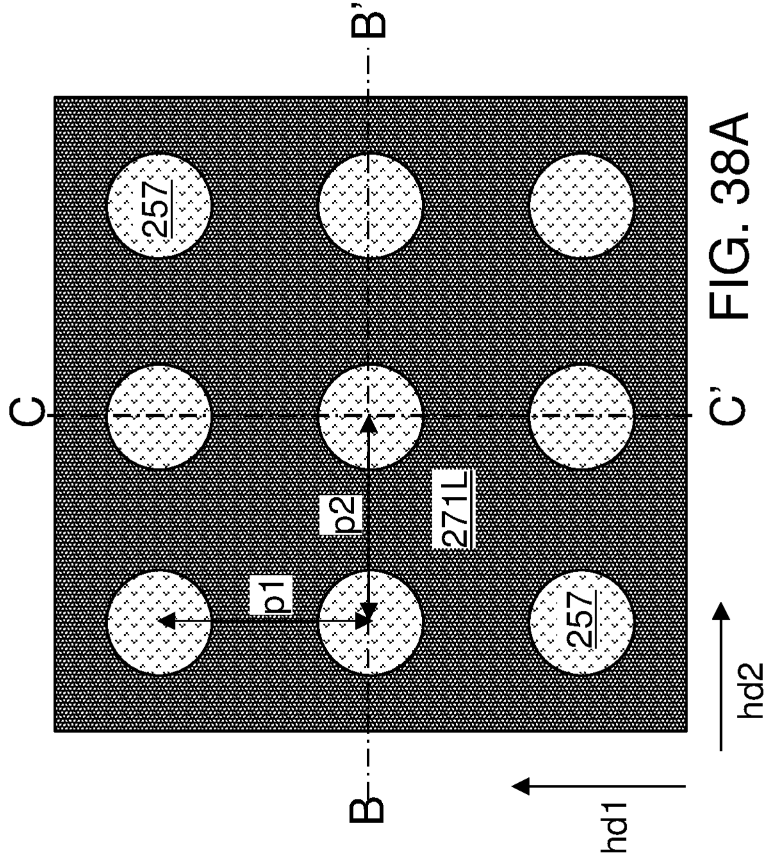
FIGS. 38A-38C are various views of the third exemplary structure after formation of selector-level material layers, a pattern transfer assist layer, and a patterned photoresist layer according to an embodiment of the present disclosure.
Figures 38B, 38C:
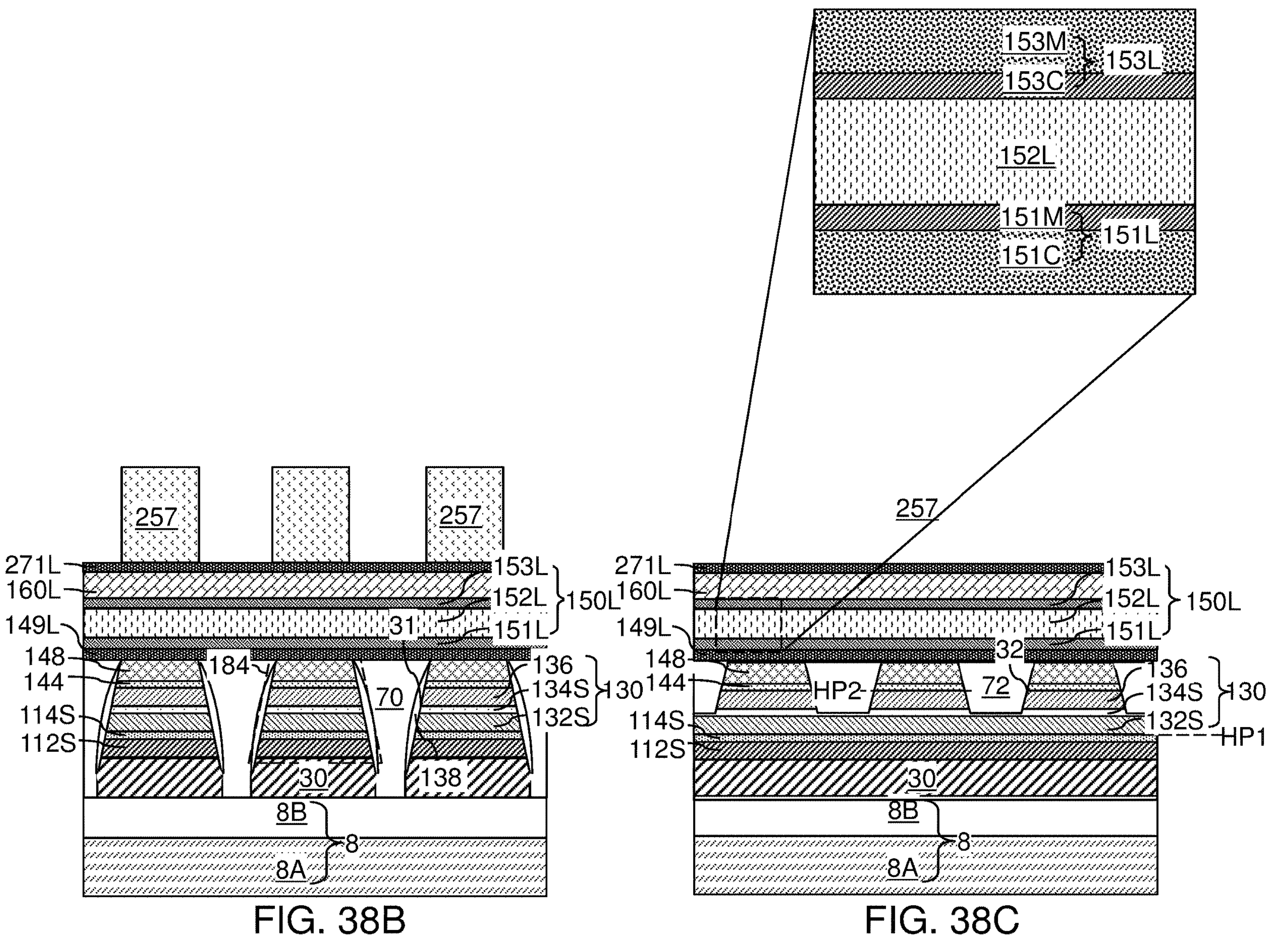

Referring to FIGS. 38A-38C, the processing steps described with reference to FIGS. 17A-17C can be performed to form an optional metallic adhesion layer 149L, selector-level material layers (150L, 160L), an optional first image transfer assist layer 171L, and a patterned etch mask layer (such as a patterned photoresist layer 257 including a two-dimensional array of discrete patterned photoresist material portions).

Figures 39A, 39B, 39C:
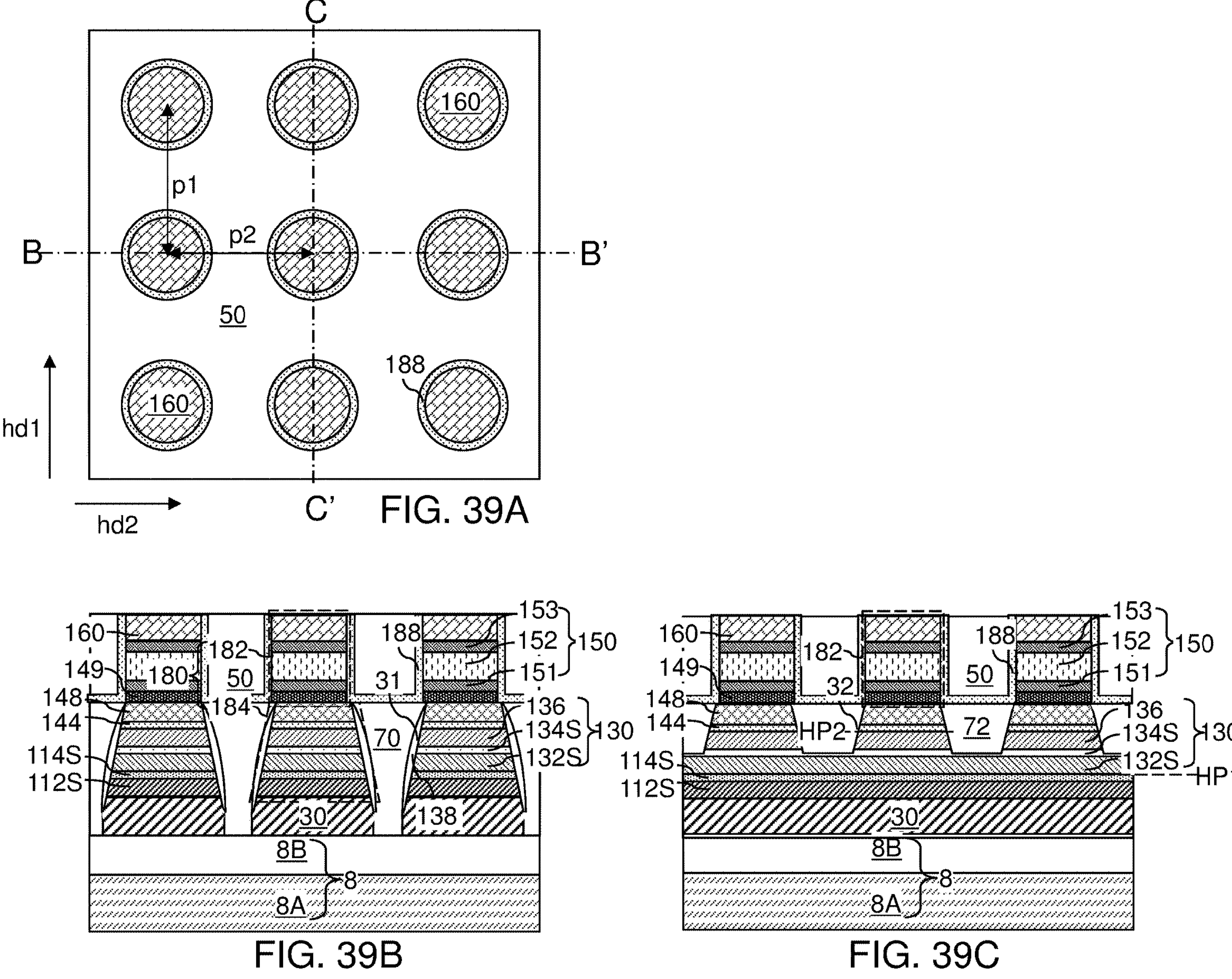
FIGS. 39A-39C are various views of the third exemplary structure after formation of a two-dimensional array of selector elements and a selector-level dielectric matrix layer according to an embodiment of the present disclosure.

Referring to FIGS. 39A-39C, the processing steps described with reference to FIGS. 16A-16C, 17A-17C, and 18A-18C can be performed to form a two-dimensional array of pillar structures (149, 150, 160, 172), a dielectric spacer liner 188, and a dielectric matrix layer 150, and to remove image transfer assist material plates 172. Top surfaces of the conductive material plates 160 can be exposed.

Figures 40A, 40B, 40C:
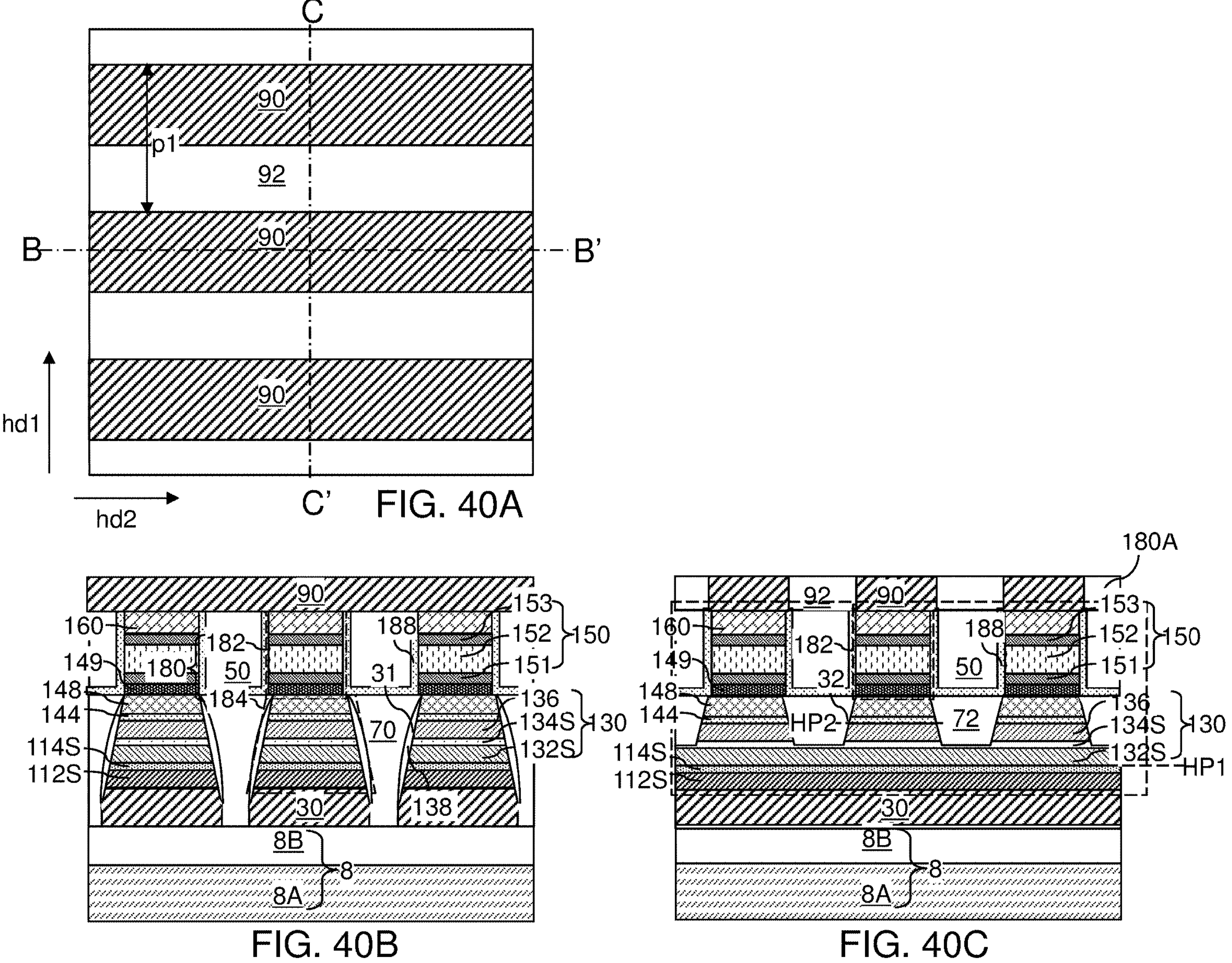
FIGS. 40A-40C are various views of the third exemplary structure after formation of second electrically conductive lines according to an embodiment of the present disclosure.

Referring to FIGS. 40A-40C, the processing steps described with reference to FIGS. 13A-13C can be performed to form a second line-level dielectric layer 92 and second electrically conductive lines 90. Each second electrically conductive line 90 may contact top surfaces of a respective row of metallic capping layers 148 that are arranged along the second horizontal direction hd2.

In an alternative embodiment, the steps of FIGS. 38A-38C, 39A-39C and 40A-40C may be omitted. Instead, the second electrically conductive lines 90 can be formed during the same photolithography and etching steps as the two-dimensional array of pillar structures (149, 150, 160) without a separate line patterning step shown in FIGS. 40A-40C.

After the steps shown in FIGS. 37A-37C, the selector-level material layers (150L, 160L) are formed as described above with respect to FIGS. 4A-4C over the two-dimensional array of magnetic tunnel junctions 130.

Then, the processing steps described with reference to FIGS. 5A-5C, 6A-6C, 7A-7C and 8A-8C can be performed to form the stacks of selector rails 150R and the optional conductive material strips 160S which extend in the first horizontal direction hd1, parallel to the first electrically conductive lines 30. The first selector-level dielectric material portions 40 are then formed between the selector rails 150R and the conductive material strips 160S.

The second electrode material layer 90L is then formed over the selector rails 150R, the conductive material strips 160S and the first selector-level dielectric material portions 40. Then, during the same photolithography and etching step, the second electrode material layer 90L is patterned into the second electrically conductive lines 90 while the underlying selector rails 150R and the conductive material strips 160S are patterned into the two-dimensional array of pillar structures (149, 150, 160). The etching step may comprise a reactive ion etching step. The second selector-level dielectric material portions 60 and the optional dielectric spacer rails 179 are then formed between the pillar structures (149, 150, 160) and the second electrically conductive lines 90, as described above with reference to FIGS. 20A-20C. The upper regions of the second selector-level dielectric material portions 60 function as the second line-level dielectric layer 92 shown in FIG. 40C.

Referring to FIGS. 15A-40C and related drawings and according to various embodiments of the present disclosure, a device structure comprises: first electrically conductive lines 30 that are laterally spaced apart from each other; second electrically conductive lines 90 that are vertically spaced apart from the first electrically conductive lines 30 and are laterally spaced apart from each other; a two-dimensional array of magnetic tunnel junctions 130 located between the first electrically conductive lines 30 and the second electrically conductive lines 90, wherein each of the magnetic tunnel junctions 130 comprises a respective reference layer 132, a respective nonmagnetic tunnel barrier layer 134, and a respective free layer 136, and has a respective pair of first tapered planar sidewalls 31 laterally extending along a first horizontal direction hd1 and tilted from a vertical direction toward or away from a second horizontal direction hd2, and has a respective pair of second tapered planar sidewalls 32 laterally extending along the second horizontal direction hd2 and tilted from the vertical direction toward or away from the first horizontal direction hd1; and a two-dimensional array of selector elements 150 located in series (e.g., in electrical series) with the two-dimensional array of magnetic tunnel junctions 130 and between the first electrically conductive lines 30 and the second electrically conductive lines 90.

In one embodiment, the device structure comprises a dielectric matrix layer 50 laterally surrounding the two-dimensional array of selector elements 150. The dielectric matrix layer 50 is a unitary structure.

In one embodiment, the device structure comprises at least dielectric spacer liner {188, (178, 179)}laterally surrounding and contacting each selector element 150 within the two-dimensional array of selector elements 150. The dielectric matrix layer 50 overlies a horizontally-extending portion of the at least one dielectric spacer liner. In one embodiment, a top surface of the at least one dielectric spacer liner and a top surface of the dielectric matrix layer 50 are located within a same horizontal plane.

In one embodiment illustrated in FIGS. 20A-20C, the at least one dielectric spacer liner comprises dielectric spacers 178, each of which contacts the first horizontal direction hd1 facing sidewalls of a respective one of the two-dimensional array of selector elements 150; and dielectric spacer rails 179, each of which extends in the second horizontal direction hd2 and contacts the second horizontal direction facing sidewalls of a plurality of the two-dimensional array of selector elements 150.

In one embodiment, the device structure comprises a two-dimensional array of conductive material plates 160 overlying and contacting the two-dimensional array of selector elements 150, wherein each sidewall of the conductive material plates 160 are vertically coincident with a sidewall of a respective one of the selector elements 150.

In one embodiment, the device structure comprises: first dielectric material portions 70 comprising a first dielectric fill material located between at least one neighboring pair of the first tapered planar sidewalls 31; and second dielectric material portions 72 comprising a second dielectric fill material located between at least one neighboring pair of the second tapered planar sidewalls 32. In one embodiment, each of the second dielectric material portions 72 contacts two rows of second tapered planar sidewalls 32.

In one embodiment, each row of second tapered planar sidewalls 32 is arranged along the second horizontal direction hd2 in a respective straight line. In one embodiment, each of the second dielectric material portions 72 vertically extends at least from a first horizontal plane HP1 including bottommost surfaces of the two-dimensional array of magnetic tunnel junctions 130 and at least to a second horizontal plane HP2 including topmost surfaces of the two-dimensional array of magnetic tunnel junctions 130. In one embodiment, bottommost surfaces of the second dielectric material portions 72 are located above a first horizontal plane HP1 including bottommost surfaces of the two-dimensional array of magnetic tunnel junctions 130.

In one embodiment, each of the first dielectric material portions 70 contacts not more than two of the first tapered planar sidewalls 31. In one embodiment, the device structure also comprises dielectric spacers 138 contacting a respective first tapered planar sidewall 31 of the first tapered planar sidewalls 31, wherein each of the first dielectric material portions 70 contacts a respective set of two of the dielectric spacers 138. In one embodiment, each of the dielectric spacers 138 contacts an upper segment of a sidewall of a respective one of the first electrically conductive lines 30.

In one embodiment, each of the second dielectric material portions 72 comprises a pair of tapered planar lengthwise sidewalls that laterally extend along the first horizontal direction hd1 and contact a respective plurality of the first dielectric material portions 70.

The various embodiments of the present disclosure can be employed to form a two-dimensional array of unit cells each including a respective series connection of a magnetoresistive memory element and a selector element. The magnetoresistive memory elements may be patterned at least in part together with the word lines or the bit lines, which reduces the number of photolithography and ion beam etching steps.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A device structure comprising:

first electrically conductive lines that are laterally spaced apart from each other;

second electrically conductive lines that are vertically spaced apart from the first electrically conductive lines and are laterally spaced apart from each other;

a two-dimensional array of magnetic tunnel junctions located between the first electrically conductive lines and the second electrically conductive lines, wherein each of the magnetic tunnel junctions comprises a respective reference layer, a respective nonmagnetic tunnel barrier layer, and a respective free layer, and has a respective pair of first tapered planar sidewalls laterally extending along a first horizontal direction and tilted from a vertical direction toward or away from a second horizontal direction, and has a respective pair of second tapered planar sidewalls laterally extending along the second horizontal direction and tilted from the vertical direction toward or away from the first horizontal direction, wherein the first tapered planar sidewalls have a greater vertical extent than the second tapered planar sidewalls; and a two-dimensional array of selector elements located in series with the two-dimensional array of magnetic tunnel junctions and between the first electrically conductive lines and the second electrically conductive lines.

2. The device structure of claim 1, further comprising a dielectric matrix layer laterally surrounding the two-dimensional array of selector elements, wherein the dielectric matrix layer is a unitary structure.

3. The device structure of claim 2, further comprising at least one dielectric spacer liner laterally surrounding and contacting each selector element within the two-dimensional array of selector elements, wherein the dielectric matrix layer overlies a horizontally-extending portion of the at least one dielectric spacer liner.

4. The device structure of claim 3, wherein a top surface of the at least one dielectric spacer liner and a top surface of the dielectric matrix layer are located within a same horizontal plane.

5. The device structure of claim 3, wherein the at least one dielectric spacer liner comprises:

dielectric spacers, each of which contacts the first horizontal direction facing sidewalls of a respective one of the two-dimensional array of selector elements; and dielectric spacer rails, each of which extends in the second horizontal direction and contacts the second horizontal direction facing sidewalls of a plurality of the two-dimensional array of selector elements.

6. The device structure of claim 1, further comprising a two-dimensional array of conductive material plates overlying and contacting the two-dimensional array of selector elements, wherein each sidewall of the conductive material plates is vertically coincident with a sidewall of a respective one of the selector elements.

7. The device structure of claim 1, further comprising:

first dielectric material portions comprising a first dielectric fill material located between at least one neighboring pair of the first tapered planar sidewalls; and second dielectric material portions comprising a second dielectric fill material located between at least one neighboring pair of the second tapered planar sidewalls.

8. The device structure of claim 7, wherein each of the second dielectric material portions contacts two rows of second tapered planar sidewalls, and wherein each row of second tapered planar sidewalls is arranged along the second horizontal direction in a respective straight line.

9. The device structure of claim 8, wherein each of the second dielectric material portions vertically extends at least from a first horizontal plane including bottommost surfaces of the two-dimensional array of magnetic tunnel junctions and at least to a second horizontal plane including topmost surfaces of the two-dimensional array of magnetic tunnel junctions.

10. The device structure of claim 8, wherein bottommost surfaces of the second dielectric material portions are located above a first horizontal plane including bottommost surfaces of the two-dimensional array of magnetic tunnel junctions.

11. The device structure of claim 7, wherein each of the first dielectric material portions contacts not more than two of the first tapered planar sidewalls.

12. The device structure of claim 7, further comprising dielectric spacers contacting a respective first tapered planar sidewall of the first tapered planar sidewalls, wherein each of the first dielectric material portions contacts a respective set of two of the dielectric spacers.

13. The device structure of claim 12, wherein each of the dielectric spacers contacts an upper segment of a sidewall of a respective one of the first electrically conductive lines.

14. The device structure of claim 7, wherein each of the second dielectric material portions comprises a pair of tapered planar lengthwise sidewalls that laterally extend along the first horizontal direction and contact a respective plurality of the first dielectric material portions.

15. The device structure of claim 1, wherein the reference layer comprises a portion of a continuous reference layer strip that interconnects a respective row of the magnetic tunnel junctions arranged along the first horizontal direction in the two-dimensional array of magnetic tunnel junctions.

16. The device structure of claim 15, wherein the free layers within each of the magnetic tunnel junctions in the respective row of the magnetic tunnel junctions arranged along the first horizontal direction comprise discrete free layers that are laterally spaced from each other along the first horizontal direction by portions of a dielectric matrix layer.

17. The device structure of claim 16, wherein the nonmagnetic tunnel barrier layers within each of the magnetic tunnel junctions in the respective row of the magnetic tunnel junctions arranged along the first horizontal direction comprise discrete nonmagnetic tunnel barrier layers.

18. The device structure of claim 16, wherein the nonmagnetic tunnel barrier layers within each of the magnetic tunnel junctions in the respective row of the magnetic tunnel junctions arranged along the first horizontal direction comprise portions of a nonmagnetic tunnel barrier layer strip that interconnects the respective row of the magnetic tunnel junctions arranged along the first horizontal direction.

19. The device structure of claim 1, further comprising:

first junction-level dielectric material rails having first sidewalls that are parallel to the first horizontal direction and contacting the first tapered planar sidewalls and sidewalls of the first electrically conductive rails; and second junction-level dielectric material rails having second sidewalls that are parallel to the second horizontal direction and contacting the second tapered planar sidewalls and top surface segments of the reference layers in the two-dimensional array of magnetic tunnel junctions.

* * * * *